(12) United States Patent (10) Patent No.: US 8,531,376 B2
Shimoda (45) Date of Patent: Sep. 10, 2013

(54) BOOTSTRAP CIRCUIT, AND SHIFT REGISTER, SCANNING CIRCUIT, DISPLAY DEVICE USING THE SAME

(75) Inventor: Masamichi Shimoda, Tokyo (JP)

(73) Assignee: NLT Technologies, Ltd., Kanagawa (JP)

( * ) Notice: Subject to any disclaimer, the term of this patent is extended or adjusted under 35 U.S.C. 154(b) by 1066 days.

(21) Appl. No.: 11/438,708

(22) Filed: May 22, 2006

(65) Prior Publication Data

US 2006/0262074 A1 Nov. 23, 2006

(30) Foreign Application Priority Data

May 20, 2005 (JP) ................................. 2005-148622
Apr. 19, 2006 (JP) ................................. 2006-116073

(51) Int. Cl.
*G09G 3/36* (2006.01)
(52) U.S. Cl.
USPC ................. 345/100; 345/30; 345/55; 377/64
(58) Field of Classification Search
USPC .......... 345/204–205, 99–100, 30, 50; 377/64
See application file for complete search history.

(56) References Cited

U.S. PATENT DOCUMENTS

| 7,420,535 B2 * | 9/2008 | Senda | 345/100 |
| 2003/0011584 A1 * | 1/2003 | Azami et al. | 345/204 |
| 2003/0210220 A1 * | 11/2003 | Hebiguchi | 345/100 |

FOREIGN PATENT DOCUMENTS

| JP | 63-023414 | 1/1988 |
| JP | 10-112645 | 4/1998 |
| JP | 2921510 | 4/1999 |
| JP | 2002-313093 | 10/2002 |
| JP | 2003-16794 | 1/2003 |
| JP | 2003-133940 | 5/2003 |
| JP | 2003-242797 | 8/2003 |
| JP | 2004-185684 | 7/2004 |
| JP | 2005-123864 | 5/2005 |
| JP | 2005-149624 | 6/2005 |
| JP | 2006-221694 | 8/2006 |

OTHER PUBLICATIONS

Japanese Office Action with English language translation dated Oct. 27, 2009.

* cited by examiner

*Primary Examiner* — Christopher E Leiby
(74) *Attorney, Agent, or Firm* — Scully, Scott, Murphy & Presser PC

(57) ABSTRACT

There is disclosed a shift register comprising a bootstrap circuit that outputs a voltage of the supply voltage to the output when the voltage of a first node becomes higher or lower than the supply voltage. The shift register comprises: two or more transistors connected in series to the first node; a device for supplying the voltage to a second node between the transistors such that the voltage between the drains and sources of the transistors becomes below the supply voltage; a first input transistor connected to the first node, and the gate electrode thereof is connected to a first input terminal as well; and an output transistor connected to the output terminal and the clock signal while having the gate electrode connected to the first node, wherein the gate electrode of the output transistor is not opened except for the bootstrap period.

14 Claims, 34 Drawing Sheets

BOOTSTRAP CIRCUIT, AND SHIFT REGISTER, SCANNING CIRCUIT, DISPLAY DEVICE USING THE SAME

BACKGROUND OF THE INVENTION

1. Field of the Invention

The present invention relates to a bootstrap circuit and the like, which are preferable for a driving circuit of a display device such as a liquid crystal display device, an organic EL display device, etc.

2. Description of the Related Art

Recently, there has been a wide spread of an active-matrix type display device having thin-film transistors as active elements integrated on each pixel. Particularly, an active-type liquid crystal device using polysilicon transistors has become popular for portable devices such as a portable telephone and the like, since it allows size reduction of the device. The polysilicon thin-film transistor exhibits higher mobility than that of an amorphous silicon thin-film transistor. Therefore, not only pixel transistors for constituting the pixels but also the driving circuit can be formed easily in the periphery of the pixel unit by the same manufacture process. As the driving circuits, there are a gate-line driving circuit and a source-line driving circuit for driving, respectively, a plurality of scanning lines (gate lines) and a plurality of signal lines (source lines) which are orthogonal to each other. For the gate-line driving circuit and the source-line driving circuit, a scanning circuit constituted with a plurality of shift registers is used.

For the shift register constituting such scanning circuit, in general, there is used a CMOS circuit in which N-channel type transistor and P-channel type transistors are combined.

However, there is such a shortcoming in the manufacture process of the CMOS that there requires a great number of steps in the process for fabricating both the N-channel type transistors and the P-channel type transistors.

Thus, there has been proposed a circuit (single-conductive-type transistor) that is constituted with only either the P-channel type or the N-channel type conductive transistors for cutting the manufacture cost through shortening the manufacture process than the case of the CMOS.

FIG. 28 shows a scanning circuit using conventional shift registers disclosed in JP Patent No. 2921510. The scanning circuit is constituted with a plurality of shift registers, however, FIG. 28 illustrates two shift registers, n-th and (n+1)-th registers, by way of example, in which an output signal OUT of the (n−1)-th stage is inputted to an input IN of the shift register of the n-th stage, and an output signal OUT of the n-th stage is inputted to an input IN of the shift register of the (n+1)-th stage, respectively. Further, although not shown, a start signal inputted from outside is inputted to the shift register of the first stage.

The conventional shift register shown in FIG. 28 is constituted with six N-channel type transistors, Tr101, Tr102, Tr103, Tr104, Tr105, Tr106, and Tr111, Tr112, Tr113, Tr114, Tr115, Tr116, which is formed to output, by shifting the phase, the input signal IN inputted to each of the signal-input transistors Tr101 and Tr111.

Therefore, by connecting a plurality of shift registers in series, it is possible to form a scanning circuit that outputs the start signals whose phases are shifted in order.

FIG. 29 is a timing chart for showing action of the conventional shift register shown in FIG. 28. Referring to FIG. 28 and FIG. 29, the action of the circuit will be described.

First, when the output signal OUT of the (n−1)-th stage, i.e. the input signal IN of the n-th stage, becomes high level at time t1, the transistor Tr101 becomes conductive. Thus, Vdd-Vt voltage is set at a node N101 between the transistor Tr101 and the transistor Tr102, and the voltage is held in a holding capacitor C101. VDD is a supply voltage, and Vt is a threshold voltage of the transistor Tr101. In that state, the transistor Tr104 also becomes conductive. However, a clock signal CL1 is low level so that the output signal OUT_n maintains the low level. Furthermore, although the transistor Tr106 becomes conductive, node N102 stays at low level since the output signal OUT_n is low level.

Then, when the input IN changes from the high level to the low level at a timing of time t2, the transistor Tr101 becomes nonconductive and the node N101 comes in a floating state. In that state, the clock signal CL1 also changes from the low level to the high level. Thus, the potential of the node N101 is boosted up to a higher voltage than Vdd-Vt due to the bootstrap effect through the holding capacitor C101, and the gate-drain capacity and gate-source capacity of the transistor Tr104. Therefore, sufficient voltage is applied between the gate and the source of the transistor Tr104, so that a high-level clock signal CL1 flows into the transistor Tr104, thereby boosting up the output signal OUT_n to high level. Furthermore, the transistor Tr106 in that state is also conductive. Therefore, the high-level clock signal CL1 flows through the transistor Tr104 and Tr106, and the node N102 becomes high level as well.

At the next timing of time t3, the output signal OUT_n+1 of the (n+1)-th stage changes to high level so that the transistors Tr102, Tr103 are made conductive, thereby bringing the node N101 to low level. In that state, the transistor Tr105 also becomes conductive by the clock signal CL2 so that the output signal OUT_n also becomes low level. As a result, the voltage held in the holding capacitor C101 becomes zero.

At the next timing of time t4, the clock signal CL1 becomes high level. However, the output signal OUT_n stays at low level by keeping the transistor Tr104 to be nonconductive through maintaining the holding capacitor C101 to have a larger value than the gate-drain capacitor C102 of the transistor Tr104.

At the timing of time t5 and thereafter, the transistor Tr105 becomes conductive when the clock signal CL2 is high level and maintains the output OUT_n to low level. When the clock signal CL1 is high level, the holding capacitor C101 is maintained to have a large value for maintaining the transistor Tr104 to be nonconductive, so that the output signal OUT_n stays at low level.

Through the action described above, there is obtained the output signal OUT_n that is the output signal of the (n−1)-th stage whose phase is shifted by a half the cycle of the clock signals CL1 and CL2.

For the (n+1)-th stage, each of the transistors Tr111-Tr116 functions in the same manner as each of the transistors Tr101-Tr106. Thus, the output signal OUT_n+1 can be obtained by the same operation principle as that of the n-th stage. However, as shown in FIG. 28, connection of the clock signals CL1 and CL2 for the (n+1)-th stage is reversed from that of the n-th stage for allowing the same action. That is, by changing connection between the clock signals CL1 and CL2 for the even-number stages and the odd-number stages, there are obtained the outputs whose phases are shifted in order.

Considering the case where this shift register is applied to the scanning circuit for driving the gate lines of a liquid crystal display device, it is necessary to increase the driving capacity by extending channel width of the transistors Tr104 and Tr105, since a large gate-line load is connected to the output end OUT. Normally, these are set to have the channel width larger by one digit or more compared to that of the transistors Tr101-103 and 106, so that the size of the transistor becomes larger. When the channel width of the transistors Tr104 and 105 is extended, the capacity of the holding capacitor C101 needs to be increased proportionally. Thus, the holding capacitor C101 needs to have a large area. If the holding capacitor C101 is small, the gate voltage of the transistor Tr104 is boosted up by the gate-drain capacitor C102 of the transistor Tr104 when the clock signal CL1 changes from low level to high level. As a result, the transistor Tr104 becomes conductive. When the transistor Tr104 is made conductive, a high-level clock signal CL1 is outputted as the output signal OUT_n.

FIG. 28 shows the case where the conventional shift register is constituted with the N-channel type transistors. However, it can also be constituted with the P-channel type transistors. FIG. 30 is a block diagram of a circuit when constituted with the P-channel type transistors, and FIG. 31 is a timing chart of the circuit shown in FIG. 30. As shown in FIG. 31, a large difference when using the P-channel type transistors is that the polarity of the waveform is inverted with respect to that of the timing chart shown in FIG. 29.

Furthermore, Japanese Unexamined Patent Publication 2003-16794 also discloses another example where a shift register is constituted with the N-channel type transistors.

FIG. 32 is a circuit block diagram of the shift register disclosed in Japanese Unexamined Patent Publication 2003-16794, and FIG. 33 is a timing chart for showing the action of the shift register.

In the circuit shown in FIG. 32, the gate voltage (F-point) of a transistor 22 is generated by a transistor 34 and a transistor 33. With this, as shown in the timing chart of FIG. 33, potential of the F-point becomes high level from time t2 to t0 and the transistor 22 is made conductive. Thus, potential of A-point during this period becomes low level, which allows a transistor 24 to be nonconductive. Therefore, it is possible to make the transistor 24 nonconductive during that period without the holding capacitor C101 that is provided in the circuit shown in FIG. 28.

In this structure, however, there is an electric current flown through a positive power source DD terminal, transistor 26, transistor 23, and negative power source SS terminal, when the potential of the A-point during the period of the time t0-t2 is high level.

Therefore, the electric power for this electric current is a factor for increasing the power consumption even though there requires no power consumed for charging and discharging the holding capacitor C101. Furthermore, the voltage of the A-point during the time t1-t2 becomes higher than the positive power source DD voltage due to the bootstrap effect. Thus, a voltage that is higher than the supply voltage is applied between the drains and sources of the transistor 21 and the transistor 22.

In the liquid crystal display device to which such scanning circuit is mounted, the resolution of the screen has been dramatically improved recently. In accordance with this, there has also been desired a circuit that allows size reduction of the scanning circuit.

However, in the conventional shift register disclosed in JP Patent No. 2921510, it is necessary to connect the holding capacitor C101 between the gate and the source of the transistor Tr104, which is still larger than the gate-drain capacitor C102 of the transistor Tr104 with the large channel width.

The circuit area becomes large as a result and it is difficult to downsize the circuit. Further, the power consumption is increased for charging and discharging the holding capacitor C101 that has the large capacity.

With the shift register disclosed in Japanese Unexamined Patent Publication 2003-16794, it is not necessary to form a holding capacitor. However, an electric current is flown from the positive power source (DD terminal) to the negative power source (SS terminal) through the transistors 26 and 23, thereby increasing the power consumption like the above-described conventional case. Furthermore, the voltage of the A-point becomes higher than the positive power source DD voltage due to the bootstrap effect. Thus, the voltage higher than the supply voltage is applied between the drain and source of the transistors 21 and 22, thereby facing deterioration in the reliability of the transistor.

Furthermore, since the output is used as the input of the next stage in the conventional shift register, the voltage amplitude of the output signal is deteriorated when the transistor characteristic fluctuates (the driving capacity is decreased). As a result, in the scanning circuit constituted with the conventional shift registers, attenuation of the output amplitude increases from the earlier stage to the subsequent-stages. At last, it comes to a state where no shift action can be performed.

SUMMARY OF THE INVENTION

An object of the present invention is to provide a shift register and the like, which can reduce the size of a display device, and to provide a circuit of low power consumption. Further, another object is to increase the reliability of the transistor by decreasing the voltage to be supplied to the transistor, resulting in improving the reliability of the display device to which the circuit is mounted. Furthermore, still another object is to provide a scanning circuit that can perform the shift action securely even when the transistor characteristic fluctuates.

In order to achieve the aforementioned objects, the bootstrap circuit (first embodiment) according to the present invention is a bootstrap circuit that applies an ON-voltage that is out of a range of a supply voltage to an output transistor by utilizing capacitance between a gate and a drain of the output transistor, provided that a gate voltage at which a transistor becomes ON is the ON-voltage and a gate voltage at which the transistor becomes OFF is an OFF-voltage. The bootstrap circuit comprises a control device that continues to apply the OFF-voltage to the output transistor except when the ON-voltage is applied to the output transistor, wherein the control device comprises: at least two transistors connected in series for applying the OFF-voltage to a gate electrode of the output transistor; and a voltage supply device for applying a voltage to a node of the plurality of transistors such that a voltage between the drain and a source falls within the range of the supply voltage.

The present invention comprises the control device that continues to apply the OFF-voltage to the output transistor except when the ON-voltage is applied to the output transistor. Thus, the output transistor has the OFF-voltage continuously applied at other time than the time when the ON-voltage is applied, so that the gate is not to be in a floating state. Therefore, the action is stabilized and it is not necessary to form the capacitor between the gate and source. Further, since the control device comprises at least two transistors connected in series for applying the OFF-voltage to a gate electrode of the output transistor, and a voltage supply device for applying such a voltage to a node of the plurality of transistors that a drain-source voltage falls within a range of supply voltage, it allows prevention of having the voltage larger than the supply voltage supplied between the drain and source of the transistor. The ON-voltage out of the range of the supply voltage means the ON-voltage that exceeds the upper limit of the supply voltage when the output transistor is the N-channel type, and means the ON-voltage below the lower limit of the supply voltage when the output transistor is the P-channel type.

The shift register according to the present invention comprises the bootstrap circuit of the present invention, wherein a data signal is inputted from a preceding-stage shift register, and the data signal is outputted with a specific delay from the output transistor to a subsequent-stage shift register. By using the bootstrap circuit according to the present invention, it is possible to form a shift register which is small in size, with low voltage-apply to the transistor, and capable of stable bootstrap action.

In the shift register (first embodiment) according to the present invention, the data signal is constituted with signals of first-level and second-level voltages; the output transistor outputs the second-level voltage when the ON-voltage out of the range of the supply voltage is applied; and the control device comprises a first control transistor that is constituted with the plurality of transistors, and second and third control transistors, wherein: the second control transistor becomes ON when the data signal inputted from a preceding-stage shift register is the second-level voltage and applies the OFF-voltage to the first control transistor, whereas the second control transistor becomes OFF when the data signal inputted from the preceding-stage shift register is the first-level voltage and maintains the OFF-voltage or the ON-voltage applied to the first control transistor; the third control transistor becomes ON when the data signal inputted from a subsequent-stage shift register is the second-level voltage and applies the ON-voltage to the first control transistor, whereas the third control transistor becomes OFF when the data signal inputted from the subsequent-stage shift register is the first-level voltage and maintains the OFF-voltage or the ON-voltage applied to the first control transistor; and the first control transistor becomes ON when the ON-voltage is applied and applies the OFF-voltage to the output transistor, whereas the first control transistor becomes OFF when the OFF-voltage is applied and maintains the OFF-voltage or the ON-voltage applied to the output transistor.

The shift register has a data signal (the first-level voltage or the second-level voltage) inputted from a preceding-stage shift register, and outputs the data signal with a specific delay to a subsequent-stage shift register from the output transistor. When the second-level voltage is outputted from the preceding-stage shift register, the second control transistor becomes ON and applies the OFF-voltage to the first control transistor. Thereby, the first control transistor becomes OFF and maintains the ON-voltage or OFF-voltage applied to the output transistor. In the meantime, when the second-level voltage is outputted from the preceding stage, the ON-voltage is applied to the output transistor after a specific time. Thereby, the second-level voltage is outputted to the subsequent-stage shift register from the output transistor. When the second-level voltage is outputted from the subsequent-stage shift register after another specific time, the third control transistor becomes ON and applies the ON-voltage to the first control transistor. Thereby, the first control transistor becomes ON and applies the OFF-voltage to the output transistor. Then, the first-level voltage is outputted from the shift registers of the subsequent and preceding stages, so that the OFF-voltage applied to the output transistor can be maintained even if the first-third control transistors become OFF. As long as this state is maintained, the OFF-voltage is continuously applied to the output transistor, so that the gate of the output transistor is not to be in a floating state.

In the shift register (first embodiment) of the present invention, the voltage supply device further comprises a fourth control transistor (Tr8), wherein the fourth control transistor is set ON simultaneously with the output transistor for applying a voltage within the range of the supply voltage to the node of the plurality of the transistors. In this case, the voltage applied between the source and the drain of the first control transistor can be decreased (for example, the voltage out of the range of the supply voltage is not to be applied).

In the shift register (second embodiment) of the present invention, the output transistor is constituted with a plurality of transistors (Tr7, Tr10) which output the second-level voltage when the ON-voltage out of the range of the supply voltage is applied. In this case, versatility of the possible transistor arrangement is increased so that the layout can be easily designed.

In the shift register (third embodiment) of the present invention, the node of the plurality of the transistors is connected to an output terminal of the output transistor from which the data signal is outputted. In this case, it allows prevention of having the voltage that is out of the range of the supply voltage applied between the source and drain of the first control transistor without adding an additional transistor.

The shift register (fourth and seventh embodiments) of the present invention further comprises, when the output transistor is a first output transistor, a second output transistor whose source and drain are connected in series to the first output transistor, wherein: the second control transistor becomes ON when the data signal inputted from the preceding-stage shift register is the second-level voltage and applies the OFF-voltage to the second output transistor, whereas the second control transistor becomes OFF when the data signal inputted from the preceding-stage shift register is the first-level voltage and maintains the OFF-voltage or the ON-voltage applied to the second output transistor; the third control transistor becomes ON when the data signal inputted from the subsequent-stage shift register is the second-level voltage and applies the ON-voltage to the second output transistor, whereas the second control transistor becomes OFF when the data signal inputted from the subsequent-stage shift register is the first-level voltage and maintains the OFF-voltage or the ON-voltage applied to the second output transistor; and the second output transistor becomes ON when the ON-voltage is applied and applies the first-level voltage to an output terminal of the first output transistor from which the data signal is outputted, whereas the second output transistor becomes OFF when the OFF-voltage is applied and maintains the voltage of the data signal applied to the output terminal. In this case, the output terminal is not to be in a floating state, either, so that the action is more stabilized.

In the shift register (fifth embodiment) of the present invention, the third control transistor uses a clock signal instead of the data signal inputted from the subsequent-stage shift register. The use of the clock signal allows the OFF-time of the third control transistor to be shortened compared to the case of using the data signal. Thus, an influence of the leak current of the third control transistor is decreased, and the action can be more stabilized.

The shift register (sixth embodiment) of the present invention further comprises: a first input transistor (Tr3) with a gate to which a gate voltage of the output transistor of the preceding-stage shift register is applied; and a second input transistor (Tr11) with a gate to which a clock signal is inputted, wherein the ON-voltage is applied to the output transistor of own stage when both of the first and second transistors become ON. In the shift register of this structure, the gate voltage out of the range of the supply voltage is applied to the first input transistor and the clock signal with the stable voltage level is inputted from outside to the second input transistor. Therefore, even if there is a fluctuation of the transistor characteristic, the deterioration in the output amplitude can be suppressed and the operation failure can be prevented.

The shift register (sixth embodiment) of the present invention comprises, instead of the second control transistor: a first input transistor with a gate to which a gate voltage of the output transistor of the preceding-stage shift register is applied; and a second input transistor with a gate to which a clock signal is inputted, wherein: the OFF-voltage is applied to the first control transistor when both of the first and second transistors become ON; and the OFF-voltage or the ON-voltage applied to the first control transistor is maintained when at least either the first or the second transistor becomes OFF. The shift register of this structure also operates in the same manner as that of the shift register according to the first embodiment.

The shift register (eighth embodiment) of the present invention further comprises a capacitor for suppressing fluctuation of the gate voltage of the output transistor. In this case, fluctuation of the gate voltage of the output transistor can be suppressed so that the action can be more stabilized. Further, the voltage applied between the gate and drain of the transistor can be decreased.

The bootstrap circuit of the present invention is a bootstrap circuit that applies an ON-voltage that is out of a range of a supply voltage to an output transistor by utilizing capacitance between a gate and a drain of the output transistor, provided that a gate voltage at which a transistor becomes ON is the ON-voltage and a gate voltage at which the transistor becomes OFF is an OFF-voltage. The bootstrap circuit comprises: a first input transistor to which the ON-voltage out of the range of the supply voltage is inputted; and a second input transistor with a gate to which a clock signal is inputted, wherein the ON-voltage is applied to the output transistor of own stage when both of the first and second transistors become ON.

The shift register of the present invention comprises the bootstrap circuit, wherein the data signal of the output transistor of the preceding-stage shift register is inputted from the preceding-stage shift register and the data signal is outputted with a specific delay from the output transistor to the subsequent-stage shift register.

The bootstrap circuit (sixth embodiment) of the present invention is a bootstrap circuit that applies ON-voltage that is out of a range of a supply voltage to an output transistor by utilizing capacitance between a gate and a drain of the output transistor, provided that a gate voltage at which a transistor becomes ON is the ON-voltage and a gate voltage at which the transistor becomes OFF is OFF-voltage. The bootstrap circuit comprises: a first input transistor to which the ON-voltage out of a range of supply voltage is inputted; and a second input transistor with a gate to which a clock signal is inputted, wherein the ON-voltage is applied to the output transistor of own stage when both of the first and second transistors become ON.

The ON-voltage out of the range of the supply voltage is applied to the first input transistor and the clock signal with the stable voltage level is inputted from outside to the second input transistor. Therefore, even if there is a fluctuation of the transistor characteristic, the ON-state can be maintained and deterioration in the output amplitude can be suppressed. In other words, it is the circuit not susceptible to the fluctuation of the transistor characteristic.

The shift register of the present invention comprises the bootstrap circuit, wherein the gate voltage of the output transistor of the preceding-stage shift register is inputted from the preceding-stage shift register and the data signal is outputted with a specific delay from the output transistor to the subsequent-stage shift register. By using the bootstrap circuit according to the present invention, it is possible to form a shift register which is small in size and capable of stable bootstrap action without being affected by the fluctuation of the transistor characteristic.

In the shift register according to the present invention, the data signal is constituted with signals of first-level and second-level voltages; the output transistor outputs the second-level voltage when the ON-voltage out of the range of the supply voltage is applied; and the control device comprises a first control transistor, and second and third control transistors, wherein: the second control transistor becomes ON when the data signal inputted from the preceding-stage shift register is the second-level voltage and applies the OFF-voltage to the first control transistor, whereas the second control transistor becomes OFF when the data signal inputted from the preceding-stage shift register is the first-level voltage and maintains the OFF-voltage or the ON-voltage applied to the first control transistor; the third control transistor becomes ON when the data signal inputted from the subsequent-stage shift register is the second-level voltage and applies the ON-voltage to the first control transistor, whereas the third control transistor becomes OFF when the data signal inputted from the subsequent-stage shift register is the first-level voltage and maintains the OFF-voltage or the ON-voltage applied to the first control transistor; and the first control transistor becomes ON when the ON-voltage is applied and applies the OFF-voltage to the output transistor, whereas the first control transistor becomes OFF when the OFF-voltage is applied and maintains the OFF-voltage or the ON-voltage applied to the output transistor.

The shift register has a data signal (the first-level voltage or the second-level voltage) inputted from a preceding stage, and outputs the data signal with a specific delay to a subsequent stage from the output transistor. When the second-level voltage is outputted from the preceding stage, the second control transistor becomes ON and applies the OFF-voltage to the first control transistor. Thereby, the first control transistor becomes OFF and maintains the ON-voltage or OFF-voltage applied to the output transistor. In the meantime, when the second-level voltage is outputted from the preceding stage, the ON-voltage is applied to the output transistor after a specific time. Thereby, the second-level voltage is outputted to the subsequent stage from the output transistor. When the second-level voltage is outputted from the subsequent stage after another specific time, the third control transistor becomes ON and applies the ON-voltage to the first control transistor. Thereby, the first control transistor becomes ON and applies the OFF-voltage to the output transistor. Then, the first-level voltage is outputted from the subsequent and preceding stages, so that the OFF-voltage applied to the output transistor can be maintained even if the first-third control transistors become OFF. As long as this state is maintained, the OFF-voltage is continuously applied to the output transistor, so that the gate of the output transistor is not to be in a floating state.

In the shift register of the present invention, the first control transistor is constituted with a plurality of transistors whose sources and drains are connected in series; and the control device further comprises a fourth control transistor, wherein the fourth control transistor (Tr8) is set ON simultaneously with the output transistor for applying a voltage within the range of the supply voltage to a node of the plurality of the transistors. In this case, the voltage applied between the source and the drain of the first control transistor can be decreased (for example, the voltage out of the range of the supply voltage is not to be applied).

In the shift register of the present invention, the output transistor is constituted with a plurality of transistors (Tr7, Tr10) which output a signal of the second-level voltage when the ON-voltage out of the range of the supply voltage is applied. In this case, versatility of the possible transistor arrangement is increased so that the layout can be easily designed.

In the shift register of the present invention, the first control transistor is constituted with a plurality of transistors whose sources and drains are connected in series, and the node of the plurality of the transistors is connected to an output terminal of the output transistor from which the data signal is outputted. In this case, it allows prevention of having the voltage that is out of the range of the supply voltage applied between the source and drain of the first control transistor without adding an additional transistor.

The shift register of the present invention further comprises, when the output transistor is a first output transistor, a second output transistor (Tr6) whose source and drain are connected in series to the first output transistor. The second control transistor becomes ON when the data signal inputted from the preceding stage is the second-level voltage and applies the OFF-voltage to the second output transistor, whereas the second control transistor becomes OFF when the data signal inputted from the preceding stage is the first-level voltage and maintains the OFF-voltage or the ON-voltage applied to the second output transistor. The third control transistor becomes ON when the data signal inputted from the subsequent stage is the second-level voltage and applies the ON-voltage to the second output transistor, whereas the second control transistor becomes OFF when the data signal inputted from the subsequent stage is the first-level voltage and maintains the OFF-voltage or the ON-voltage applied to the second output transistor. The second output transistor becomes ON when the ON-voltage is applied and applies the first-level voltage to an output terminal of the first output transistor from which the data signal is outputted, whereas the second output transistor becomes OFF when the OFF-voltage is applied and maintains the voltage of the data signal applied to the output terminal. In this case, the output terminal is not to be in a floating state, either, so that the action is more stabilized.

In the shift register of the present invention, the third control transistor uses a clock signal instead of the data signal inputted from the subsequent stage. The use of the clock signal allows the OFF-time of the third control transistor to be shortened compared to the case of using the data signal. Thus, an influence of the leak current of the third control transistor is decreased, and the action can be more stabilized.

The shift register of the present invention, comprises, instead of the second control transistor: a first input transistor with a gate to which a gate voltage of the output transistor of the preceding-stage shift register is applied; and a second input transistor with a gate to which a clock signal is inputted, wherein the OFF-voltage is applied to the first control transistor when both of the first and second transistors become ON, and the OFF-voltage or the ON-voltage applied to the first control transistor is maintained when at least either the first or second transistor becomes OFF.

The shift register of the present invention further comprises a capacitor for suppressing fluctuation of the gate voltage of the output transistor. In this case, fluctuation of the gate voltage of the output transistor can be suppressed so that the action can be more stabilized.

In the bootstrap circuit (ninth embodiment) of the present invention, a fifth control transistor (Tr12) is connected to a gate electrode between the output transistor and the first or second input transistor. The fifth control transistor becomes OFF when the ON-voltage out of the range of the supply voltage is applied to the gate electrode of the output transistor. Thus, although the voltage that is out of the range of the supply voltage is applied to the gate of the output transistor, there is only the voltage within the range of the supply voltage applied to the first or second input transistor. Therefore, the voltage applied between the gate and drain or between the gate and source of the transistors can be decreased.

The shift register according to the present invention comprises the bootstrap circuit of the present invention, wherein a data signal is inputted from a preceding-stage shift register, and the data signal is outputted with a specific delay from the output transistor to a subsequent-stage shift register. By using the bootstrap circuit according to the present invention, it is possible to form a shift register which is small in size, with low voltage-apply to the transistor, and capable of stable bootstrap action without being affected by the fluctuation of the transistor characteristic.

The shift register of the present invention is the shift register described above, wherein the data signal is constituted with signals of first-level and second-level voltages; the output transistor outputs the second-level voltage when the ON-voltage out of the range of the supply voltage is applied; and the control device comprises a first control transistor, and second and third control transistors, wherein: the second control transistor becomes ON when the data signal inputted from the preceding stage is the second-level voltage and applies the OFF-voltage to the first control transistor, whereas the second control transistor becomes OFF when the data signal inputted from the preceding stage is the first-level voltage and maintains the OFF-voltage or the ON-voltage applied to the first control transistor; the third control transistor becomes ON when the data signal inputted from the subsequent stage is the second-level voltage and applies the ON-voltage to the first control transistor, whereas the third control transistor becomes OFF when the data signal inputted from the subsequent stage is the first-level voltage and maintains the OFF-voltage or the ON-voltage applied to the first control transistor; and the first control transistor becomes ON when the ON-voltage is applied and applies the OFF-voltage to the output transistor, whereas the first control transistor becomes OFF when the OFF-voltage is applied and maintains the OFF-voltage or the ON-voltage applied to the output transistor.

The shift register has a data signal (the first-level voltage or the second-level voltage) inputted from a preceding stage, and outputs the data signal with a specific delay to a subsequent stage from the output transistor. When the second-level voltage is outputted from the preceding stage, the second control transistor becomes ON and applies the OFF-voltage to the first control transistor. Thereby, the first control transistor becomes OFF and maintains the ON-voltage or OFF-voltage applied to the output transistor. In the meantime, when the second-level voltage is outputted from the preceding stage, the ON-voltage is applied to the output transistor after a specific time. Thereby, the second-level voltage is outputted to the subsequent stage from the output transistor. When the second-level voltage is outputted from the subsequent stage after another specific time, the third control transistor becomes ON and applies the ON-voltage to the first control transistor. Thereby, the first control transistor becomes ON and applies the OFF-voltage to the output transistor. Then, the first-level voltage is outputted from the subsequent and preceding stages, so that the OFF-voltage applied to the output transistor can be maintained even if the first-third control transistors become OFF. As long as this state is maintained, the OFF-voltage is continuously applied to the output transistor, so that the gate of the output transistor is not to be in a floating state.

The shift register of the present invention is the shift register described above, wherein the output transistor is constituted with a plurality of transistor (Tr7, Tr10) which output a signal of the second-level voltage when the ON-voltage out of the range of the supply voltage is applied. In this case, versatility of the possible transistor arrangement is increased so that the layout can be easily designed.

The shift register of the present invention is the shift register described above, which further comprises, when the output transistor is a first output transistor, a second output transistor (Tr6) whose source and drain are connected in series to the first output transistor. The second control transistor becomes ON when the data signal inputted from the preceding stage is the second-level voltage and applies the OFF-voltage to the second output transistor, whereas the second control transistor becomes OFF when the data signal inputted from the preceding stage is the first-level voltage and maintains the OFF-voltage or the ON-voltage applied to the second output transistor. The third control transistor becomes ON when the data signal inputted from the subsequent stage is the second-level voltage and applies the ON-voltage to the second output transistor, whereas the second control transistor becomes OFF when the data signal inputted from the subsequent stage is the first-level voltage and maintains the OFF-voltage or the ON-voltage applied to the second output transistor. The second output transistor becomes ON when the ON-voltage is applied and applies the first-level voltage to an output terminal of the first output transistor from which the data signal is outputted, whereas the second output transistor becomes OFF when the OFF-voltage is applied and maintains the voltage of the data signal applied to the output terminal. In this case, the output terminal is not to be in a floating state, either, so that the action is more stabilized.

The shift register of the present invention is the shift register described above, wherein the third control transistor uses a clock signal instead of the data signal inputted from the subsequent stage. The use of the clock signal allows the OFF-time of the third control transistor to be shortened compared to the case of using the data signal. Thus, an influence of the leak current of the third control transistor is decreased, and the action can be more stabilized.

The shift register of the present invention is the shift register described above, which comprises, instead of the second control transistor: a first input transistor with a gate to which a gate voltage of the output transistor of the preceding-stage shift register is applied; and a second input transistor with a gate to which a clock signal is inputted, wherein the OFF-voltage is applied to the first control transistor when both of the first and second transistors become ON, and the OFF-voltage or the ON-voltage applied to the first control transistor is maintained when at least either the first or second transistor becomes OFF.

The shift register of the present invention is the shift register described above, which further comprises a capacitor for suppressing fluctuation of the gate voltage of the output transistor. In this case, fluctuation of the gate voltage of the output transistor can be suppressed so that the action can be more stabilized.

The shift register of the present invention is the shift register described above, wherein the transistor constituting the circuit is a thin film transistor. As a material for the thin film transistor, polysilicon is preferable in terms of carrier mobility. However, amorphous silicon or organic substance may be used if the carrier mobility is not an issue.

The scanning circuit according to the present invention uses the shift register of the present invention. The scanning circuit may be a gate-line driving circuit and a source-line driving circuit, for example. The display device according to the present invention uses the scanning circuit of the present invention. Examples of the display device may be a liquid crystal display device, an EL display device, etc.

The shift register of the present invention is capable of scanning in both directions. For example, in the case of the display device where the shift register of the present invention is applied to the gate-line driving circuit, for example, it is possible even when the device is inverted to perform the same display as it is in the normal position.

With the present invention, it is not necessary for the gate electrode of the output transistor to have the holding capacitor with a large capacity, and there is no electric current frown from the positive power source (high level) side to the negative power source (low level) side through the transistor. Therefore, the power consumption can be reduced. As a result, when applying the shift register of the present invention to a display device, power consumption of the device can be reduced.

The second effect is that the circuit can be downsized since the holding capacitor of a large capacity can be eliminated. As a result, a display device with a screen of high resolution can be achieved by applying the shift register of the present invention to the display device.

The third effect is that the reliability of the transistor can be improved since the voltage applied between the source and drain, between the gate and source, and between the gate and drain of the transistors can be decreased. As a result, when it is applied to the display device or the like, the reliability of the device can be improved.

The fourth effect is that it is possible to suppress the deterioration in the output amplitude even if there is a fluctuation in the transistor characteristic. Thus, when used for constituting a scanning circuit, it is possible to suppress such an operation failure that the amplitude is deteriorated for every single stage and that it becomes impossible to carry out the shift action at last. Furthermore, when applied to the display device or the like, it allows suppression of operation failure. Therefore, the reliability of the device can be improved.

DETAILED DESCRIPTION OF THE PREFERRED EMBODIMENTS

Now, embodiments of the present invention will be described in detail by referring to the accompanying drawings.

(First Embodiment)

Figure 1:
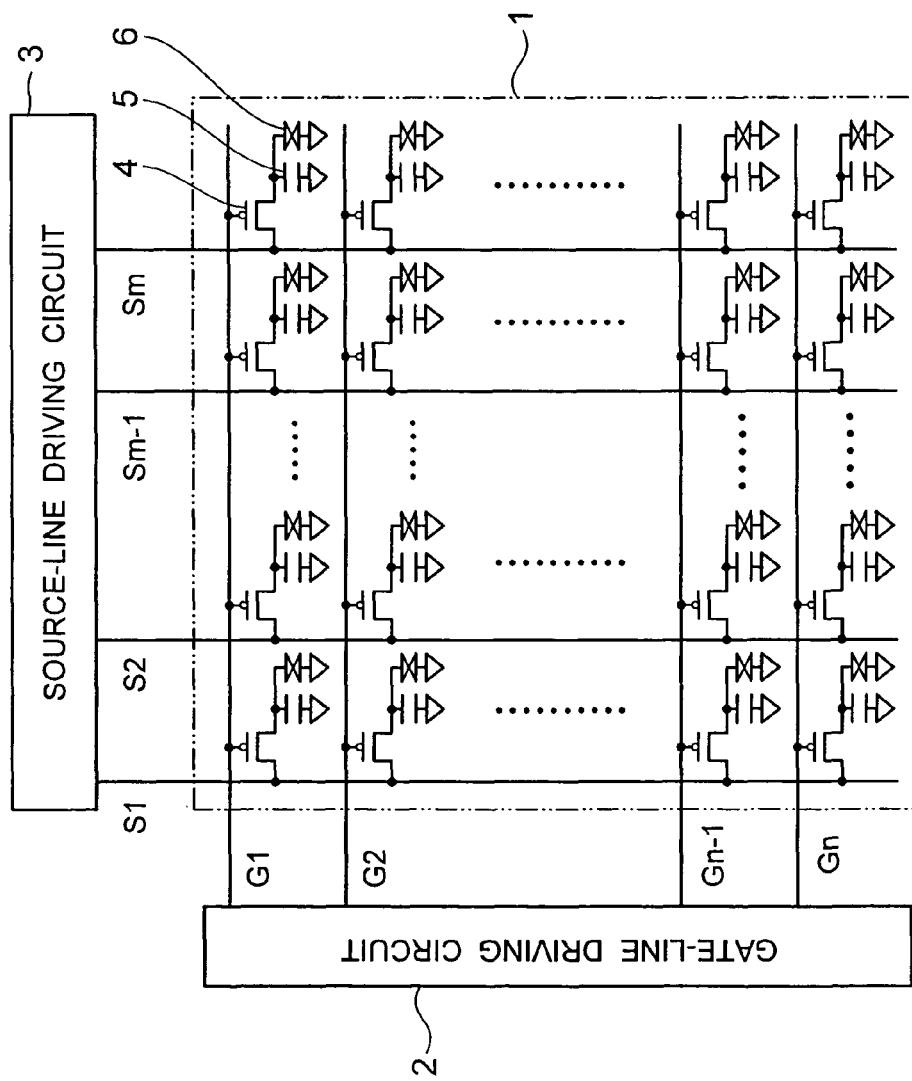
FIG. 1 is a block diagram for showing a liquid crystal display device.

As shown in FIG. 1, a liquid crystal display device to which the embodiment of the present invention is applied comprises a pixel unit 1, a gate-line driving circuit 2, and a source-line driving circuit 3. The pixel unit 1, the gate-line driving circuit 2 and the source-line driving circuit 3 are formed on a same glass substrate.

The pixel unit 1 has gate lines G1-Gn and source lines S1-Sm being orthogonal to each other formed thereon. Terminals of the gate-line driving circuit 2 are connected to the corresponding gate lines G1-Gn. Further, terminals of the source-line driving circuit 3 are connected to the corresponding source lines S1-Sm. Furthermore, at each node between the gate lines G1-Gn and the source lines S1-Sm within the pixel unit 1, there is disposed a pixel circuit which is constituted with a pixel transistor 4 (a polysilicon transistor), a pixel accumulating capacity 5, and a pixel capacity 6 made of liquid crystal.

The gate-line driving circuit 2 is constituted with a scanning circuit, and the scanning circuit is constituted with a transistor fabricated by the same manufacture process as that of the pixel transistor 4. A vertical start pulse signal ST and a clock signal are inputted from outside to the scanning circuit that constitutes the gate-line driving circuit 2, and the scanning circuit outputs output signals whose phases are shifted for every stage by making the vertical stat pulse signal ST synchronize with the clock signal. Thereby, the pixel circuit connected to a common gate line becomes conductive and a video signal outputted to the source line can be captured to the pixel circuit.

The source-line driving circuit 3 is constituted with a scanning circuit, a data latch circuit, a D/A converter, and an analog switch, and a horizontal start pulse, a clock signal, a video signal, and an analog switch control signal are inputted from outside to the source-line driving circuit 3. Normally, the analog switch is constituted with a transistor fabricated by the same manufacture process as that of the pixel transistor 4. Other circuits are constituted with a single-crystal silicon IC, and the ICs are mounted by COG(chip-on-glass) on a glass substrate.

The scanning circuit of the source-line driving circuit 3 outputs the horizontal start pulses by synchronizing with the clock signals while shifting the phase for every stage. The data latch circuit samples and latches the video signal by the output of the scanning circuit. The latched video signal is sent to the D/A converter to be converted to an analog signal, which is then outputted to the source line via the analog switch provided to each source line.

In the liquid crystal display device displaying in colors, normally, a single horizontal period is divided into three. The video signal is fed therein in order of R (red), G (green) and B (blue), which is switched by the analog switch after going through the data latch circuit and the D/A converter, and written as the analog video signal to the pixel circuit that has been made conductive by the gate-line driving circuit 2.

Figure 2:
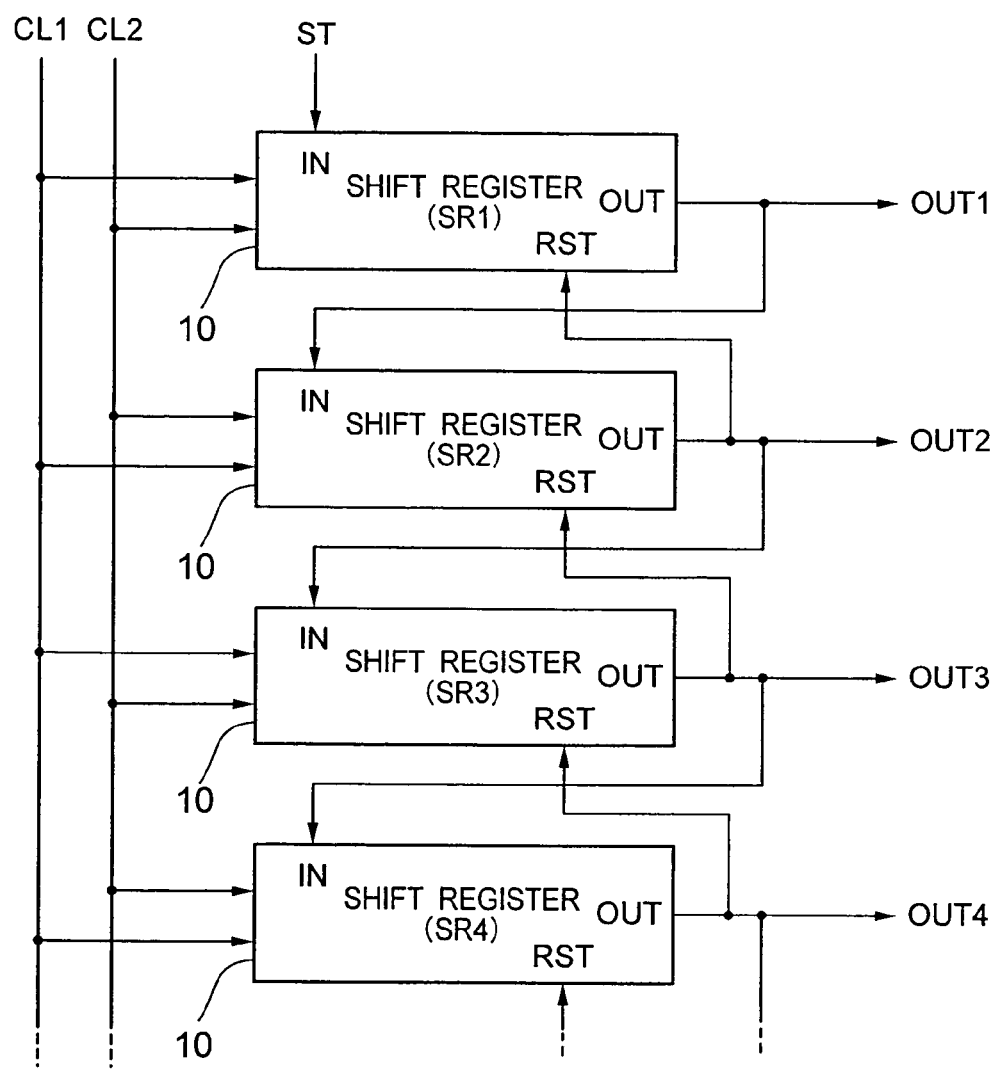
FIG. 2 is a block diagram for showing a scanning circuit according to a first embodiment of the present invention.

Next, FIG. 2 shows the configuration of the scanning circuit of the gate-line driving circuit 2 according to the embodiment of the present invention. Two clock signals CL1, CL2 and the vertical start pulse signal ST are inputted from outside to the scanning circuit of the gate-line driving circuit 2 shown in FIG. 2.

The scanning circuit of the gate-line driving circuit 2 shown in FIG. 2 is constituted with a plurality of shift registers 10 (SR1, SR2, SR3, SR4 . . . ) connected in series.

The vertical start pulse ST is inputted to an input terminal IN of the first-stage shift register SR1, and the output signals OUT of the preceding-stages are inputted to the input terminals IN of the shift registers SR2, SR3, SR4 . . . of the second stage and thereafter. Further, the two clock signals CL1 and CL2 are inputted to each shift register 10.

The first-stage shift register SR1 outputs, by the clock signal CL1, the output signal OUT1 that is phase-shifted with respect to the vertical start pulse signal ST. The next shift register SR2 outputs, by the clock signal CL2, the output signal OUT2 that is phase-shifted with respect to the output of the shift register SR1. The outputs thereafter are phase-shifted by synchronizing with the clock signals in the same manner and the vertical start pulse signals ST is transferred in order.

Figure 3:
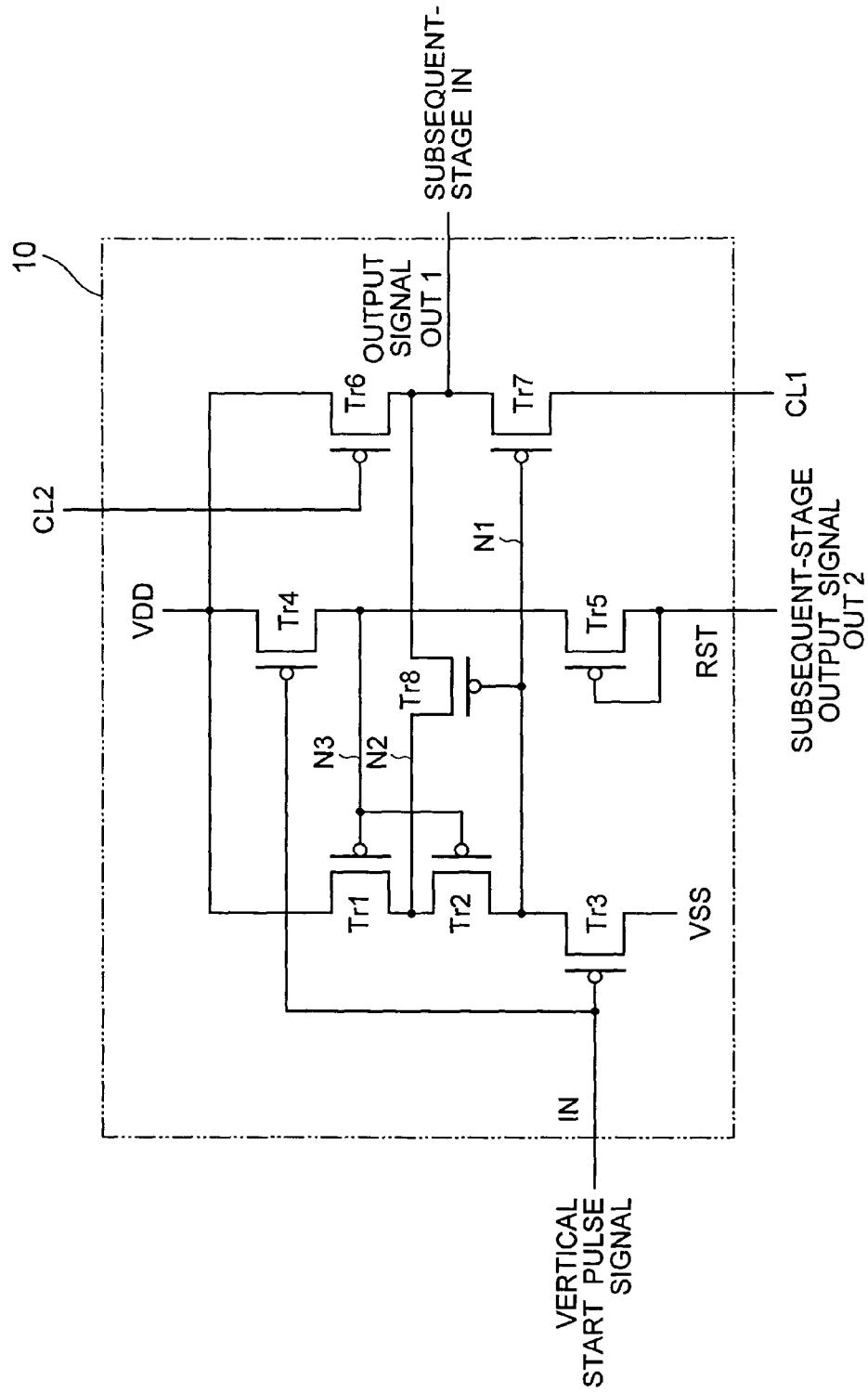
FIG. 3 is a circuit diagram for showing a shift register according to the first embodiment of the present invention.

Next, FIG. 3 shows the internal circuit of the shift register SR1 according the first embodiment of the present invention. FIG. 3 illustrates the first-stage shift register SR1, however, circuit structures of the shift registers SR2, SR3, SR4 . . . of the stages thereafter are the same as that of the shift register of FIG. 3, except that the signals to be inputted are changed. Specifically, in the shift register SR2, the output signal OUT1 of the preceding stage is inputted to the input terminal IN instead of the vertical start pulse signal ST, and the clock signal CL2 is inputted instead of the clock signal CL1 while the clock signal CL1 is inputted instead of the clock signal CL2. In the shift registers thereafter, the output signals OUT of the preceding stages are inputted to the input terminals IN, and the clock signals are switched for every stage to be inputted.

The shift register SR1 shown in FIG. 3 is constituted with eight P-channel type transistors Tr1-Tr8. The transistor Tr3 becomes conductive when the vertical start pulse signal ST inputted to the input terminal IN is low level, and supplies voltage of VSS power source to the node N1. When the voltage of the VSS power source is the same as the low-level voltage, there is supplied, to the node N1, a voltage that is boosted up for the amount of the threshold value Vt from the low level. The voltage of the VSS power source herein is set as the same as that of the low level, however, they may be different voltages. Further, it may be the vertical start pulse signal ST inputted to the gate electrode (input terminal IN) of the transistor Tr3, instead of the voltage of the VSS power source.

The transistor Tr5 becomes conductive when the output signal OUT2 from the shift register SR2 of the subsequent stage is low level, and a voltage that is boosted up from the low level for the amount of the threshold value Vt is supplied to the node N3. The transistor Tr6 becomes conductive when the clock signal CL2 is low level, and a high-level voltage (voltage of the VDD power source) is supplied as the output signal OUT1. The transistor Tr7 becomes conductive when the voltage of the node N1 is the low voltage (VSS+Vt or bootstrap voltage that is still lower than the low-level voltage), and the voltage of the clock signal CL1 is supplied as the output signal OUT1.

The transistors Tr6 and Tr7 drive the capacitive load connected to the output terminal of the shift register SR1, so that the current driving capacities thereof are increased by setting the channel widths larger by one digit or more compared to those of other transistors Tr1-Tr5. The transistor Tr4 becomes conductive when the vertical start pulse signal ST is low level, and a high-level voltage is supplied to the node N3. The transistors Tr1, Tr2 become conductive when the voltage of the node N3 equals to VSS+Vt, and a high-level voltage is supplied to the node N1. The transistor Tr8 becomes conductive when the voltage of the node N1 is the low voltage (VSS+Vt or bootstrap voltage that is still lower than the low-level voltage), and the voltage as the output signal OUT1 is supplied to the node N2 that is the connection node between the transistors Tr1 and Tr2.

When the voltage of the output signal OUT1 is supplied to the node N2 by the transistor Tr8, the voltage applied between the sources and drains of the transistors Tr1, Tr2 becomes below the supply voltage (=a difference between the high-level voltage and low-level voltage). The voltages applied between the sources and drains of other transistors Tr3-Tr8 are below the supply voltage, so that the voltages in all the transistors Tr1-Tr8 are to have the values below the supply voltage.

The circuit structure of the scanning circuit of the gate-line driving circuit 2 shown in FIG. 3 can also be applied to the scanning circuit of the source-line driving circuit 3 shown in FIG. 1.

Figure 4:
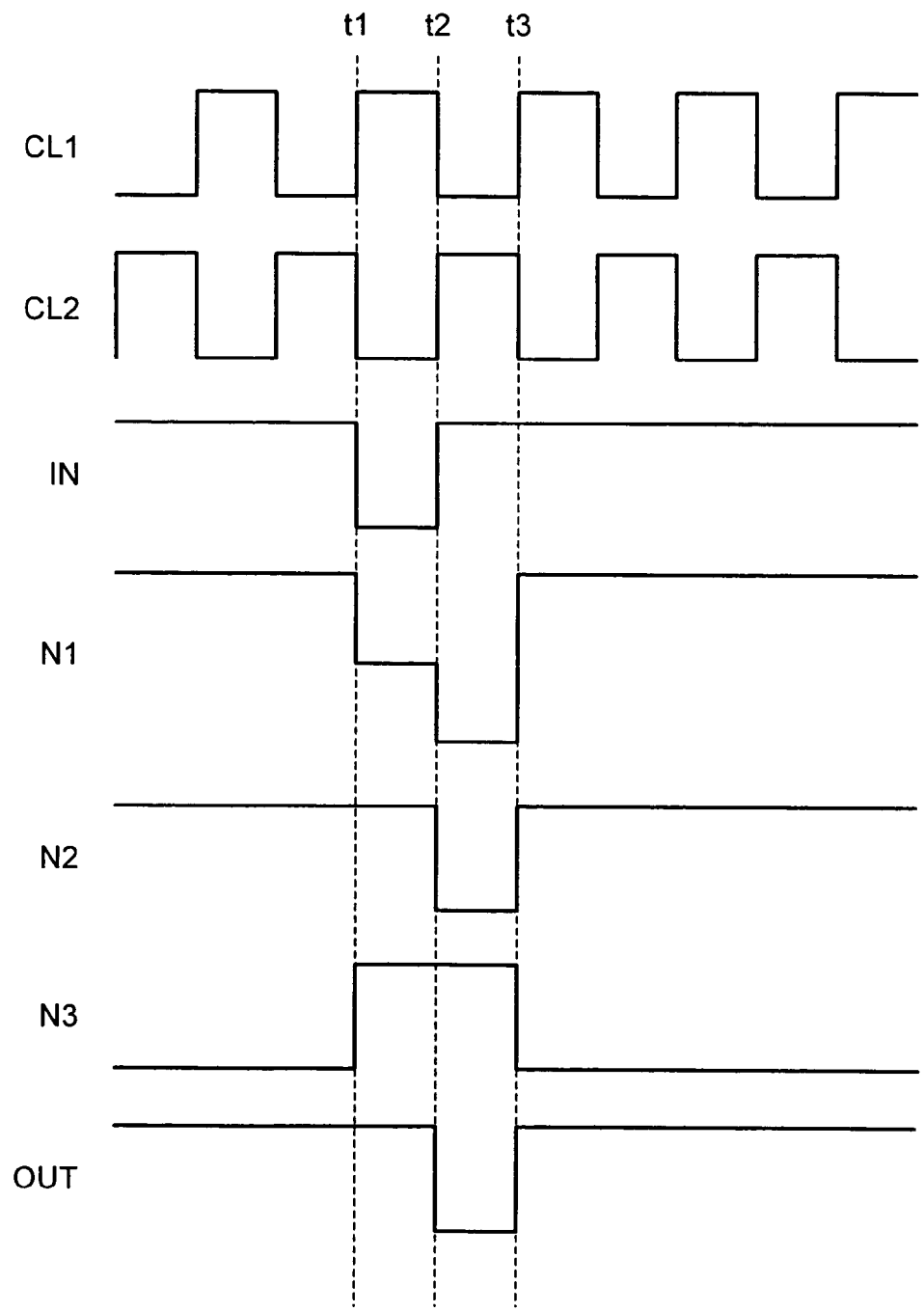
FIG. 4 is a timing chart for showing action of the shift register according to the first embodiment of the present invention.

Next, there is described the action of the shift register according to the first embodiment of the present invention. FIG. 4 is a timing chart for showing the action of the shift register according to the first embodiment of the present invention. In FIG. 4, the high-level voltage of the clock signals CL1, CL2 and the vertical start pulse signal ST is VDD, and the low-level voltage thereof is VSS.

The action of the shift register SR1 will be described by referring to FIG. 4. First, when the vertical start pulse signal ST becomes low level at the time t1 of FIG. 4, the transistors Tr3, Tr4 become conductive. In accordance with this, the voltage of the node N1 changes to a voltage that is boosted up for the amount of the threshold value Vt from the low-level voltage of the vertical start pulse signal ST. Further, the node N3 becomes high level.

In that state, the transistor Tr7 becomes conductive. However, the output signal OUT1 stays at high level since the clock signal CL1 is high level. Furthermore, high-level voltage is supplied also from the transistor Tr6 since the clock signal CL2 is low level.

When reaching the time t2 thereafter, the clock signal CL1 changes to low level. Since there are capacitances present in the gate-drain electrode and gate-source electrode of the transistor Tr7, the voltage of the node N1 is decreased to a voltage that is still lower than VSS+Vt to be lower than the low-level voltage, due to the bootstrap effect through each of the capacitances. As a result, the voltage higher than the threshold voltage is applied between the gate and source of the transistor Tr7. Thus, the transistor Tr7 maintains the conductive state and supplies the low-level voltage of the clock signal CL1 as the output signal OUT1.

When reaching the time t3 thereafter, the output signal OUT2 of the subsequent-stage changes to low level. Thereby, the transistor Tr5 becomes conductive, and the voltage of the node N3 changes from the high level to the voltage, VSS+Vt, which is boosted up from the low-level voltage for the amount of Vt. As a result, the transistors Tr1, Tr2 become conductive, and the voltage of the node N1 changes from the low level to high level. In that state, the voltage difference between the gate and source of the transistor Tr7 becomes zero, so that the transistor Tr7 becomes nonconductive.

After the time t3, the clock signal CL2 is inputted to the transistor Tr6 at a constant cycle so that the output signal OUT1 keeps the high level. Further, the voltage of the node N3 keeps the VSS+Vt voltage by the gate capacitances of the transistors Tr1 and Tr2 until there is an input of the next low-level vertical start pulse signal ST. Thus, the transistors Tr1 and Tr2 stay in the conductive state. Therefore, the voltage of the node N1 stays as the high-level voltage from the time t3 where the next low-level vertical start pulse signal ST is inputted to the next time t1. Thus, the voltage between the gate and source of the transistor Tr7 is set as zero and the transistor Tr7 becomes nonconductive.

As described above, in the first embodiment of the present invention, there is no path where an electric current flows from the positive power source (high level) to the negative power source (low level) at all of the time, thereby achieving a low power-consuming circuit.

The action of the shift register SR1 has been described above. Although the signals to be inputted are changed, the same action is executed in the shift registers SR2, SR3, SR4 . . . other than the shift register SR1. As a result, the vertical start pulse signal ST is outputted by the shift registers in order with the phases being shifted.

(Second Embodiment)

Figure 5:
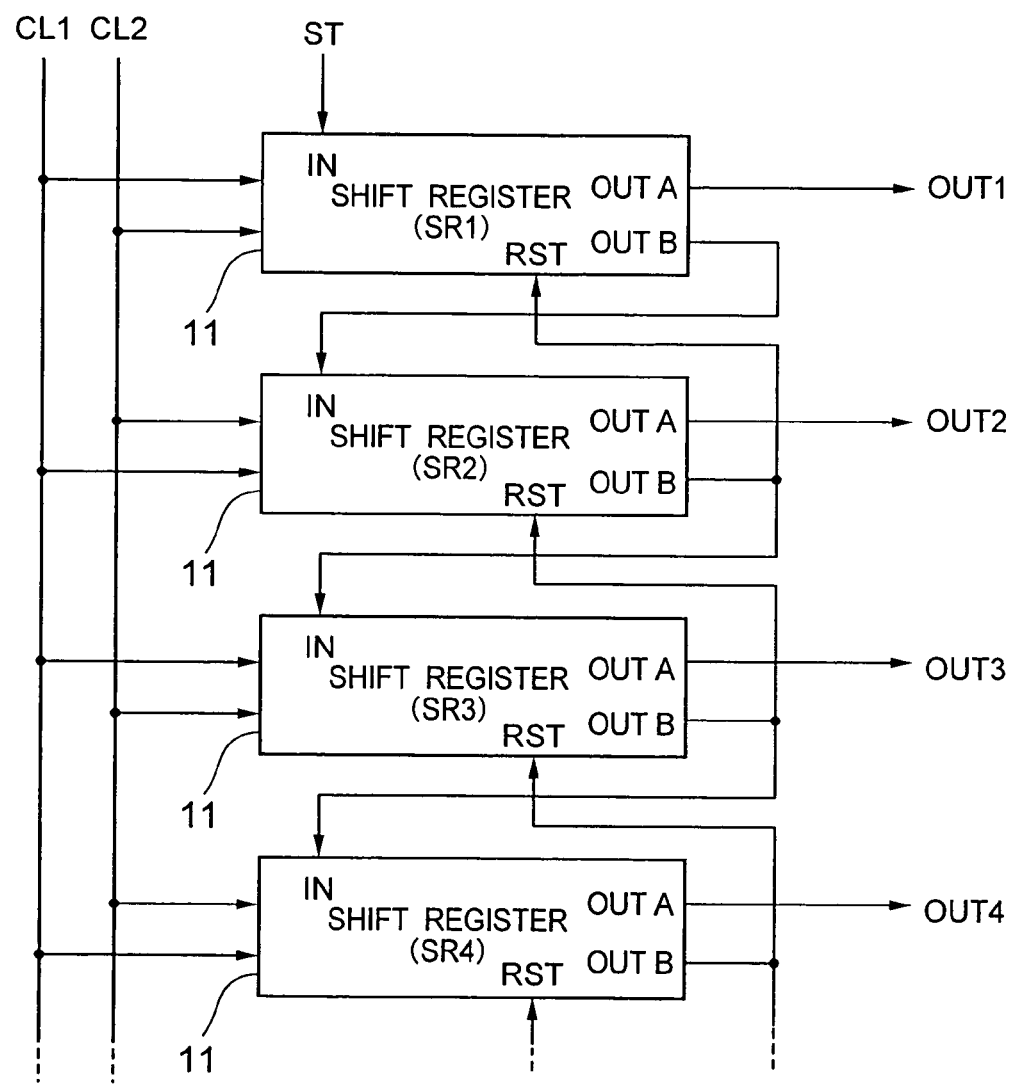
FIG. 5 is a block diagram for showing a scanning circuit according to a second embodiment of the present invention.
Figure 6:
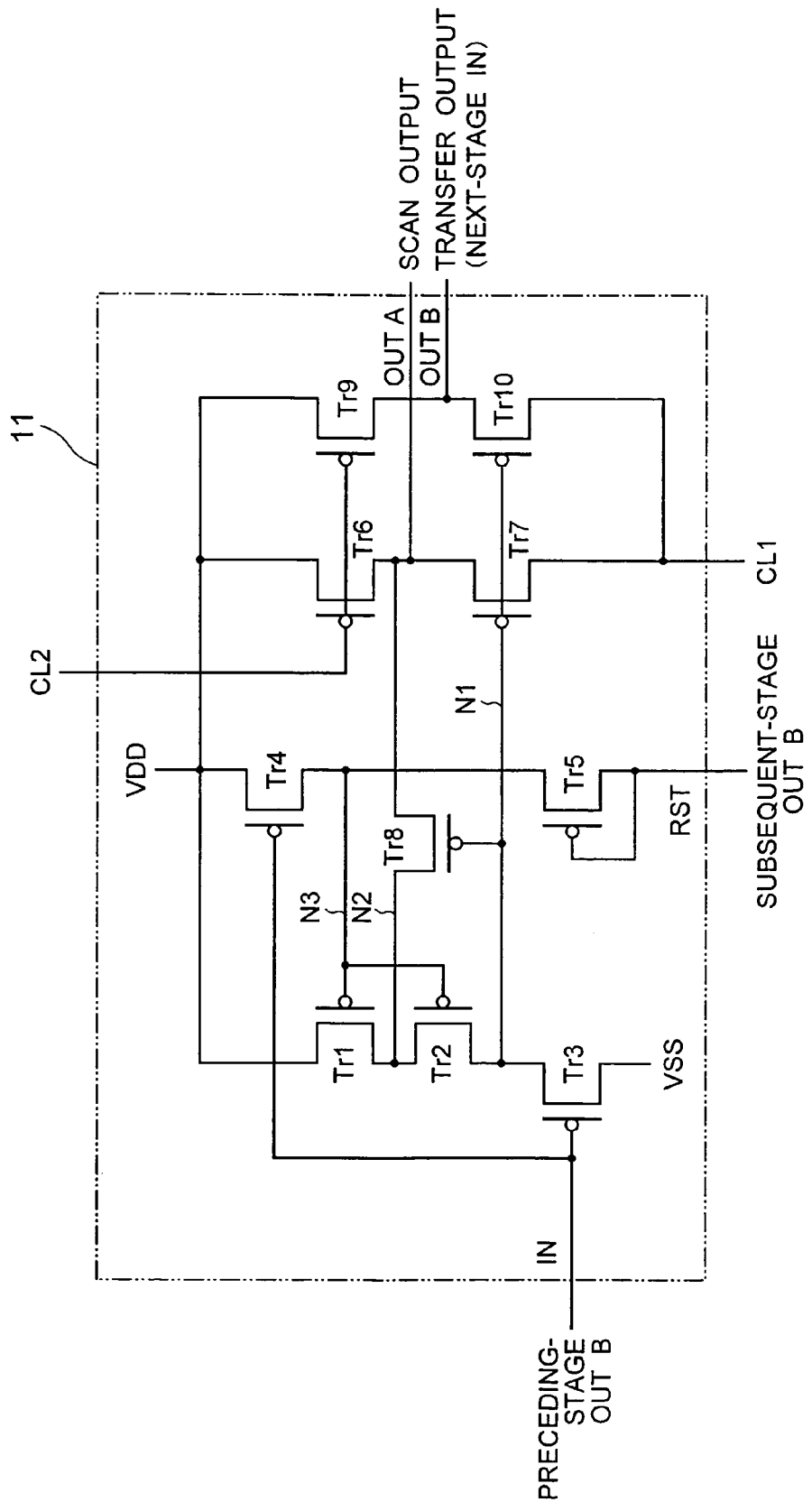
FIG. 6 is a circuit diagram for showing a shift register according to the second embodiment of the present invention.

FIG. 5 shows the configuration of the scanning circuit according to a second embodiment of the present invention, and FIG. 6 shows the configuration of the shift register that constitutes the scanning circuit.

As shown in FIG. 5, the scanning circuit according to the second embodiment of the present invention is constituted with a plurality of shift registers 11 connected in series. As shown in FIG. 6, the shift register 11 has transistors Tr9 and Tr10 added to the subsequent-stages of the transistors Tr6 and Tr7 in the circuit of the shift register 10 shown in FIG. 3. The second embodiment of the present invention is distinctive in respect that there is outputted a transfer output signal OUT B as a transfer output for the next stage at a timing of outputting an output signal OUT A (scanning output signal OUT A) by adding the transistors Tr9 and Tr10. FIG. 6 illustrates the configuration of the first-stage shift register 11, however, the configuration of circuits of the shift registers 11 after the first stage are the same as that of the shift register shown in FIG. 6, except that the signals to be inputted are changed.

In FIG. 6, the transistor Tr9 operates in the same manner as that of the transistor Tr6, which becomes conductive when the clock signal CL2 is low level and supplies voltage of high-level VDD power source as the transfer output signal OUT B. The transistor Tr10 operates in the same manner as that of the transistor Tr7, which becomes conductive when the voltage of the node N1 is the low voltage (VSS+Vt or bootstrap voltage that is still lower than the low-level voltage), and the voltage of the clock signal CL1 is supplied as the transfer output signal OUT B.

As has been described in the first embodiment, the transistors Tr6 and Tr7 drive the capacitive load connected to the output terminal which outputs the output signal OUT 1, so that the channel widths thereof are larger by one digit or more compared to those of other transistors Tr1-Tr5. Therefore, referring to the layout, the transistor needs to be positioned near the wiring of the output terminal from which the output signal OUT1 is outputted, thereby limiting the versatility of the possible layout. In the meantime, it is not necessary to make the size of the transistors Tr9 and Tr10 as large as the size of the transistors Tr6 and Tr7, since only the gate electrodes of the subsequent-stage transistors Tr3, Tr4 are connected to the output terminal from which the transfer output signal OUT B is outputted so that the load of the output terminal is lighter than load connected to the output terminal from which the scanning output signal OUT A is outputted. The output terminals of the second stage and thereafter, from which the transfer output signals OUT B are outputted, are connected to the gate electrodes of the subsequent-stage transistors Tr3, Tr4, and the preceding-stage transistor Tr5.

Since the size of the transistors Tr9 and Tr10 is small, there is provided the versatility in positioning the transistor. Thus, layout design can be easily carried out. In the second embodiment of the present invention, the transistors Tr9 and Tr10 are provided additionally, however, the size (channel width) of the transistors Tr9 and Tr10 can be designed as small.

The circuit configurations of the shift registers 11 shown in FIG. 5 after the first-state shift register 11 to which the vertical start pulse signal ST is inputted are the same as the configuration shown in FIG. 6, except that the signals to be inputted are changed. In the subsequent-stage shift register 11 connected to the first-state shift register 11, the preceding-stage transfer output signal OUT B is inputted to the input terminal IN instead of the vertical start pulse signal ST, and the clock signal CL2 is inputted instead of the clock signal CL1 while the clock signal CL1 is inputted instead of the clock signal CL2. For the shift registers 11 thereafter, the output signal OUT B of the preceding stage is inputted and the clock signal is switched for every stage to be inputted.

(Third Embodiment)

Figure 7:
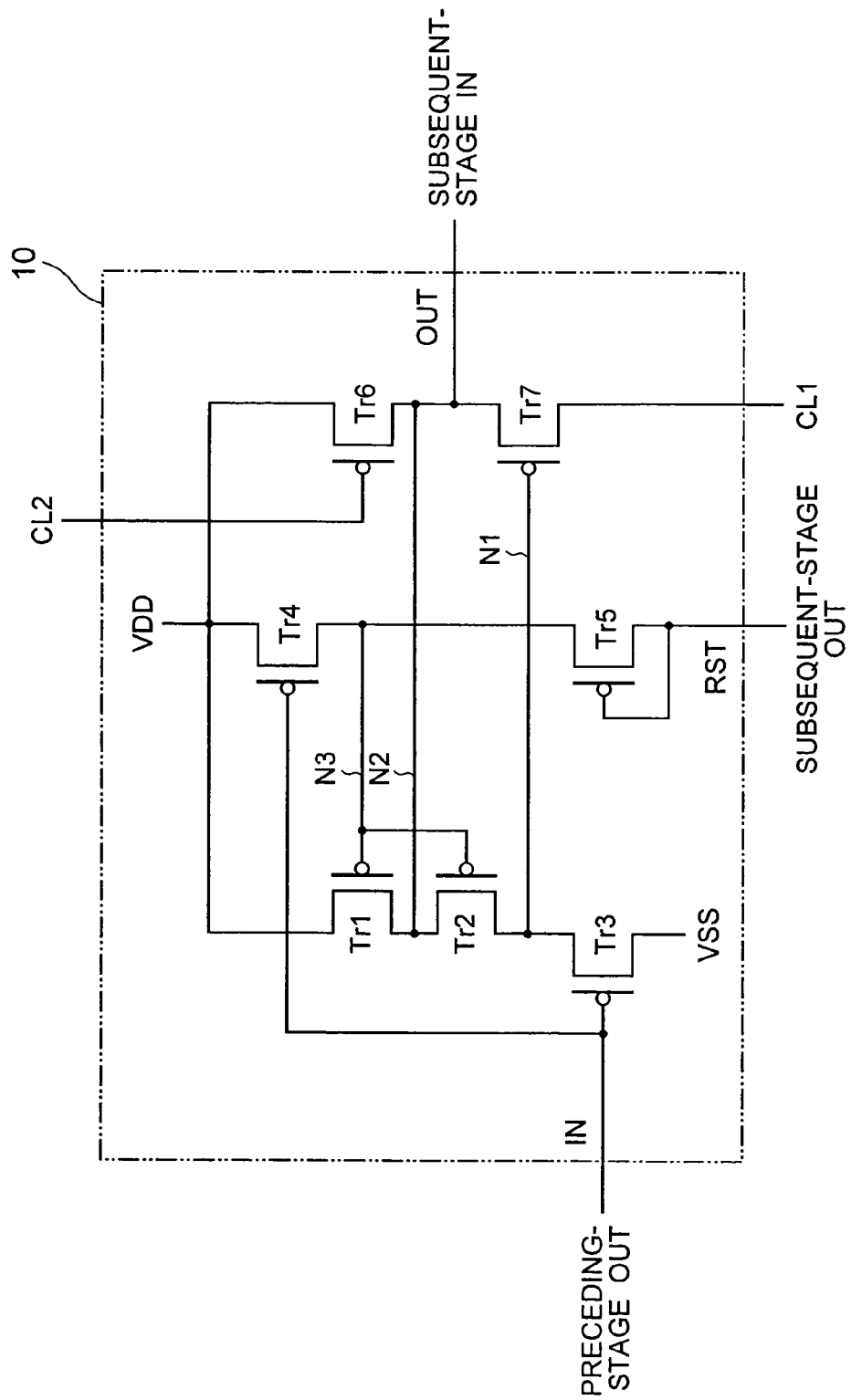
FIG. 7 is a circuit diagram for showing a shift register according to a third embodiment of the present invention.

FIG. 7 shows the configuration of the shift register according to a third embodiment of the present invention. The configuration of the scanning circuit constituted by combining a plurality of the shift registers shown in FIG. 7 is the same as the one shown in FIG. 2, and the timing chart thereof is the same as the one shown in FIG. 4.

In the shift register of FIG. 7 according to the third embodiment of the present invention, the transistor Tr8 is eliminated from the circuit structure of the shift register of FIG. 3 according to the first embodiment, and the node N2 is directly connected to the output terminal from which the output signal OUT is outputted.

Therefore, the third embodiment of the present invention is advantageous compared to the shift register of the first embodiment shown in FIG. 2 in respect that it allows the total number of the transistors to be reduced, thereby enabling the circuit to be downsized. The shift register according to the third embodiment of the present invention is operated according to the timing chart shown in FIG. 4.

FIG. 7 illustrates the configuration of the first-stage shift register 11 according to the third embodiment of the present invention, however, the configurations of circuits of the subsequent-stage shift registers 11 that are connected to the first-stage shift register 11 are the same as the one shown in FIG. 7, except that the signals to be inputted are changed. In the subsequent-stage shift register 11 connected to the first-state shift register 11, the output signal OUT1 outputted from the preceding-stage shift register 11 is inputted to the input terminal IN instead of the vertical start pulse signal ST, and the clock signal CL2 is inputted instead of the clock signal CL1 while the clock signal CL1 is inputted instead of the clock signal CL2. In the subsequent-stage shift registers 11, the output signal OUT of the preceding-stage is inputted to the input terminal IN, and the clock signals are inputted while being switched for every stage.

(Fourth Embodiment)

Figure 8:
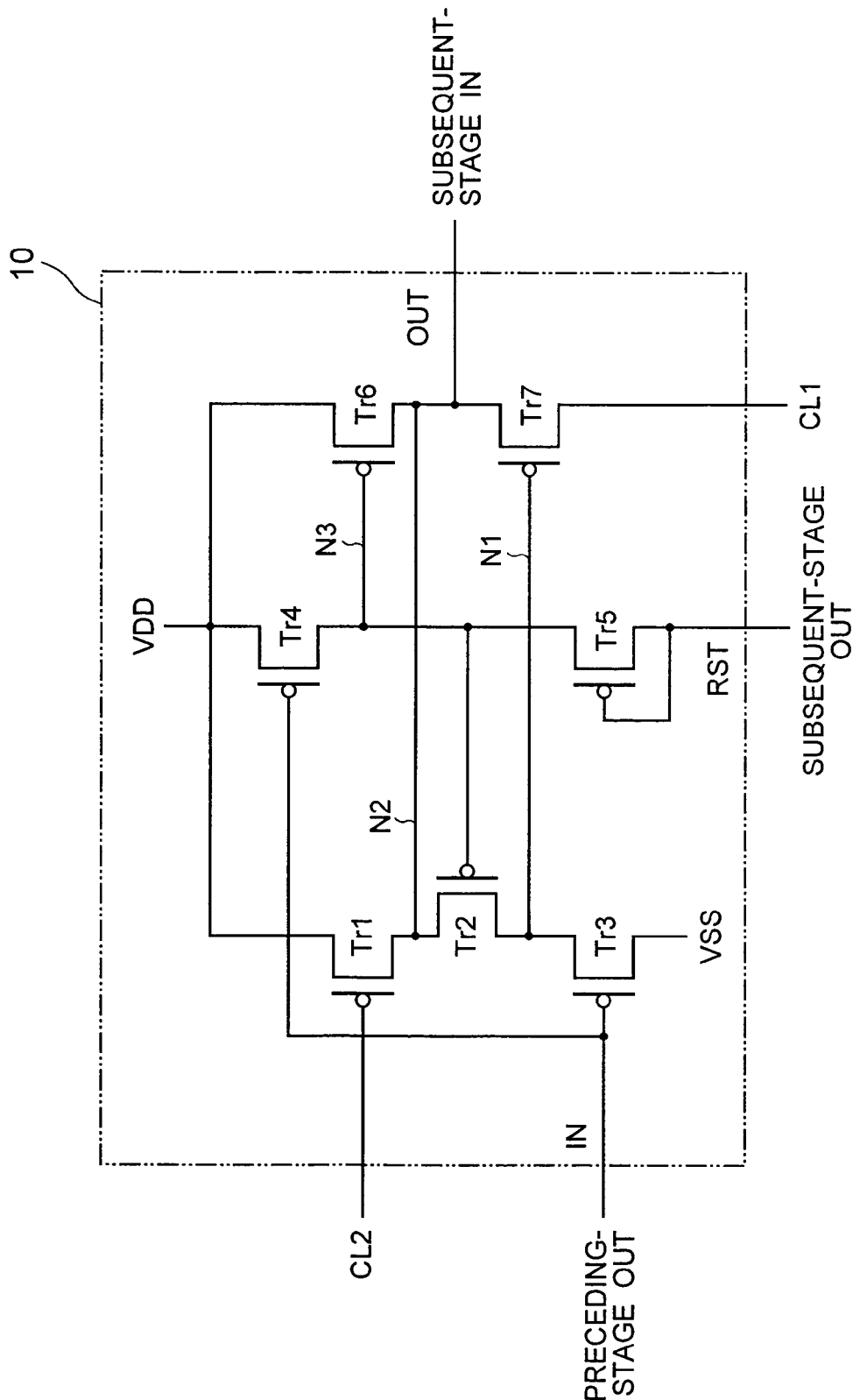
FIG. 8 is a circuit diagram for showing a shift register according to a fourth embodiment of the present invention.

FIG. 8 shows the configuration of the shift register according to a fourth embodiment of the present invention. The configuration of the scanning circuit constituted by combining a plurality of the shift registers shown in FIG. 8 is the same as the one shown in FIG. 2, and the timing chart thereof is the same as the one shown in FIG. 4. FIG. 8 shows the configuration of the first-stage shift register according to the fourth embodiment of the present invention, which is a modification of the shift register SR2 shown in FIG. 2. The circuit structure of the subsequent-stage shift register connected to the above-described shift register is the same as the one shown in FIG. 8, except that the signals to be inputted are changed. Specifically, in the shift register 10 shown in FIG. 8, the output signal OUT1 outputted from the preceding-stage shift register 11 is inputted to the input terminal IN instead of the vertical start pulse signal ST, and the clock signal CL2 is inputted instead of the clock signal CL1 while the clock signal CL1 is inputted instead of the clock signal CL2. In the subsequent-stage shift registers, the output signal OUT outputted from the preceding-stage shift register is inputted to the input terminal IN, and the clock signals are inputted while being switched for every stage.

In the shift register according to the fourth embodiment of the present invention, the clock signal CL2 is inputted to the gate electrode of the transistor Tr1, while the gate electrode of the transistor Tr1 in the shift register of the third embodiment shown in FIG. 7 is connected to the node N3. Furthermore, in the shift register according to the fourth embodiment of the present invention, the gate electrode of the transistor Tr6 is connected to the node N3 that is connected to the drain electrode of the transistor Tr4, while the clock signal CL2 is inputted to the gate electrode of the transistor Tr6 according to the third embodiment shown in FIG. 7.

Thus, in the shift register according to the fourth embodiment of the present invention, the transistor Tr6 stays conductive even when the clock signal CL2 is high level and the transistor Tr1 is nonconductive. Therefore, the high-level signal is continuously supplied to the node N2 from the time t3 to the next time t1 of FIG. 4. As a result, the node N1 through the transistor Tr2 also has the high-level signal supplied thereto. Further, it is in the state where the high-level signal is supplied by the transistor Tr6 with the high driving capacity, so that the transistor Tr7 connected to the node N1 can be driven by still lower impedance compared to the first embodiment. Through connecting the node N3 to the gate electrodes of both of the transistors Tr1 and Tr6, the transistor Tr7 connected to the node N1 can be driven by still lower impedance.

With the configuration of the third and fourth embodiments of the present invention, in which the output signal OUT is outputted from the node N2 that connects the drain electrode of the transistor Tr1 and the drain electrode of the transistor Tr6, the high-level signal can be continuously supplied to the node N1 from the time t3 to the next time t1 through supplying the high-level signal of the node N3 at least to the gate electrode of the transistor Tr1 or to the gate electrode of the transistor Tr6.

(Fifth Embodiment)

Figure 9:
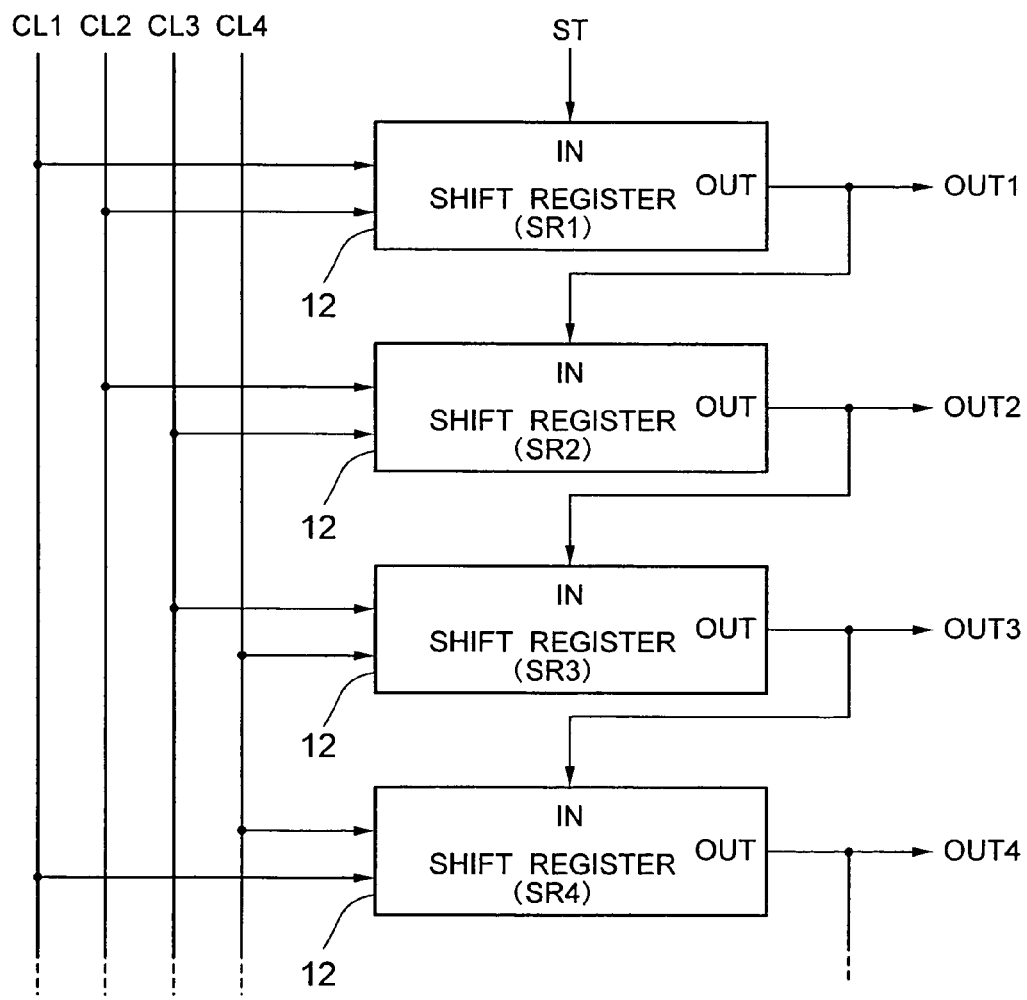
FIG. 9 is a block diagram for showing a scanning circuit according to a fifth embodiment of the present invention.
Figure 10:
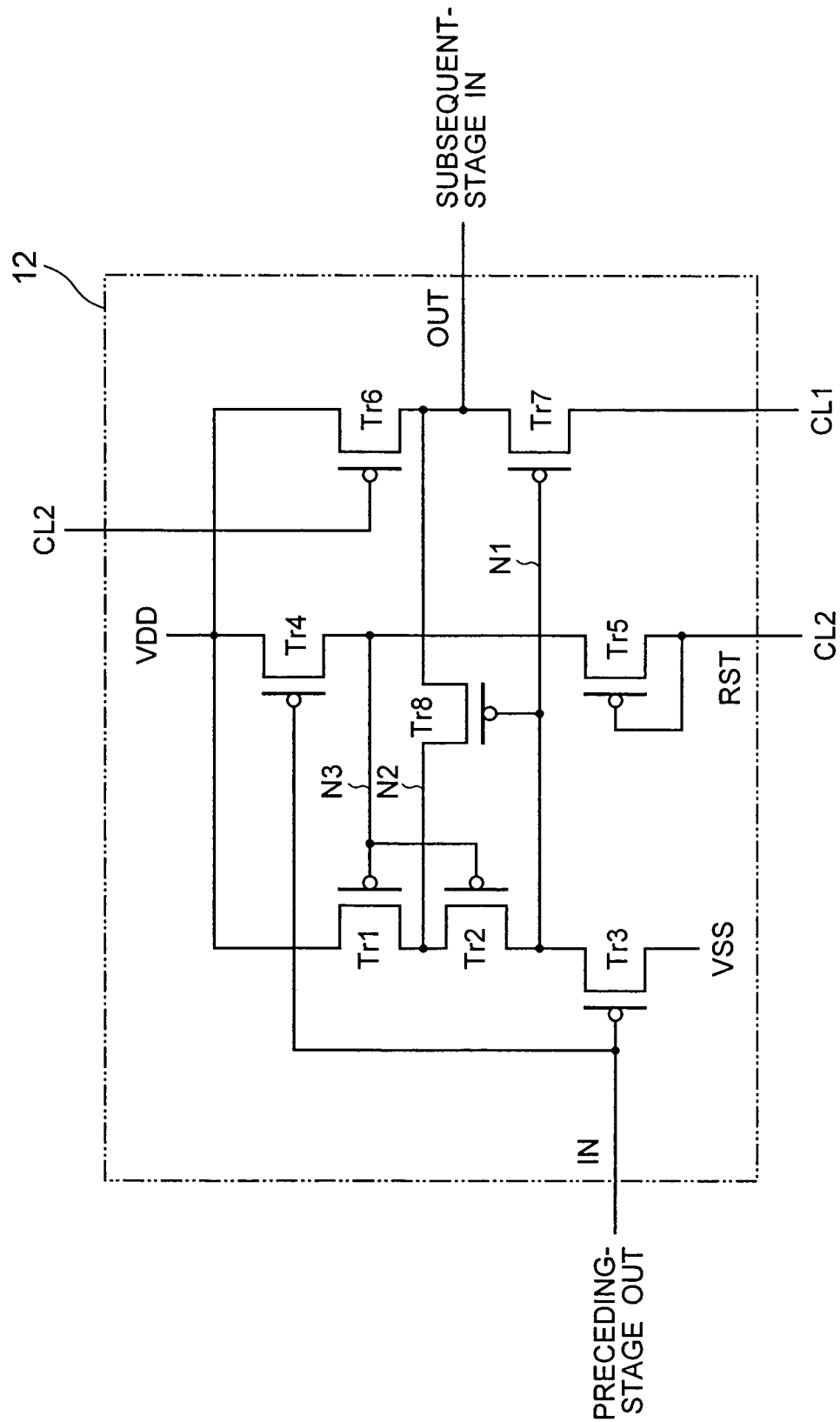
FIG. 10 is a circuit diagram for showing a shift register according to the fifth embodiment of the present invention.
Figure 11:
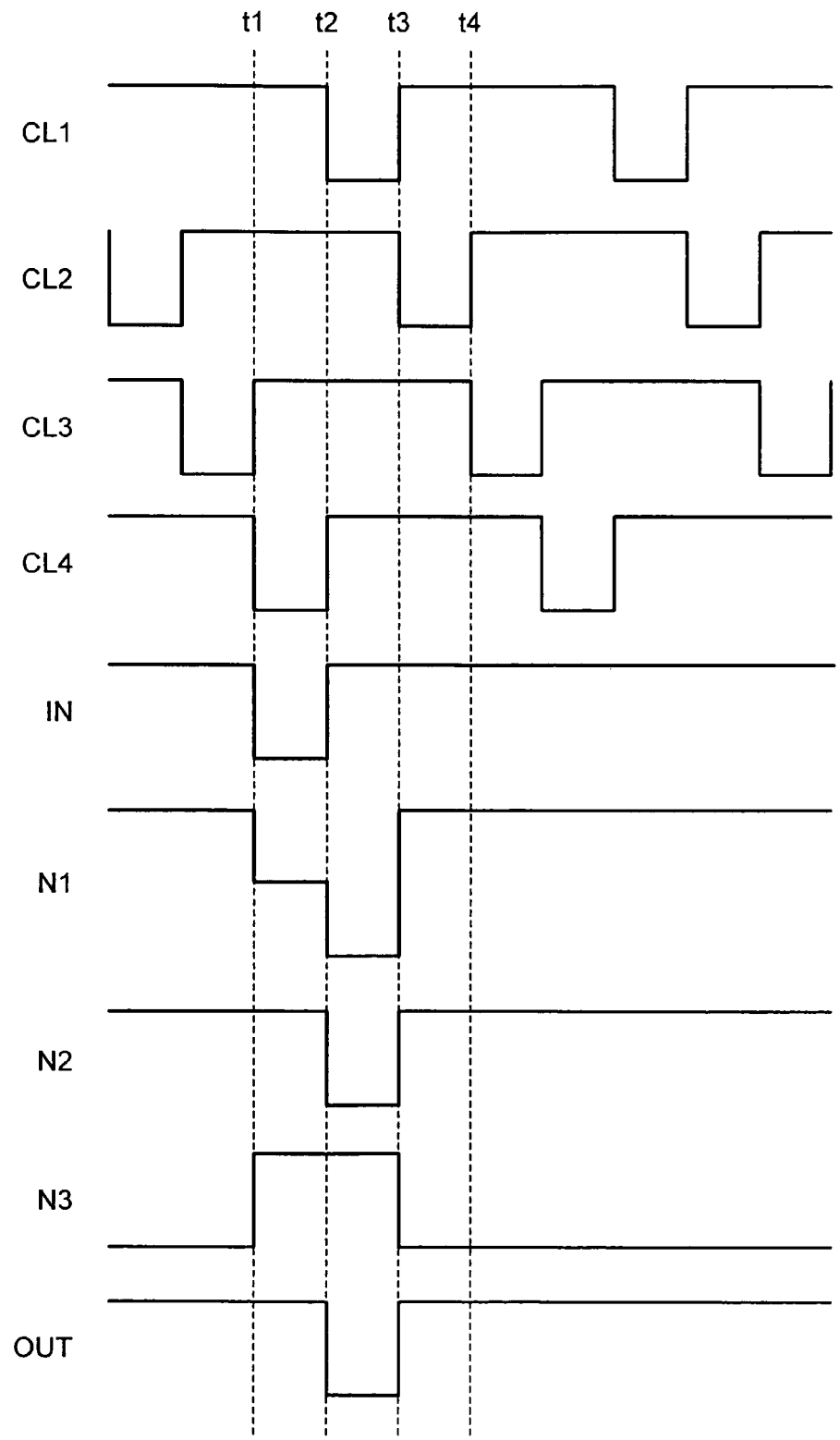
FIG. 11 is a timing chart for showing action of the shift register according to the fifth embodiment of the present invention.

FIG. 10 shows the configuration of the shift register according to a fifth embodiment of the present invention. FIG. 9 shows the configuration of the scanning circuit constituted by combining a plurality of the shift registers according to the fifth embodiment of the present invention shown in FIG. 10. FIG. 11 is a timing chart for showing the action of the scanning circuit according to the fifth embodiment of the present invention. The shift register 12 according to the fifth embodiment of the present invention shown in FIG. 10 corresponds to the first-stage shift register SR1 of the scanning circuit shown in FIG. 9. The configuration of the subsequent-stage shift registers SR2, SR3 . . . other than the first-stage shift register SR1 shown in FIG. 9 are the same as the configuration of the shift register 12 shown in FIG. 10, but the input/output signals are different. In the next-stage shift register SR2 connected to the first-stage shift register 12, the output signal OUT1 outputted from the preceding-stage shift register SR1 is inputted to the input terminal IN instead of the vertical start pulse signal ST, and the clock signal CL2 is inputted instead of the clock signal CL1 while a clock signal CL3 is inputted instead of the clock signal CL2. In the shift registers SR3, SR4 . . . after the shift register SR2, the output signal OUT outputted from the preceding-stage shift register is inputted to the input terminal IN, and the clock signal whose phase is advanced for every stage is inputted.

In the first embodiment shown in FIG. 2, two clock signals CL1 and CL2 are inputted to the shift register of the scanning circuit. However, in the fifth embodiment shown in FIG. 9, four clock signals CL1, CL2, CL3 and CL4 are inputted to the shift register of the scanning circuit. Further, although the output signal OUT2 outputted from the next-stage shift register SR2 is inputted to the transistor Tr5 of the first-stage shift register SR1 in the embodiment shown in FIG. 3, the clock signal CL2 is inputted to the transistor Tr5 of the first-stage shift register in the fifth embodiment shown in FIG. 10.

If the leak current is large when the transistors Tr4 and Tr5 of the shift register shown in FIG. 3 are made nonconductive, the voltage of the node N3 gradually boosts up from the low level and the transistors Tr1, Tr2 become nonconductive.

In the configuration of the fifth embodiment shown in FIG. 10, however, the transistor Tr5 becomes conductive by the clock cycle, which allows the transistors Tr1 and Tr2 to avoid the nonconductive state even if the leak current is large when the transistors Tr4 and Tr5 are made nonconductive. As a result, the high-level signal can be supplied constantly to the node N1 from the time t3 to the next time t1 of FIG. 11.

Figure 12:
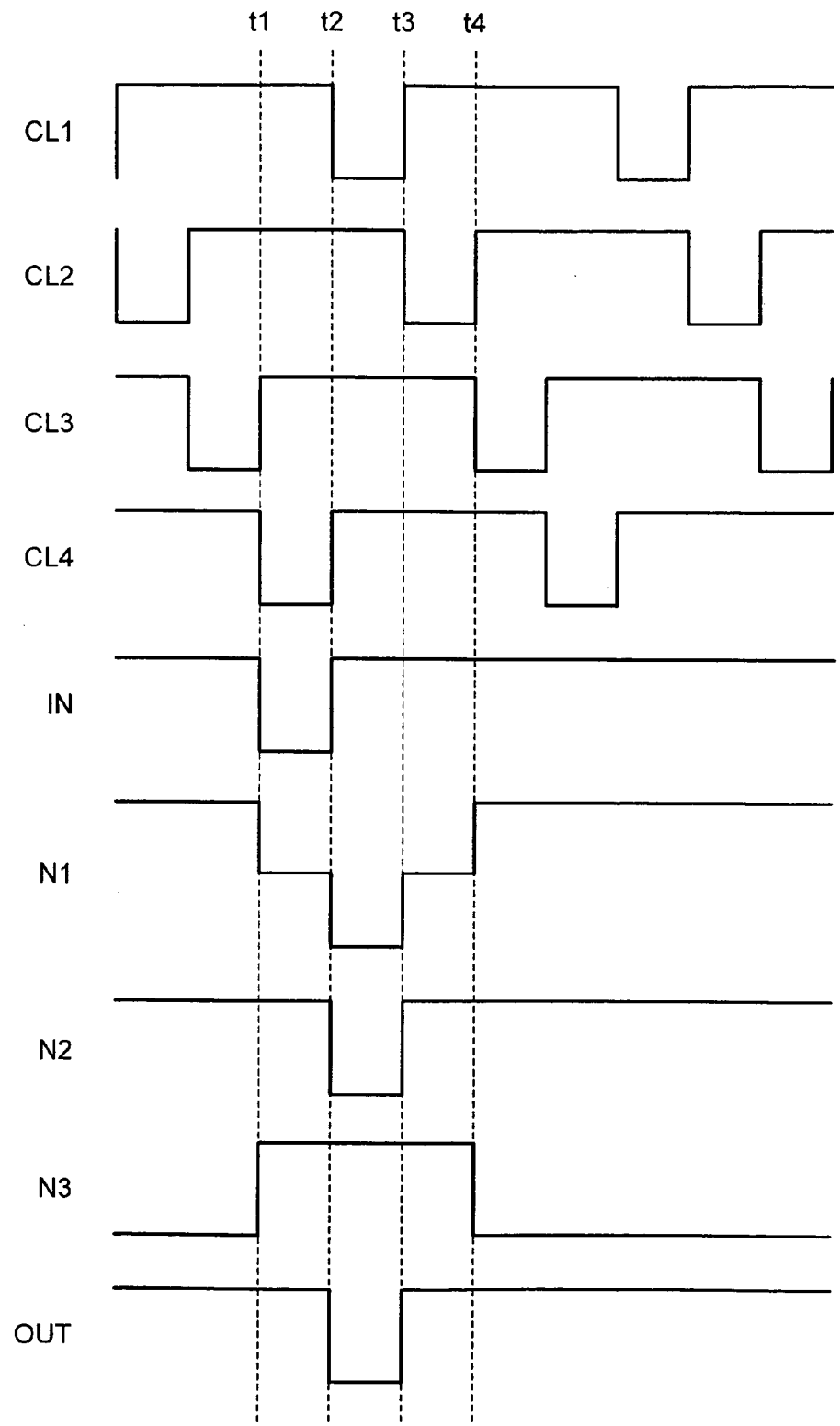
FIG. 12 is a timing chart for showing action of the shift register according to a modification example of the fifth embodiment of the present invention.

FIG. 12 shows a modification example of the timing chart shown in FIG. 11 for operating the shift register according to the fifth embodiment shown in FIG. 10. The timing chart shown in FIG. 12 is a timing chart when the clock signal CL3 instead of the clock signal CL2 is inputted to the transistors Tr5 and Tr6.

In FIG. 12, the voltage of the node N3 is lowered to low level by the transistor Tr5 at timing where the clock signal CL3 becomes low level. In that state, the transistor Tr7 is made conductive from the time t3 to the time t4, so that the high-level clock signal CL1 is outputted as the output signal OUT1. However, the waveform of the output signal OUT1 becomes the same as the waveform of FIG. 11.

Figure 13:
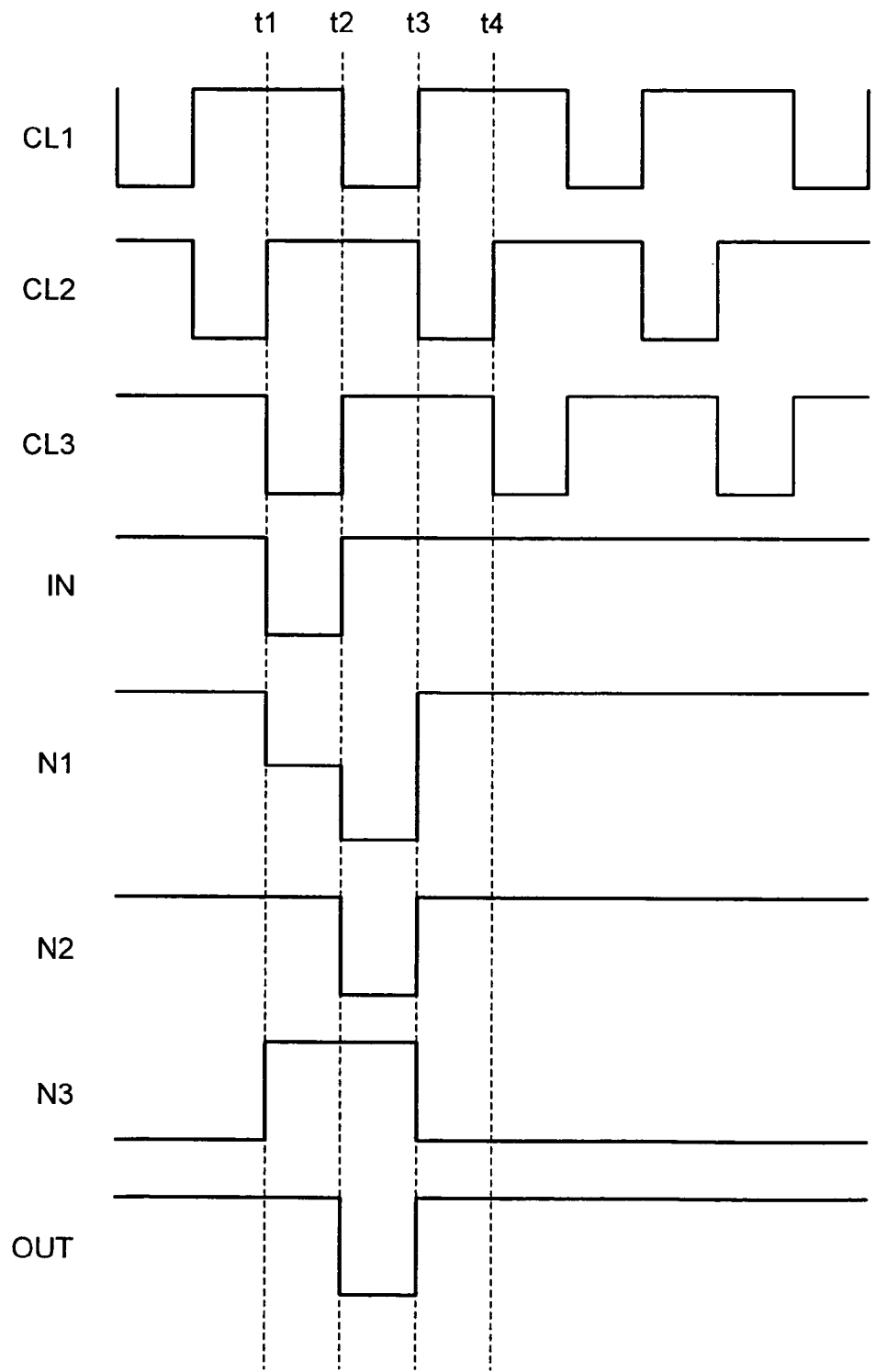
FIG. 13 is a timing chart for showing action of the shift register according to another modification example of the fifth embodiment of the present invention.

In the fifth embodiment of the present invention shown in FIG. 9, four clock signals CL1, CL2, CL3 and CL4 are used. However, five or more clock signals may be used or three clock signals may be used as well. When using three clock signals in the fifth embodiment of the present invention, the shift register according to the fifth embodiment of the present invention employs the circuit structure shown in FIG. 10, and the shift register shown in FIG. 10 is operated according to the timing chart shown in FIG. 13.

(Sixth Embodiment)

Next, a sixth embodiment of the present invention will be described by referring to FIG. 14 and FIG. 15. The scanning circuit according to the sixth embodiment of the present invention is formed as the circuit shown in FIG. 14, which is operated according to a timing chart shown in FIG. 16. Referring to the case of the shift register SR3 shown in FIG. 14, the shift register constituting the scanning circuit according to the sixth embodiment of the present invention is formed as the circuit shown in FIG. 15.

Figure 15:
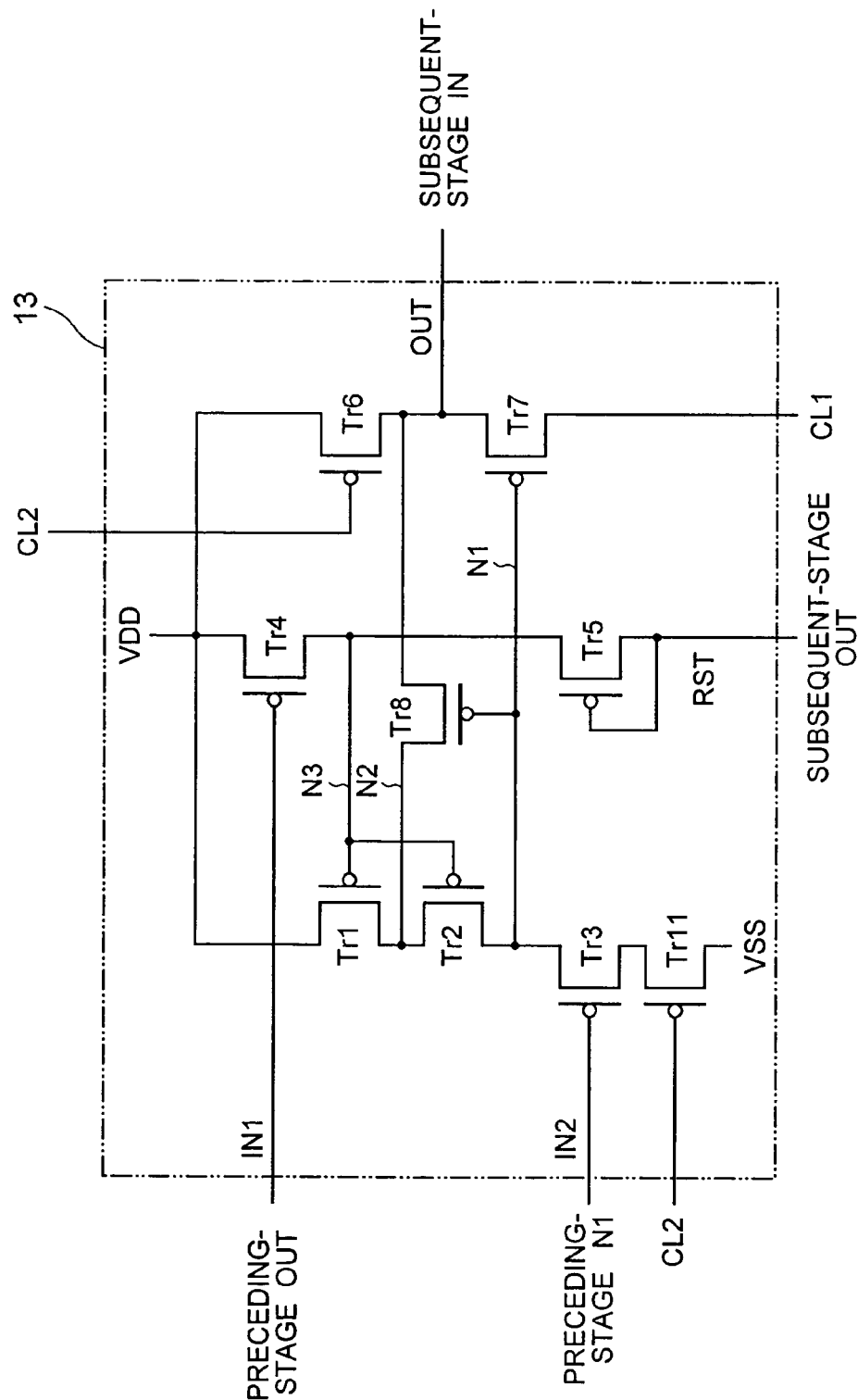
FIG. 15 is a circuit diagram for showing a shift register according to the sixth embodiment of the present invention.

In the shift register 13 (SR3) according to the sixth embodiment of the present invention shown in FIG. 15, a transistor Tr11 is connected to the transistor Tr3 in series, the signal of the node N1 in the preceding-stage shift register SR2 is inputted to the gate electrode of the transistor Tr3, and the clock signal CL2 is inputted to the gate electrode of the transistor Tr11.

Figure 16:
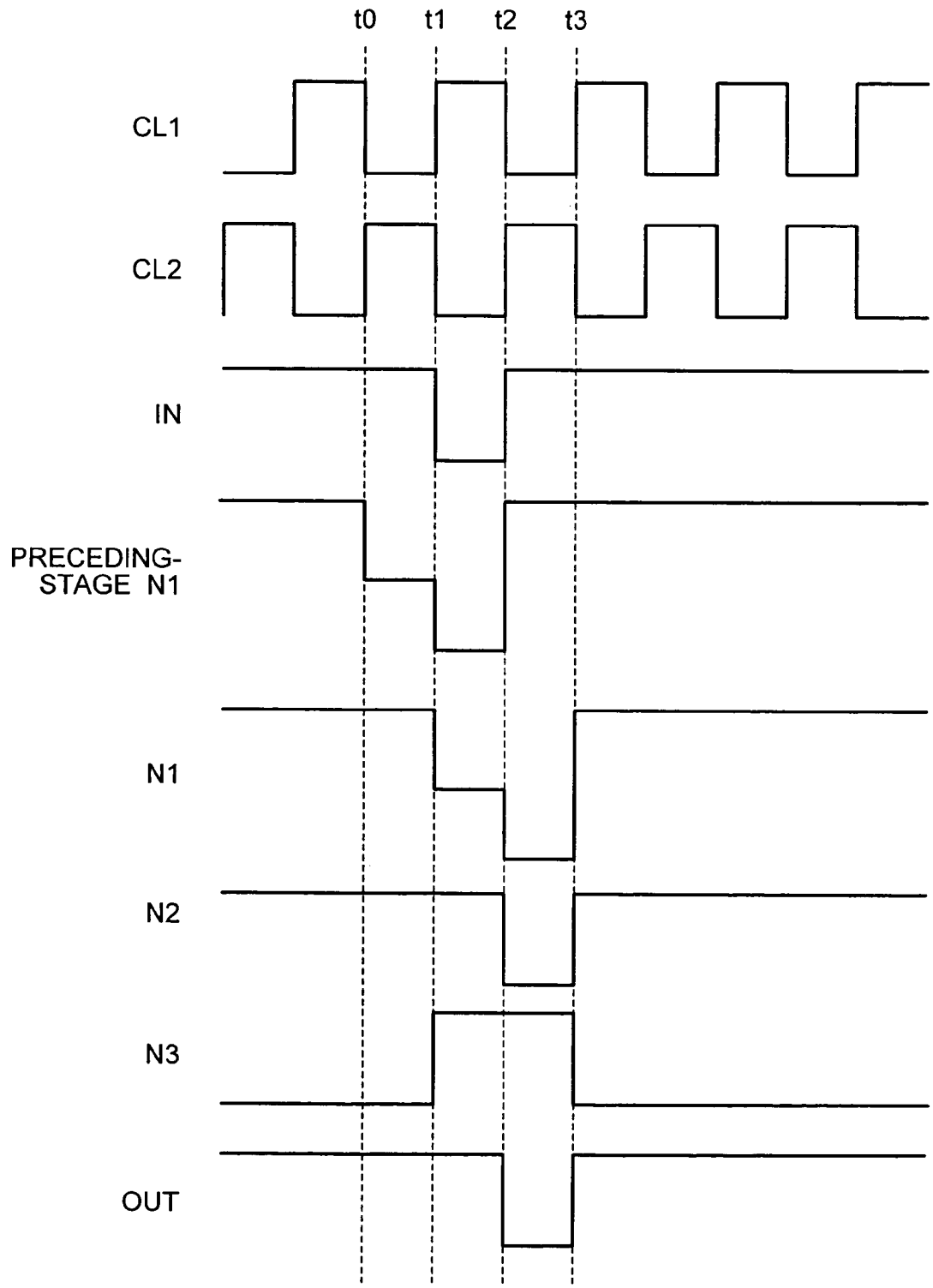
FIG. 16 is a timing chart for showing action of the shift register according to the sixth embodiment of the present invention.

As shown in FIG. 16, the transistor Tr3 becomes conductive from the time t0 to the time t2 in the sixth embodiment, and the transistor Tr11 becomes conductive from the time t1 to the time t2. Therefore, the low-level signal is supplied to the node N1 from the time t1 to the time t2. Thus, it is also possible with the sixth embodiment to obtain the same output signal OUT as the output signal of the timing chart shown in FIG. 4.

In the sixth embodiment shown in FIG. 15, an additional transistor Tr11 is connected to the transistor Tr3 of the shift register according to the first embodiment shown in FIG. 3. The transistor Tr11 added in the sixth embodiment, the size (channel width) of the transistor can be made small. The clock signal CL2 may be inputted to the gate electrode of the transistor Tr3 shown in FIG. 15, and the node N1 of the preceding-stage shift register may be inputted to the gate electrode of the transistor Tr11 shown in FIG. 15, respectively.

The conventional case and the first embodiment employ the configuration where the output signal from the preceding-stage shift register is inputted to the next-stage shift register. In that case, fluctuation of the transistor characteristic (the large threshold value Vt, low driving capacity) causes deterioration in the amplitude of the output signal OUT. Referring to the conventional case of FIG. 28 in particular, influence of the characteristic fluctuation of the transistors Tr101 and Tr104 is prominent. That is, there is a large influence of the transistor that applies the ON-voltage to the output transistor and the gate of the output transistor. When the transistor characteristic fluctuates and the threshold value increases, the voltage applied to the gate of the transistor Tr4 decreases. The gate voltage of the output transistor after bootstrap thereby decreases proportionally. If the threshold value of the output transistor characteristic is large in that state, the high-level output signal cannot be outputted, thereby deteriorating the amplitude. When the amplitude of the output signal OUT is deteriorated, the extent of the amplitude deterioration is increased for each advanced stage. This is due to the followings: when the signal with the deteriorated amplitude is inputted to the gate voltage of the next-stage transistor Tr111, the gate voltage lower than the preceding-stage is inputted to the gate of the transistor Tr114 so that the transistor Tr114 outputs the voltage that is still lower than that of the preceding stage. At last, the transistor cannot be set ON, and the shift operation cannot be carried out.

Figure 28:
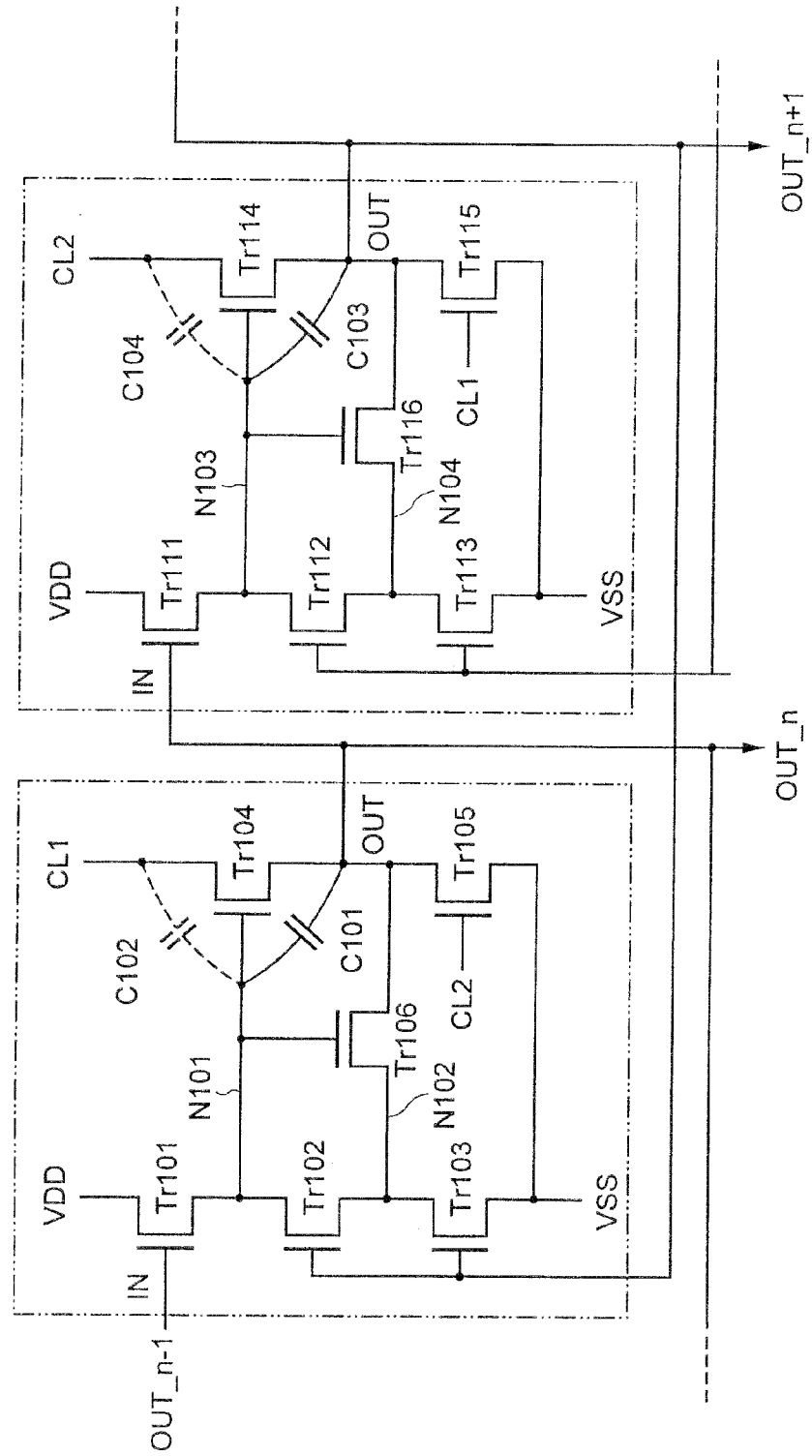
FIG. 28 is a circuit diagram for showing the structure of a conventional shift register.
Figure 29:
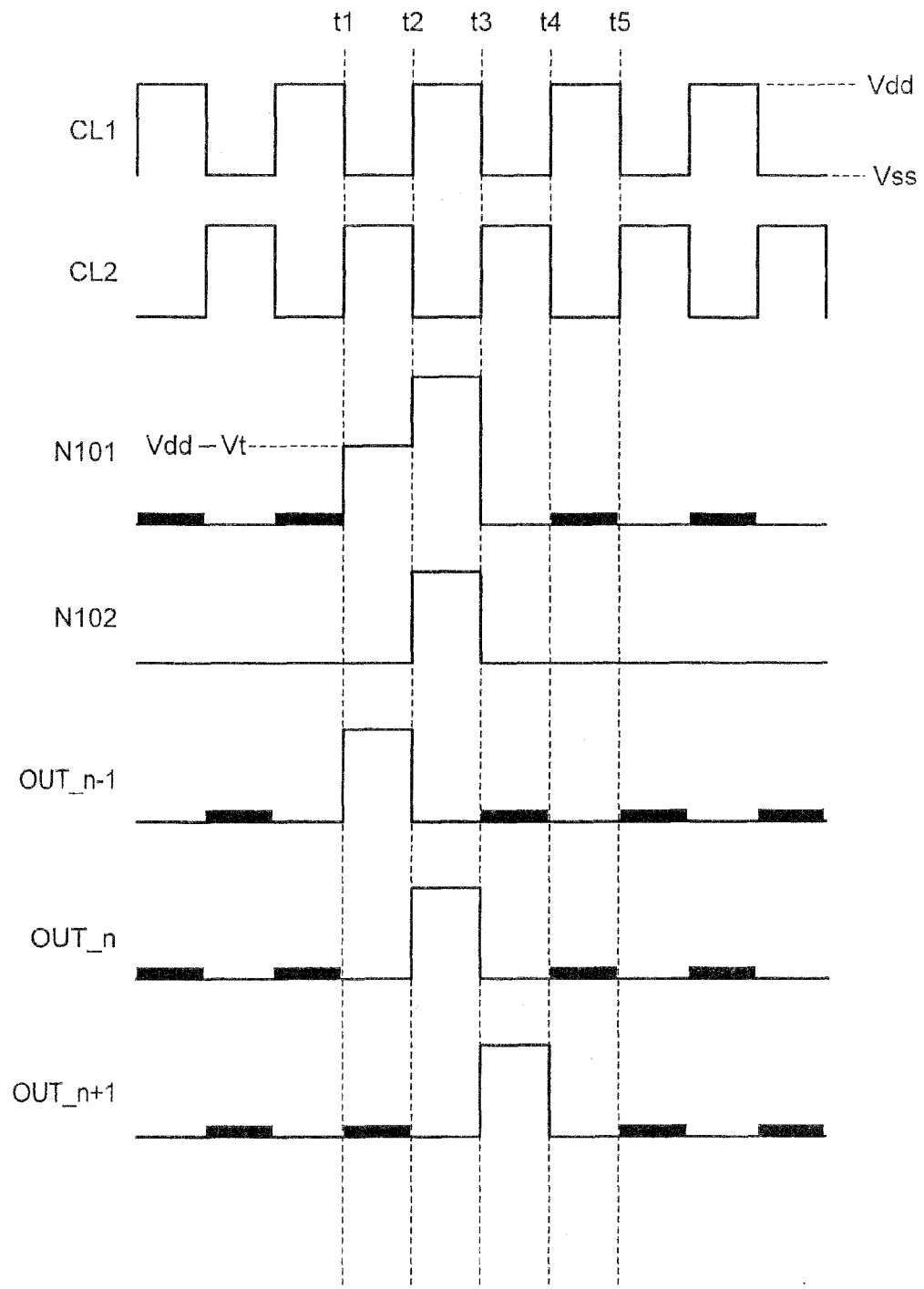
FIG. 29 is a timing chart for showing action of the conventional shift register.
Figure 30:
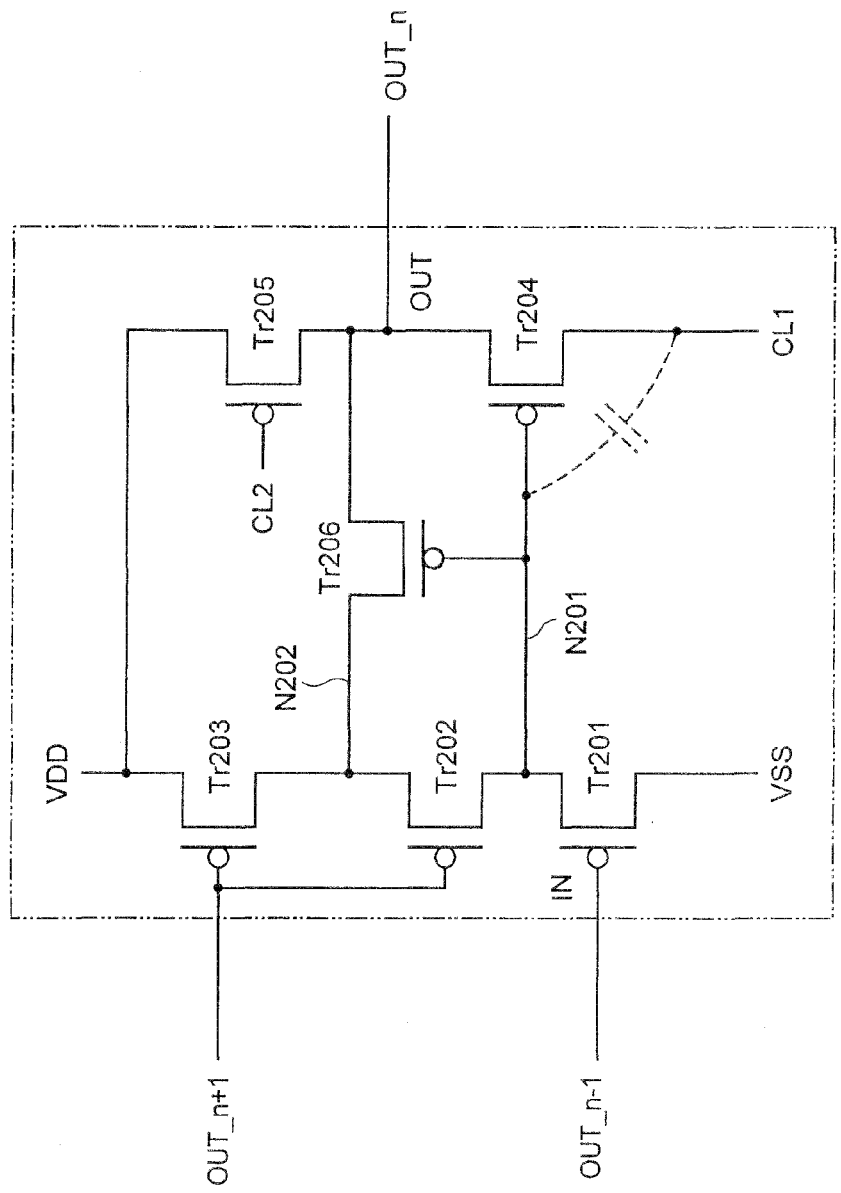
FIG. 30 is a circuit diagram of the conventional shift register which is constituted with P-channel type transistors.
Figure 31:
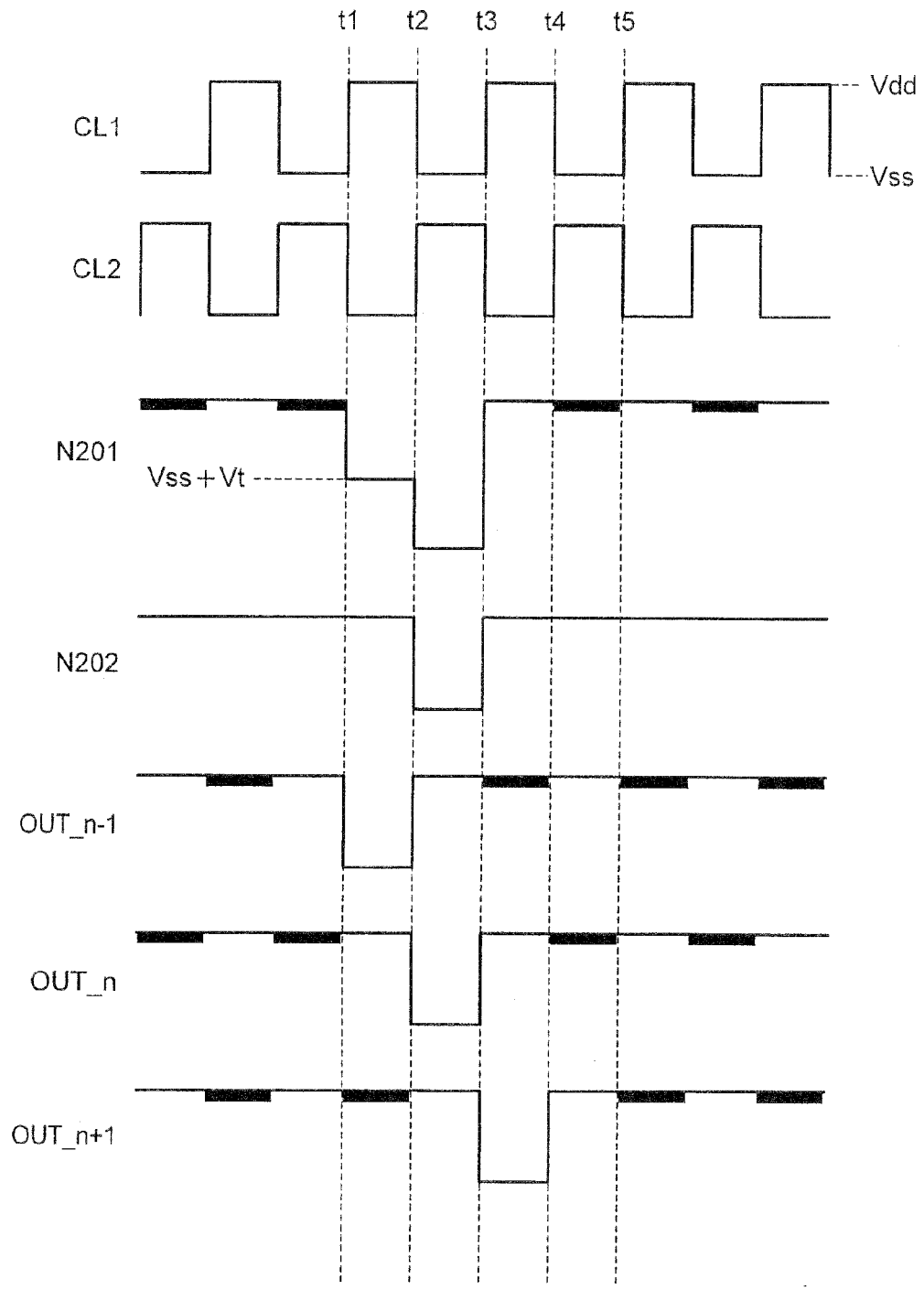
FIG. 31 is a timing chart for showing action of the conventional shift register which is constituted with the P-channel type transistors.
Figure 32:
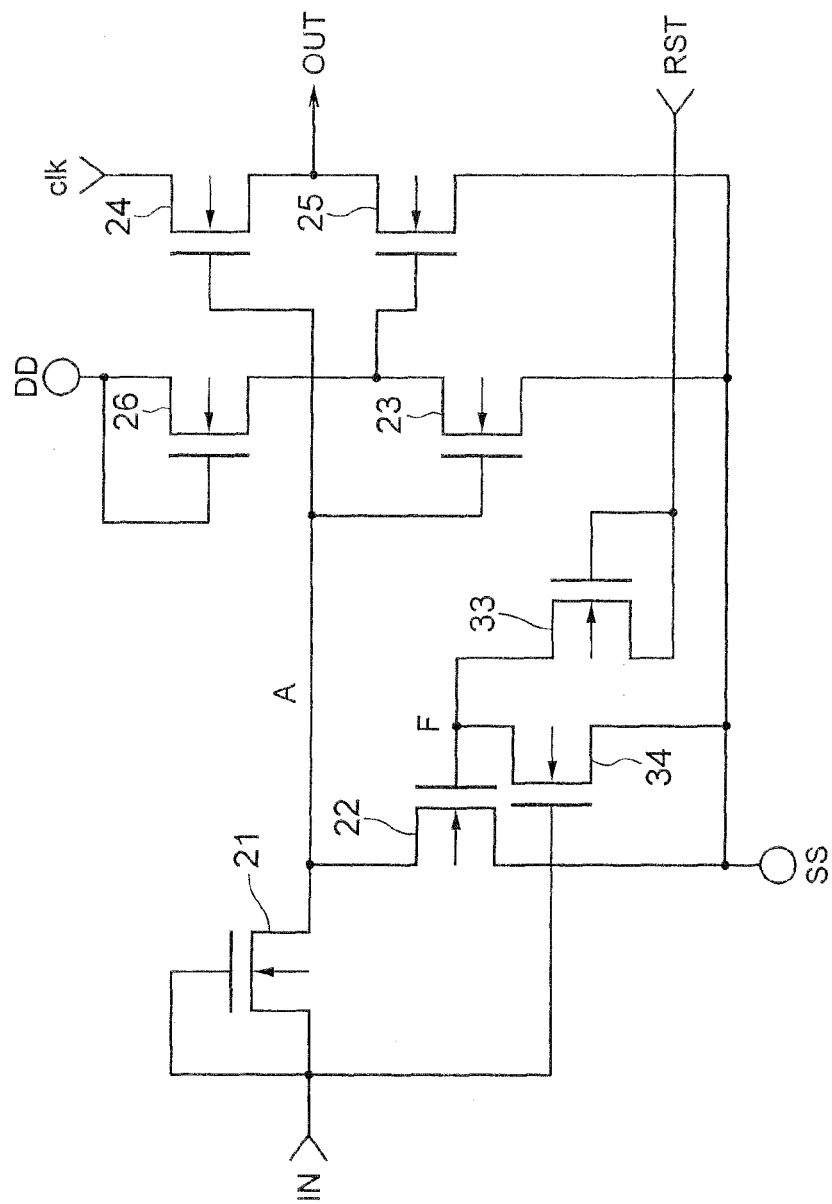
FIG. 32 is a circuit diagram for showing the structure of another conventional shift register.
Figure 33:
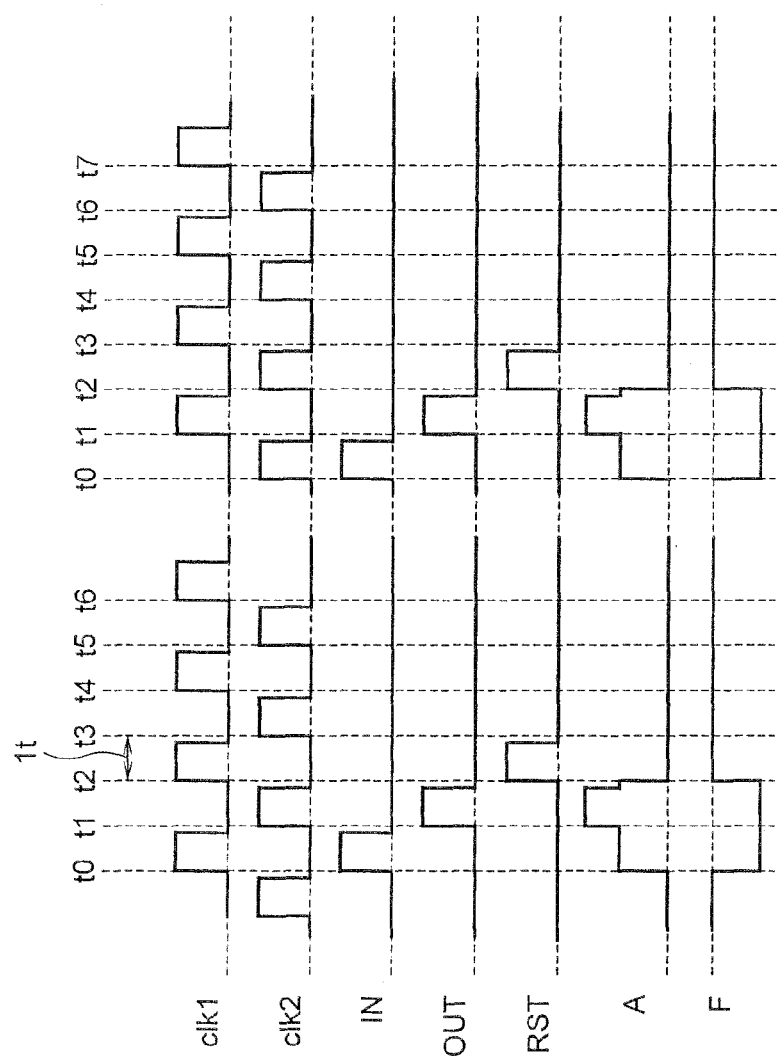
FIG. 33 is a timing chart for showing action of the conventional shift register shown in FIG. 32.

When the N-channel type transistor is used as in the conventional case shown in FIG. 28, the amplitude of the output signal OUT deteriorates when the high-level voltage decreases. If it is the case of the P-channel type transistor, inversely, the low-level voltage boosts up and the amplitude of the output signal OUT deteriorates. In the conventional case shown in FIG. 32, the transistors corresponding thereto are the transistors 21 and 24.

In the sixth embodiment, however, the output signal that is the voltage still lower than the low level from the node N1 of the preceding-stage shift register is inputted to the transistor Tr3, and a clock signal with the stable voltage-level is inputted to the transistor Tr11 from outside. Since the clock signal with the stable voltage-level is inputted from outside to the added transistor Tr11, it is possible to apply the stable voltage to the transistor Tr3 even when there is a change in the transistor characteristic (large threshold value Vt). Furthermore, since the gate voltage lower than the output signal OUT is applied to the transistor Tr3, the stable voltage supplied from the transistor Tr11 can be securely supplied to the gate of the transistor Tr7 even when there is a change in the transistor characteristic (large threshold value Vt). Therefore, it becomes possible to supply the lower voltage to the gate voltage of the transistor Tr7 compared to the circuit structures of the conventional case and the first embodiment, which is constituted with the transistors having the output signal as the input. Thus, it is possible to suppress deterioration in the amplitude of the output signal that is caused by the fluctuation of the transistor characteristic. As a result, the shift operation failure can be prevented even when the scanning circuit is formed therewith.

From the result of the circuit simulation, it was found that the circuit structure of the sixth embodiment allows the transistor to have the operation range that is extended by about 2V in terms of the threshold value (Vt) of the transistor compared to the circuit of the first embodiment, when the supply voltage (high level-low level) is 16V.

Further, the first-stage shift register SR1 according to the sixth embodiment may be modified as follows. Referring to FIG. 15, there is no preceding-stage shift register for the first-stage shift register SR1, so that there is not only the input terminal IN1 but also the input terminal IN2. Thus, the same vertical start pulse signal ST may be inputted to the two input terminals IN1 and IN2. The shift registers except for the first-stage shift register have the same connection as that of the shift register SR3 shown in FIG. 15, and the clock signals are switched to be inputted for every stage. Alternatively, a transistor may be inserted in series with respect to the transistor Tr4, and the clock signal CL2 and the output signal from the node N1 of the preceding-stage shift register may be inputted to the respective gate electrodes.

(Seventh Embodiment)

Figure 17:
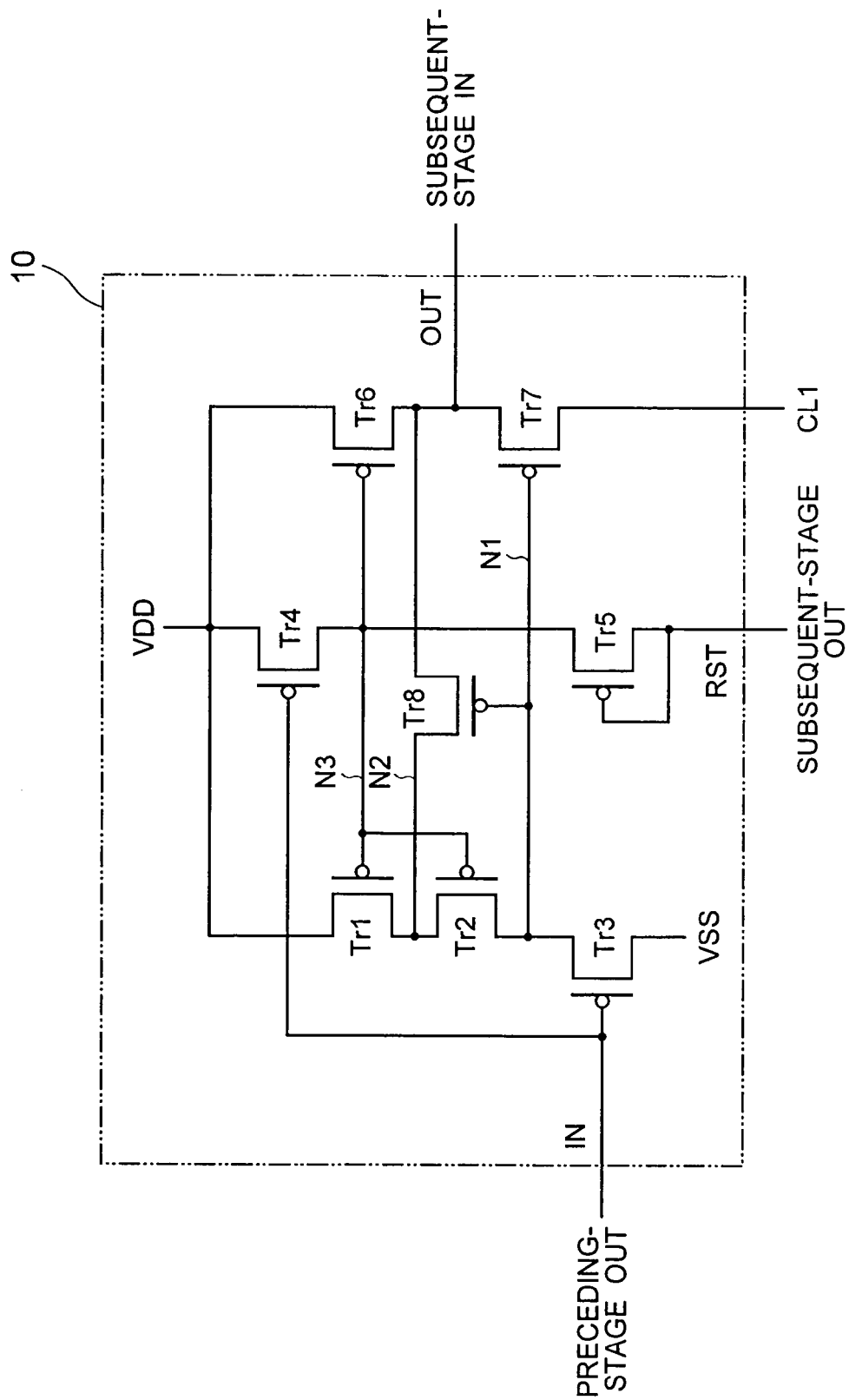
FIG. 17 is a circuit diagram for showing a shift register according to a seventh embodiment of the present invention.

Next, a seventh embodiment of the present invention will be described by referring to FIG. 17. The scanning circuit according to the seventh embodiment of the present invention is constituted by combining a plurality of shift registers as shown in FIG. 2. The scanning circuit according to the seventh embodiment of the present invention is operated according to the timing chart of FIG. 4. A shift register 10 according to the seventh embodiment of the present invention shown in FIG. 17 is in the circuit structure corresponding to the first-stage shift register SR1 in FIG. 2, which is built as the circuit structure in which the signal of the node N3 is inputted to the gate electrode of the transistor Tr6. The subsequent-stage shift registers SR2, SR3 . . . other than the first-stage shift register SR1 shown in FIG. 2 according to the seventh embodiment of the present invention are built as having the circuit structure shown in FIG. 6, except that the signals to be inputted are changed. In the shift register SR2, the output signal OUT1 outputted from the preceding-stage shift register SR1 is inputted to the input terminal IN instead of the vertical start pulse signal ST, and the clock signal CL2 is inputted instead of the clock signal CL1 while the clock signal CL1 is inputted instead of the clock signal CL2. In the shift registers SR3, SR4 . . . after the shift register SR2, the output signal OUT outputted from the preceding-stage shift register is inputted to the input terminal IN, and the clock signals are switched to be inputted for every stage.

In the shift register 10 according to the seventh embodiment shown in FIG. 17, the signal inputted to the gate electrode of the transistor Tr6 is different from that of the shift register 10 according to the first embodiment shown in FIG. 3. Therefore, action of the transistor Tr6 becomes different.

That is, in the first embodiment shown in FIG. 3, the clock signal CL2 is inputted to the gate electrode of the transistor Tr6. Therefore, the high-level output signal OUT is outputted when the clock signal CL2 is low level. However, the output signal OUT comes in a floating state when the clock signal CL2 is high level.

A liquid crystal display device has a structure in which liquid crystal is interposed between a glass substrate with transistors formed thereon and an opposing substrate to which a counter electrode is provided. Therefore, the counter electrode is connected through the capacitance to the output terminal of the shift register that outputs the output signal OUT to the gate line of the liquid crystal display device. Thus, when the output signal OUT from the shift register comes in a floating state as described above, fluctuation of the voltage of the counter electrode causes fluctuation of the voltage of the output signal OUT. Further, since there is a capacitance formed between the gate line and the source line of the liquid crystal display device, so that the voltage of the output signal OUT fluctuates also when the voltage of the source line fluctuates. When the voltage of the output signal OUT inputted to the gate line of the liquid crystal display device changes due to the voltage fluctuation of the counter electrode and the source line, the pixel transistor that is supposed to be nonconductive becomes conductive. Thus, unlawful signals are written to the pixel circuit so that proper display cannot be achieved.

In the seventh embodiment of the present invention shown in FIG. 17, however, the node N3 is connected to the gate electrode of the transistor Tr6. Thus, the transistor Tr6 keeps the conductive state from the time t3 to the next time t1 of the timing chart shown in FIG. 4, so that there is no floating of the output signal OUT. Therefore, in addition to the effect of the first embodiment, (bootstrap period of the node N1: from the time t2 to time t3), there is achieved an advantage that the floating of the output signal OUT can be prevented.

(Eighth Embodiment)

Next, an eighth embodiment of the present invention will be described by referring to FIG. 18. The scanning circuit according to the eighth embodiment of the present invention has the circuit structure shown in FIG. 2, which is operated according to the timing chart shown in FIG. 4.

Figure 18:
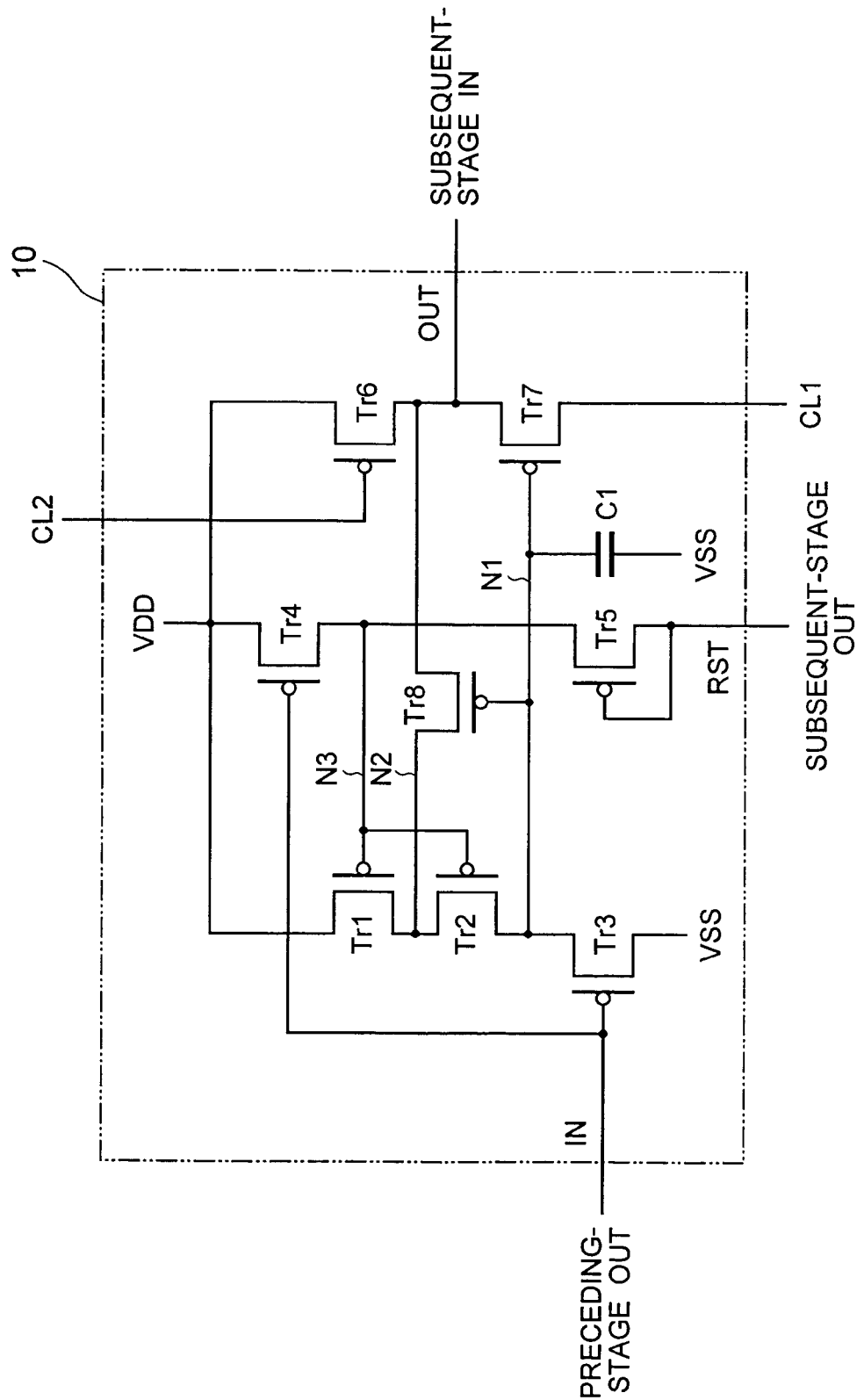
FIG. 18 is a circuit diagram for showing a shift register according to an eighth embodiment of the present invention.

A shift register 10 according to the eighth embodiment of the present invention shown in FIG. 18 is in the circuit structure corresponding to the first-stage shift register SR1 in FIG. 2, which is built as the circuit structure in which the capacitance C1 is connected to the gate electrode of the transistor Tr7 to which the signal of the node N3 is inputted. The subsequent-stage shift registers SR2, SR3 . . . other than the first-stage shift register SR1 shown in FIG. 2 are built as having the circuit structure shown in FIG. 18, except that the signals to be inputted are changed.

In the subsequent-stage shift register SR2, the output signal OUT1 outputted from the first-stage shift register SR1 is inputted to the input terminal IN instead of the vertical start pulse signal ST, and the clock signal CL2 is inputted instead of the clock signal CL1 while the clock signal CL1 is inputted instead of the clock signal CL2. In the shift registers SR3, SR4 . . . after the shift register SR2, the output signal OUT outputted from the preceding-stage shift register is inputted to the input terminal IN, and the clock signals are switched to be inputted for every stage.

When there is no capacitance C1 in FIG. 18, the gate capacitance between the gate electrodes of the transistors Tr7 and Tr8 is supplied to the node N1. In that case, at the time t2 where the voltage level of the clock signal CL1 changes from the high level to low level, the voltage of the node N1 becomes the voltage that is decreased from the voltage of VSS+Vt for the amount of (VDD−VSS)×Cg_Tr7/(Cg_Tr7+Cg_Tr8). "Cg_Tr7" is the gate capacitance of the transistor Tr7, and "Cg_Tr8" is the gate capacitance of the transistor Tr8. The transistor size (channel width) of the transistor Tr7 is larger than that of the transistor Tr8 by one digit or more, so that the gate capacitance of the transistor Tr7 is larger than that of the transistor Tr8. Thus, there decrease the voltage roughly for the amount of (VDD−VSS) so that a large voltage is applied between the gates and drains of the transistors Tr2 and Tr3 connected to the node N1.

In the meantime, when there is the capacitance C1 as shown in FIG. 18, at the same time, the voltage of the node N1 becomes the voltage that is decreased for the amount of (VDD−VSS)×Cg_Tr7/(C1+Cg_Tr7+Cg_Tr8) from the voltage of VSS+Vt. Since there is the capacitance C1, the change in the voltage can be reduced. Therefore, apply of a large voltage between the gates and drains of the transistors Tr2 and Tr3 can be suppressed. It is desirable to provide the capacitance C1 to such an extent that the circuit area be not expanded. In FIG. 18, the capacitance C1 is connected to the supply voltage VSS. However, it is not limited to this but may be connected to a power source other than VSS.

As described above, all the shift registers in each embodiment are constituted with the P-channel type transistors. However, the same circuit can be formed also by the N-channel type transistors. Further, it may be in a configuration where essential components of the first to eighth embodiments are combined.

(Ninth Embodiment)

Next, a ninth embodiment of the present invention will be described by referring to FIG. 19. The scanning circuit according to the ninth embodiment of the present invention is built as the circuit structure shown in FIG. 14, which is operated according to a timing chart shown in FIG. 20.

Figure 14:
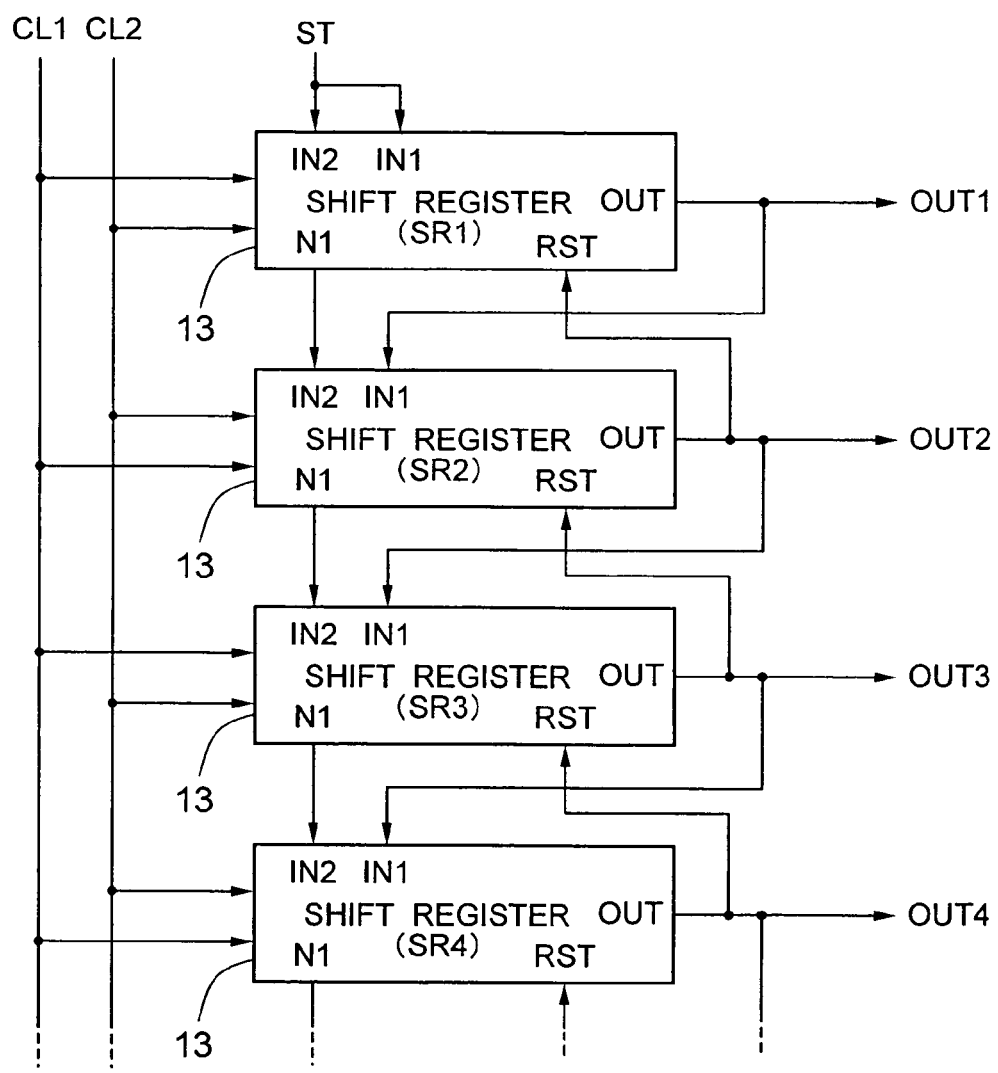
FIG. 14 is a block diagram for showing a scanning circuit according to a sixth embodiment of the present invention.
Figure 19:
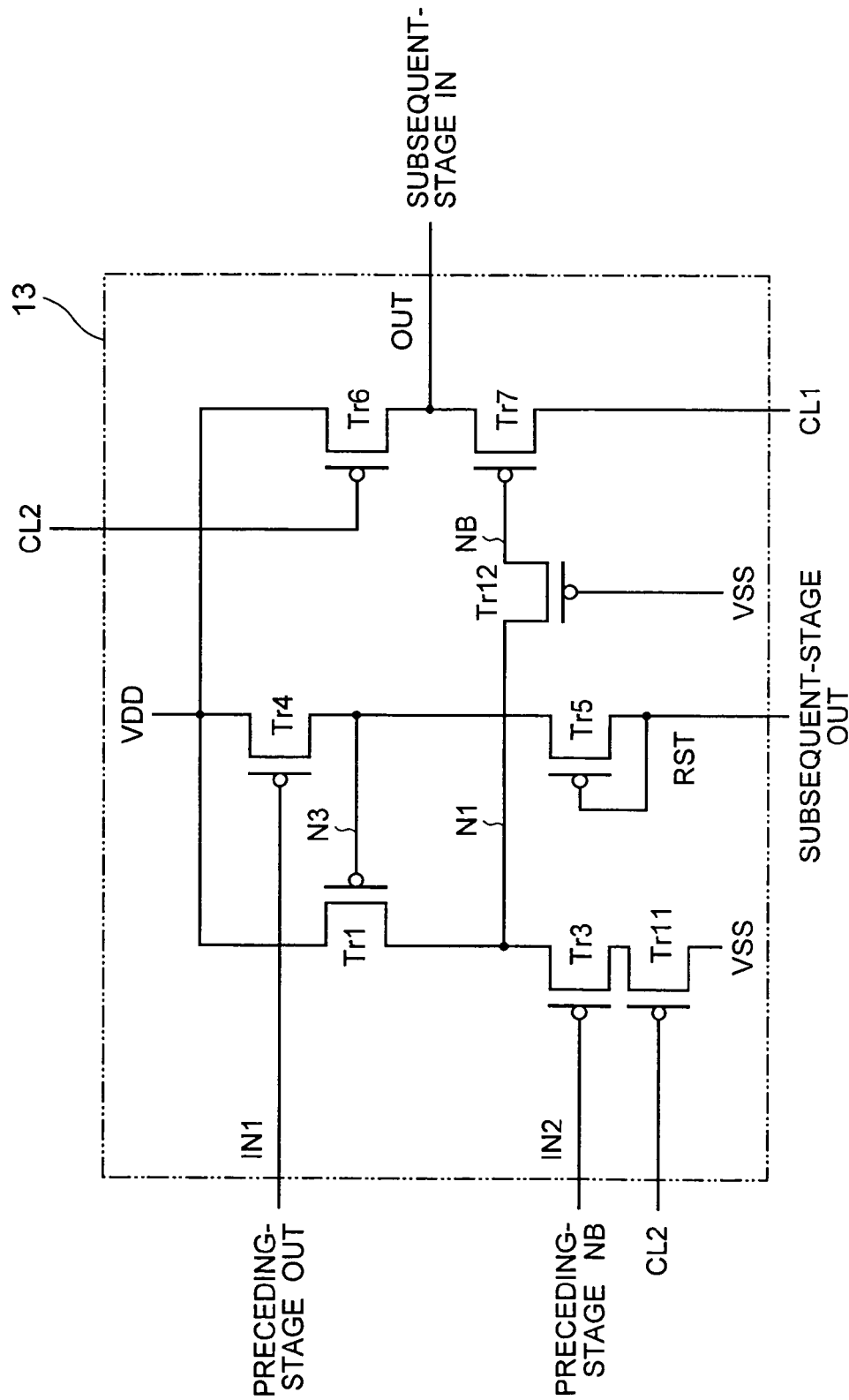
FIG. 19 is a circuit diagram for showing a shift register according to a ninth embodiment of the present invention.

A shift register 13 according to the ninth embodiment of the present invention shown in FIG. 19 has a circuit structure corresponding to the shift register SR3 of FIG. 14, in which the transistor Tr2 of FIG. 15 is eliminated, the transistor Tr12 is connected between the node N1 and a node NB connected to the gate electrode of the transistor Tr7, and the power source VSS is connected to the gate electrode of the transistor Tr12. Further, the signal of the node NB of the preceding-stage shift register SR2 is inputted to the gate electrode of the transistor Tr3 that is connected in series to the transistor Tr11, and the clock signal CL2 is inputted to the gate electrode of the transistor Tr11. Alternatively, the clock signal CL2 may be inputted to the gate electrode of the transistor Tr3 and the signal of the node NB of the preceding-stage shift register SR2 may be inputted to the gate electrode of the transistor Tr11.

Figure 20:
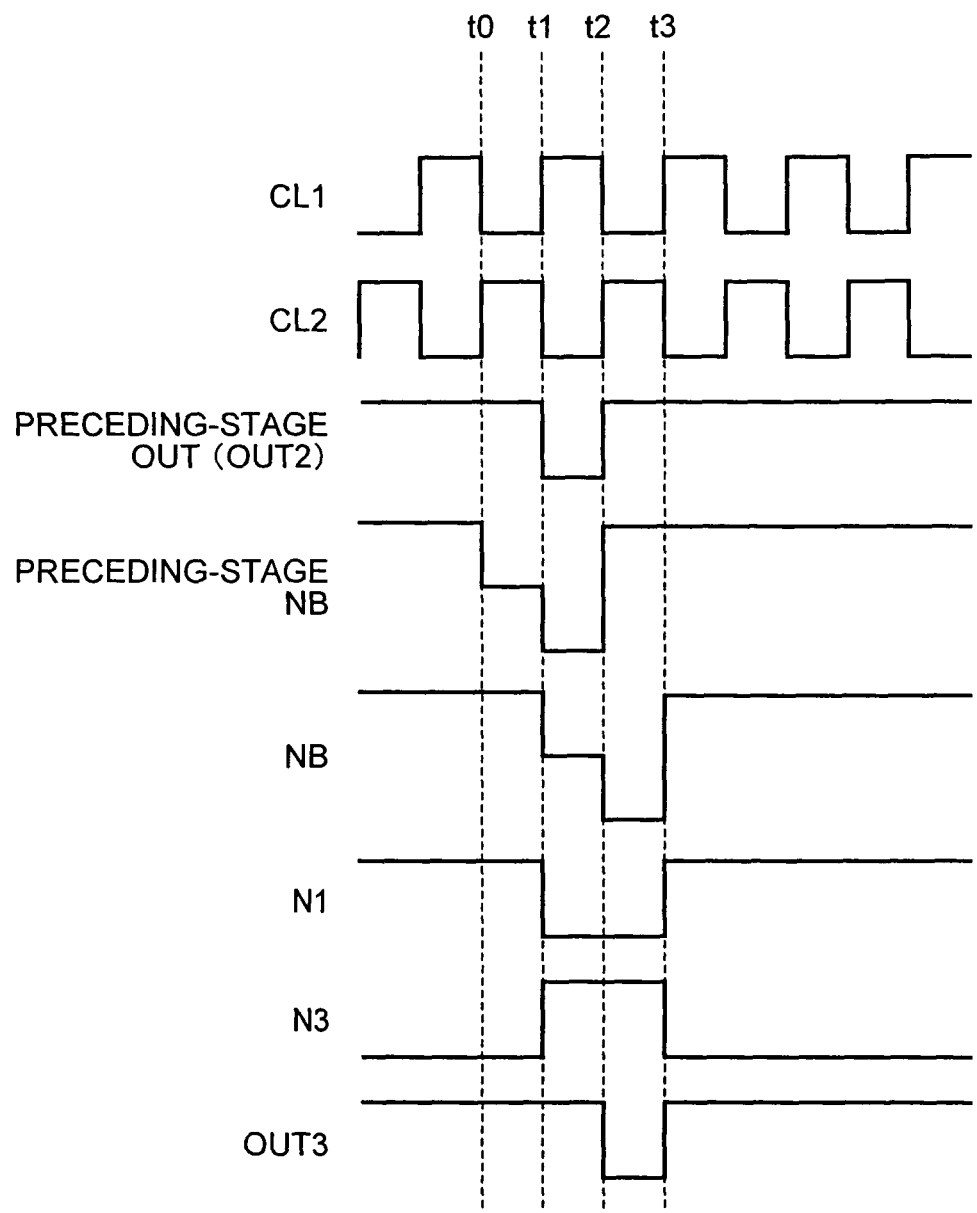
FIG. 20 is a timing chart for showing action of the shift register according to the ninth embodiment of the present invention.

Referring to FIG. 20, action of the shift register according to the ninth embodiment of the present invention shown in FIG. 19 will be described.

When the voltage of the node NB of the preceding-stage shift register SR2 becomes the voltage (VSS+Vt) that is boosted up from the low level for the amount of Vt at the timing t0 of FIG. 20, the transistor Tr3 becomes conductive. However, the transistor Tr11 is in the nonconductive state so that the voltage of the node N1 keeps the high level.

When reaching the time t1 thereafter, the clock signal CL2 becomes low level and the transistor Tr11 becomes conductive. With that, the transistor Tr3 and the transistor Tr12 also become conductive, so that the voltages of the node N1 and node NB become the voltage of VSS+Vt. In that state, the output signal OUT from the preceding-stage shift register SR2 is also low level. Thus, the transistor Tr4 becomes conductive, thereby changing the voltage of the node N3 from low level to high level. As a result, the transistor Tr1 changes to the nonconductive state.

When reaching the time t2 thereafter, the clock signal CL1 changes to low level. Since there are capacitances present in the gate-drain electrode and gate-source electrode of the transistor Tr7, the voltage of the node NB is decreased to a voltage that is still lower than VSS+Vt to be lower than the low-level voltage, due to the bootstrap effect through each of the capacitances. As a result, the voltage higher than the threshold voltage is applied between the gate and source of the transistor Tr7. Thus, the transistor Tr7 maintains the conductive state and outputs the low-level voltage of the clock signal CL1 as the output signal OUT3 from the shift register 10 (SR3). In that state, the transistor Tr12 becomes nonconductive. Thus, the node N1 is separated from the node NB, thereby receiving no influence of the bootstrap effect. Therefore, the node N1 keeps the voltage close to VSS+Vt.

When reaching the time t3 thereafter, the output signal OUT4 from the subsequent-stage shift register SR4 changes to low level. Thereby, the transistor Tr5 becomes conductive, and the voltage of the node N3 changes from the high level to the voltage, VSS+Vt, which is boosted up from the low-level for the amount of Vt. As a result, the transistor Tr1 becomes conductive, and the voltage of the node N1 changes from the low level to high level. Further, the transistor Tr12 also becomes conductive, so that the voltage of the node NB changes to high level as well. Since the voltage difference between the gate and source of the transistor Tr7 becomes zero, the transistor Tr7 is made nonconductive.

After the time t3, the clock signal CL2 is inputted to the transistor Tr6 at a constant cycle so that the output signal OUT3 from the shift register 13 (SR3) keeps the high level. Further, the voltage of the node N3 keeps the VSS+Vt voltage by the gate capacitance of the transistor Tr1 until the next time t1, so that the transistor Tr1 maintains the conductive state. As a result, the voltages of the node N1 and node NB stay at high level from the time t3 to the next time t1. Thus, the voltage between the gate and source of the transistor Tr7 becomes zero, so that the transistor Tr7 is made nonconductive.

In the ninth embodiment of the present invention, the node to be bootstrapped is the node NB, which is different from the node N1 that is connected to the transistor Tr1 and the transistor Tr3. Therefore, although the voltage of the node NB is decreased to the voltage below the low level due to the bootstrap effect, the voltage of the node N1 is not decreased to that extent since it is not affected by the bootstrap.

In the ninth embodiment, the node NB and the node N1 are separated by the transistor Tr12. Thus, not only the voltage applied between the sources and the drains of the transistors Tr1 and Tr3 but also the voltage applied between the gates and drains, and between the gates and sources become below the supply voltage. Therefore, the voltage applied between the gates and drains or the gates and sources of the transistors is decreased compared to that of the sixth embodiment. As a result, deterioration of the transistors over time can be suppressed compared to the case of the sixth embodiment, and it becomes possible to constitute the highly reliable circuit.

The ninth embodiment of the present invention shown in FIG. 19 is also constituted with the transistor Tr3 having the bootstrap node NB of the preceding-stage shift register as the input and the transistor Tr11 having the clock signal as the input. Thus, as the case of the sixth embodiment, there is achieved such effect that it is not susceptible to the fluctuation of the transistor characteristic.

It is also possible to have a configuration in which the essential components of the ninth embodiment, second embodiment, fifth embodiment, seventh embodiment or the eighth embodiment are combined.

(Tenth Embodiment)

Figure 21:
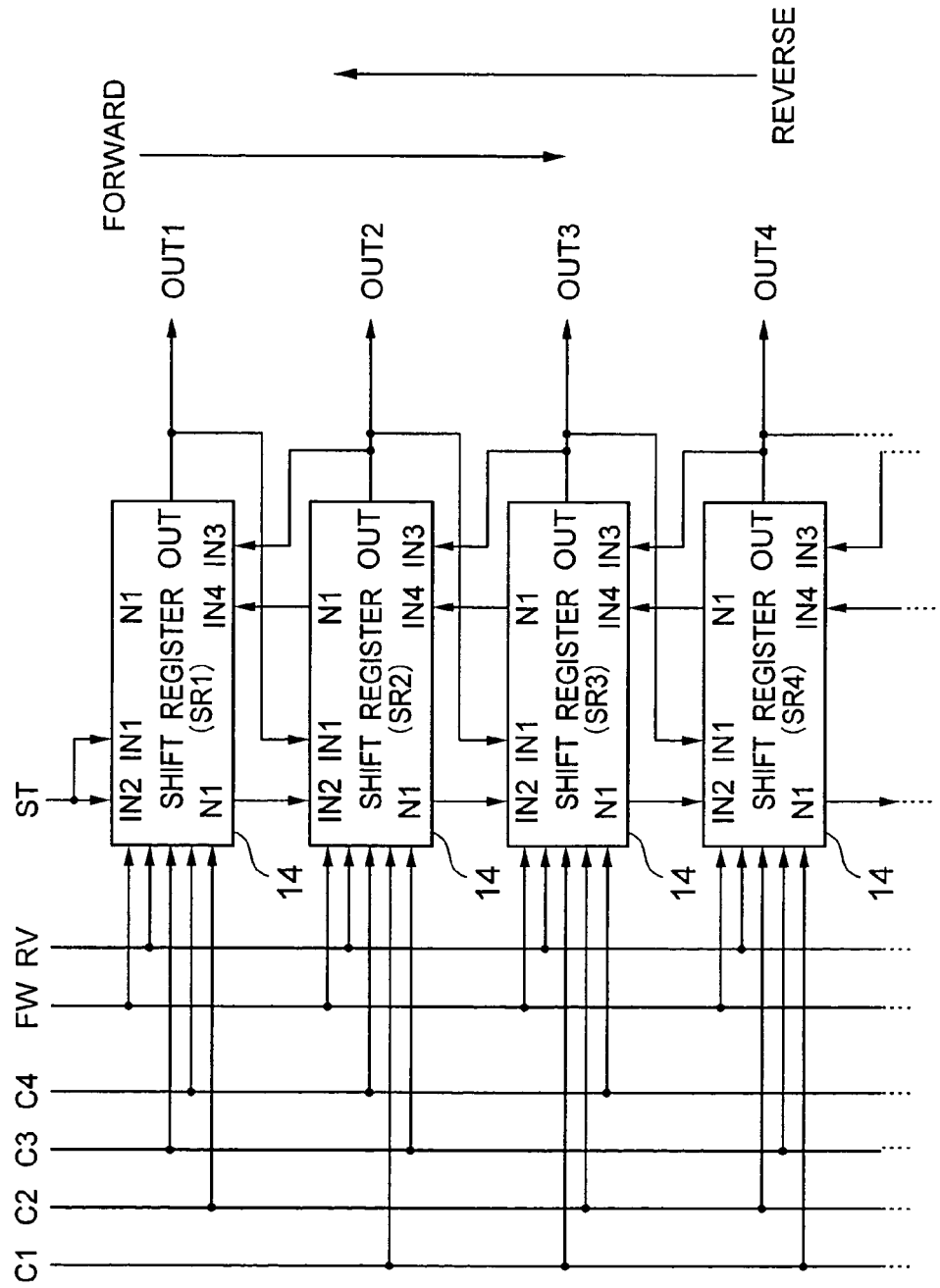
FIG. 21 is a block diagram for showing a scanning circuit according to a tenth embodiment of the present invention.

Next, a tenth embodiment of the present invention will be described by referring to FIG. 21 and FIG. 22. As shown in FIG. 21, the scanning circuit according to the tenth embodiment of the present invention is constituted by combining a plurality of shift registers 14, and uses four clock signals like the fifth embodiment. At the same time, it is built as a configuration which outputs scanning output signals OUT1, OUT2 . . . in two directions, the forward and reverse directions. Among the shift registers 14 constituting the scanning circuit according to the tenth embodiment of the present invention, the shift register SR3 (14) will be described as an example by referring to FIG. 22.

Figure 22:
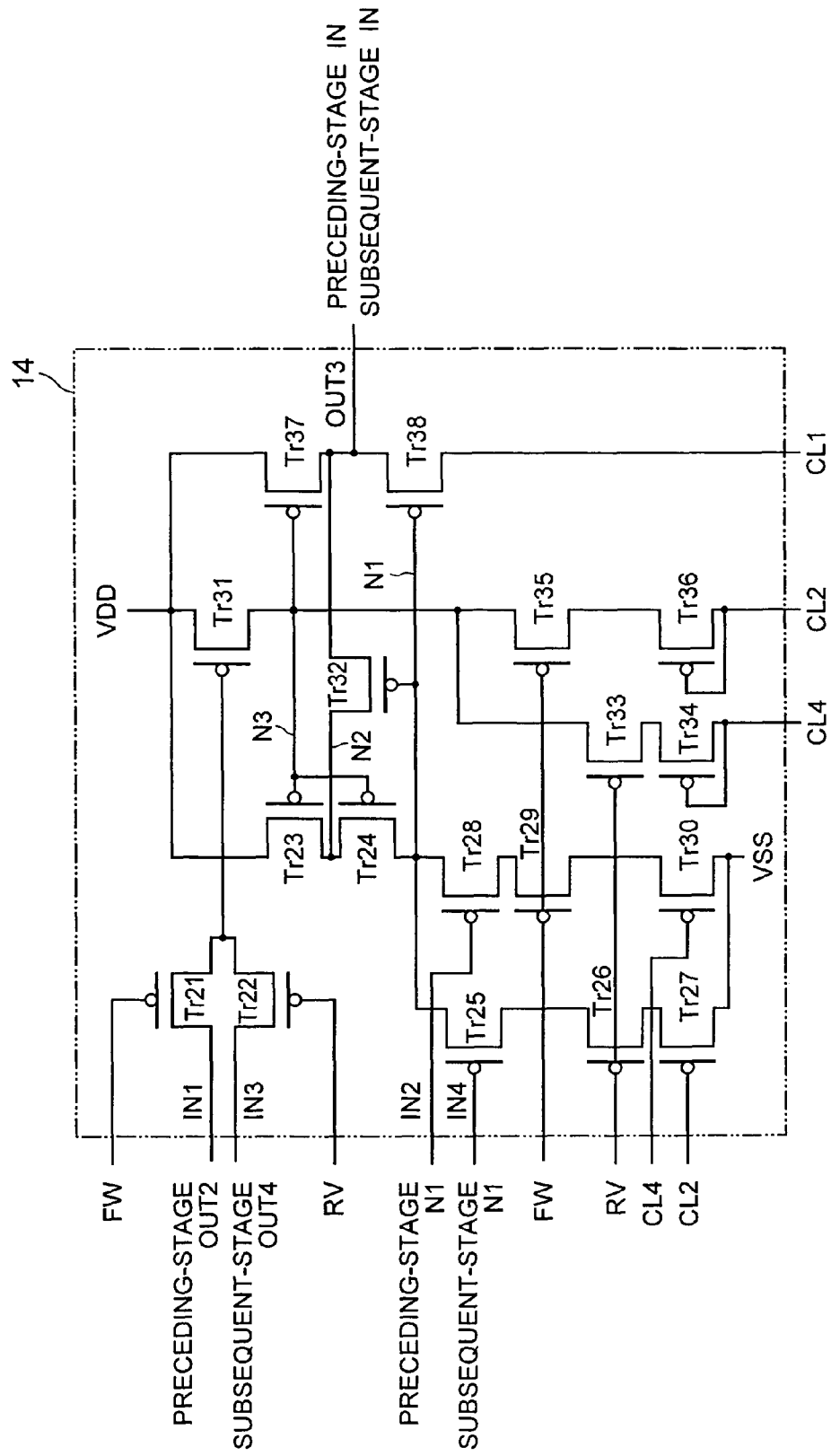
FIG. 22 is a circuit diagram for showing a shift register according to the tenth embodiment of the present invention.

In FIG. 22, when the FW signal and the RV signal with the stable voltage level are inputted from outside to the gate electrodes of the transistors Tr21 and Tr22, the transistors TR21 and Tr22 select the output signal OUT2 outputted from the preceding-stage shift register SR2 for the forward direction and select the output signal OUT4 outputted from the subsequent-stage shift register SR4 for the reverse direction, and the selected signal is inputted to the gate electrode of the transistor Tr31. Similarly, when the FW signal and the RV signal are inputted to the transistors Tr29 and Tr26, the transistors Tr29 and Tr26 drive the circuits on the transistors Tr28, Tr29, Tr30 side for the forward direction, and drive the circuits on the transistors Tr25, Tr26, Tr27 side for the reverse direction. Similarly, when the FW signal and the RV signal are inputted to the gate electrodes of the transistors Tr35 and Tr33, the transistors Tr35 and Tr33 drive the circuits on the transistors Tr35, Tr36 side for the forward direction, and drive the circuits on the transistors Tr33, Tr34 side for the reverse direction.

Figure 23A:
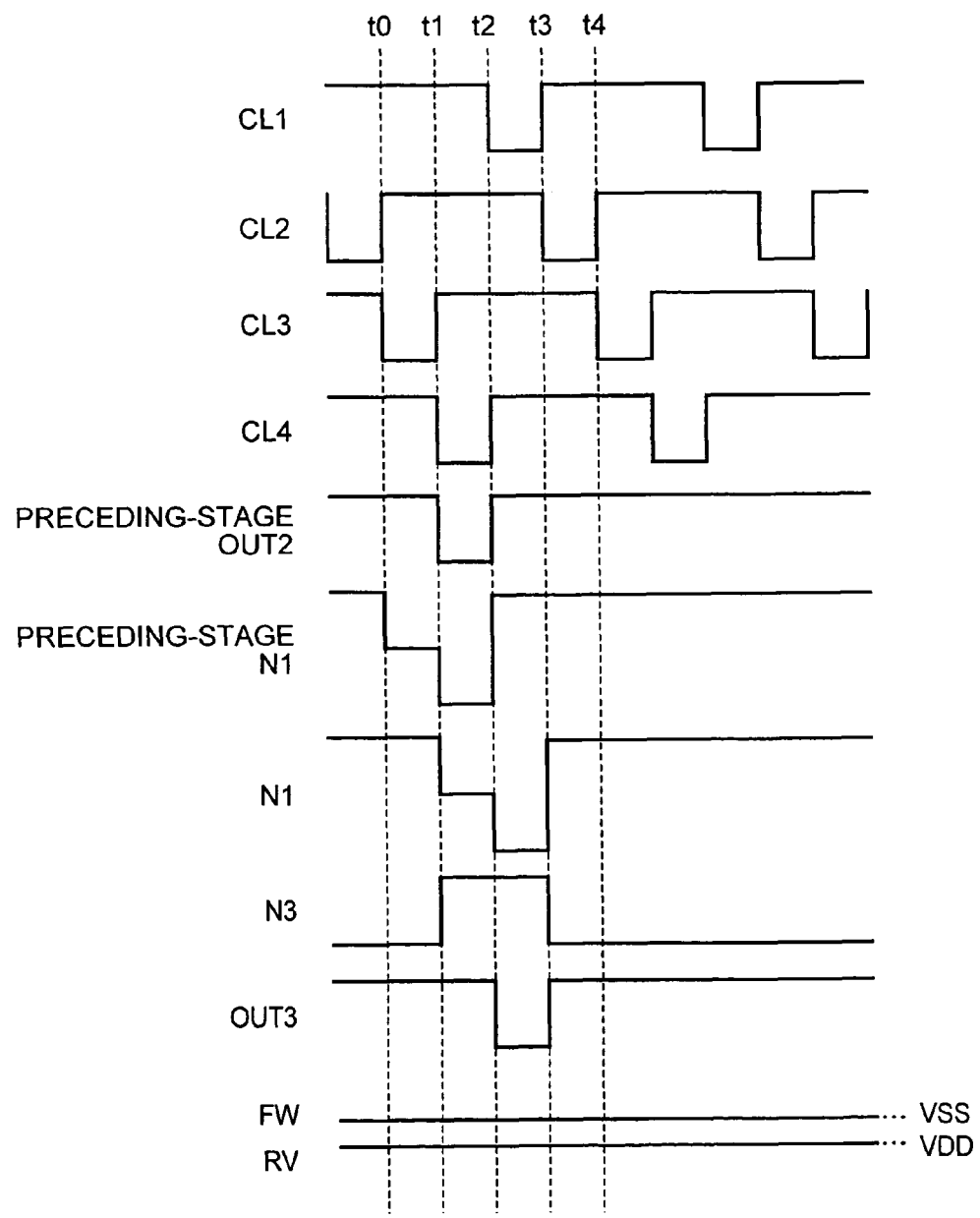
FIG. 23A is a timing chart for showing action of the shift register according to the tenth embodiment of the present invention.
Figure 23B:
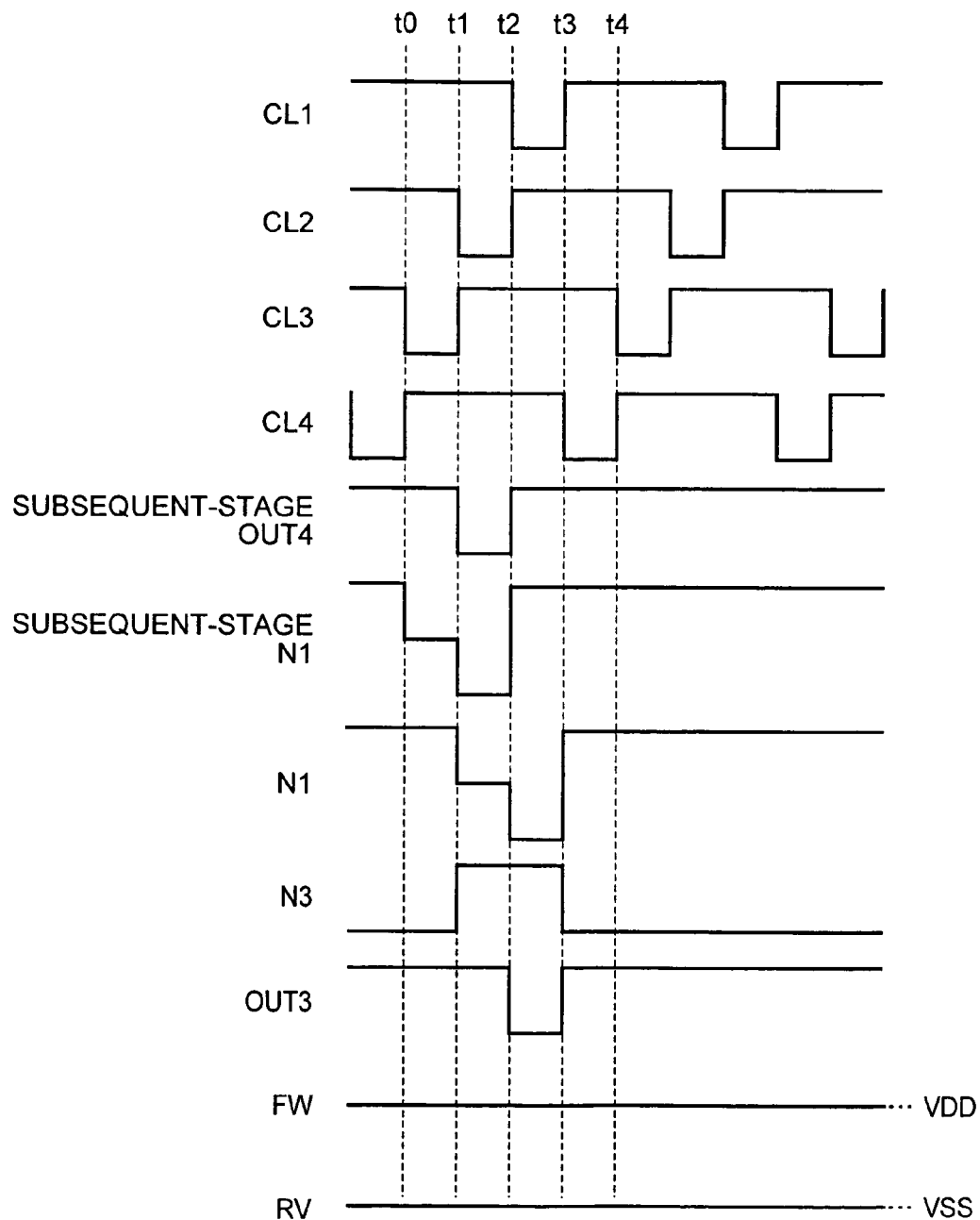
FIG. 23B is a timing chart for showing action of the shift register according to the tenth embodiment of the present invention.

FIG. 23A shows a timing chart of the forward scanning, and FIG. 23B shows a timing chart of the reverse scanning. Direction control is carried out by both of the FW and RV signals. As shown in FIG. 23A and FIG. 23B, the FW signal is set as low level and the RV signal as high level when scanning in the forward direction, whereas the FW signal is set as high level and the RV signal as low level when scanning in the reverse direction.

First, action of the shift register in the case of scanning in the forward direction will be described by referring to FIG. 23A.

When the voltage of the node N1 of the preceding-stage shift register SR2 becomes the voltage (VSS+Vt) that is boosted up from the low level for the amount of Vt at the time t0, the transistor Tr28 of the shift register 14 shown in FIG. 22 becomes conductive and the transistor Tr29 becomes conductive as well. However, the clock signal CL4 is high level, so that the transistor Tr30 becomes nonconductive and the voltage of the node N1 stays at high level.

When reaching the time t1 thereafter, the clock signal CL4 becomes low level and the transistor Tr30 becomes conductive. With that, the transistor Tr28 and the transistor Tr29 are made conductive, so that the voltage of the node N1 becomes the voltage of VSS+Vt. In that state, the output signal OUT from the preceding-stage shift register SR2 is low level. Thus, the voltage that is boosted up for the amount of Vt from the low level is inputted to the gate electrode of the transistor Tr31 through the transistor Tr21, and the transistor Tr31 becomes conductive. As a result, the voltage of the node N3 is changed from the voltage that is boosted up from the low level for the amount of Vt to high level. Thus, the transistors Tr23 and Tr24 turn to the nonconductive state.

When reaching the time t2 thereafter, the clock signal CL1 changes to low level. Since there are capacitances present in the gate-drain electrode and gate-source electrode of the transistor Tr38, the voltage of the node N1 is decreased to a voltage that is still lower than VSS+Vt to be lower than the low-level voltage, due to the bootstrap effect through each of the capacitances. As a result, the voltage higher than the threshold voltage is applied between the gate and source of the transistor Tr38. Thus, the transistor Tr38 maintains the conductive state and outputs the low-level clock signal CL1 as the output signal OUT3. In that state, the transistor Tr32 is made conductive, and the output signal OUT3 is supplied to the node N2. Thus, even if the voltage of the node N1 becomes still lower than the low-level voltage, the voltage applied between the sources and drains of the transistors Tr23 and Tr24 becomes the voltage below the supply voltage (=difference between the high-level and low-level voltages).

When reaching the time t3 thereafter, the clock signal CL2 changes to low level and the transistor Tr36 becomes conductive. Since the transistor Tr35 is conductive, the voltage of the node N3 changes from the high level to the voltage, VSS+Vt, which is boosted up from the low-level for the amount of Vt. As a result, the transistors Tr23 and Tr24 become conductive, and the voltage of the node N1 changes to high level. Thus, voltage difference between the gate and source of the transistor Tr38 becomes zero and the transistor Tr38 becomes nonconductive. In that state, the voltage of the node N3 is VSS+Vt so that the transistor Tr37 becomes conductive, thereby outputting high-level output signal OUT3.

After the time t3, the voltage of VSS+Vt is supplied to the node N3 every time the clock signal CL2 becomes low level, and the voltage of the node N3 is maintained at the voltage of VSS+Vt until the next time t1. As a result, the transistors Tr23, Tr24, Tr37 keep the conductive state and the voltage of the node N1 keeps the high level. Therefore, the transistor Tr38 maintains the nonconductive state.

There has been described by referring to the action of the shift register SR3, however, the same action is also executed in all the shift registers other than the shift registers SR3 except that that the signal to be inputted are different. In the next stage with respect to the scanning direction, there may be inputted a clock signal whose phase is advanced by one to the transistors Tr30, Tr36, Tr38, respectively, according to the timing chart of FIG. 23A. Thereby, the output signals OUT are outputted in order in the forward direction while being phase-shifted (scan).

In the reverse scanning, the relation of phases of the clock signals CL1-CL4 becomes different, in which the output signal OUT from the subsequent-stage shift register becomes the input and the output signal OUT of itself is outputted to the preceding-stage shift register.

Now, action of the shift register at the time of the reverse scanning will be described by referring to FIG. 23B.

When the voltage of the node N1 of the subsequent-stage shift register becomes the voltage (VSS+Vt) that is boosted up from the low level for the amount of Vt at the time t0, the transistor Tr25 becomes conductive and the transistor Tr26 becomes conductive as well. However, the clock signal CL2 is high level, so that the transistor Tr27 becomes nonconductive and the voltage of the node N1 stays at high level.

When reaching the time t1 thereafter, the clock signal CL2 becomes low level and the transistor Tr27 becomes conductive. With that, the transistor Tr25 and the transistor Tr26 are made conductive, so that the voltage of the node N1 becomes the voltage of VSS+Vt. In that state, the output signal OUT from the subsequent-stage shift register is also low level. Thus, the voltage that is boosted up for the amount of Vt from the low level is inputted to the gate electrode of the transistor Tr31 through the transistor Tr22, and the transistor Tr31 becomes conductive. As a result, the voltage of the node N3 is changed from the voltage that is boosted up from the low level for the amount of Vt to high level. Thus, the transistors Tr23 and Tr24 turn to the nonconductive state.

When reaching the time t2 thereafter, the clock signal CL1 changes to low level. Since there are capacitances present in the gate-drain electrode and gate-source electrode of the transistor Tr38, the voltage of the node N1 is decreased to a voltage that is still lower than VSS+Vt to be lower than the low-level voltage, due to the bootstrap effect through each of the capacitances. As a result, the voltage higher than the threshold voltage is applied between the gate and source of the transistor Tr38. Thus, the transistor Tr38 maintains the conductive state and outputs the low-level clock signal CL1 as the output signal OUT3. In that state, the transistor Tr32 is made conductive, and the output signal OUT3 is supplied to the node N2. Thus, even if the voltage of the node N1 becomes still lower than the low-level voltage, the voltage applied between the source and drain of the transistors Tr23 and Tr24 becomes the voltage below the supply voltage (=difference between the high-level and low-level voltages).

When reaching the time t3 thereafter, the clock signal CL4 changes to low level so that the transistor Tr34 becomes conductive and the transistor Tr33 is made conductive. Thus, the voltage of the node N3 changes from the high level to the voltage, VSS+Vt, which is boosted up from the low-level for the amount of Vt. As a result, the transistors Tr23 and Tr24 become conductive, and the voltage of the node N1 changes to high level. Thus, voltage difference between the gate and source of the transistor Tr38 becomes zero and the transistor Tr38 becomes nonconductive. In that state, the voltage of the node N3 is VSS+Vt so that the transistor Tr37 becomes conductive, thereby outputting high-level output signal OUT3.

After the time t3, the voltage of VSS+Vt is supplied to the node N3 every time the clock signal CL4 becomes low level, and the voltage of the node N3 is maintained at the voltage of VSS+Vt until the next time t1. As a result, the transistors Tr23, Tr24, Tr37 keep the conductive state and the voltage of the node N1 keeps the high level. Therefore, the transistor Tr38 maintains the nonconductive state.

There has been described by referring to the action of the shift register SR3, however, the same action is also executed in all the shift registers other than the shift registers SR3 except that the signal to be inputted are different. In the next stage with respect to the scanning direction, there may be inputted a clock signal whose phase is advanced by one to the transistors Tr27, Tr34, Tr38 according to the timing chart of FIG. 23B. Thereby, the output signals OUT are outputted in order in the reverse direction while being phase-shifted (scan).

The tenth embodiment shown in FIG. 22 is constituted with the transistor Tr25 or the transistor Tr28 having the signal of the bootstrap node N1 as the input and the transistor Tr27 or Tr30 having the clock signal as the input. Thus, it is possible to achieve the same effect as that of the sixth embodiment.

It is also possible to have a configuration in which the tenth embodiment is combined with the essential components of the first to eighth embodiments.

(Eleventh Embodiment)

Figure 24:
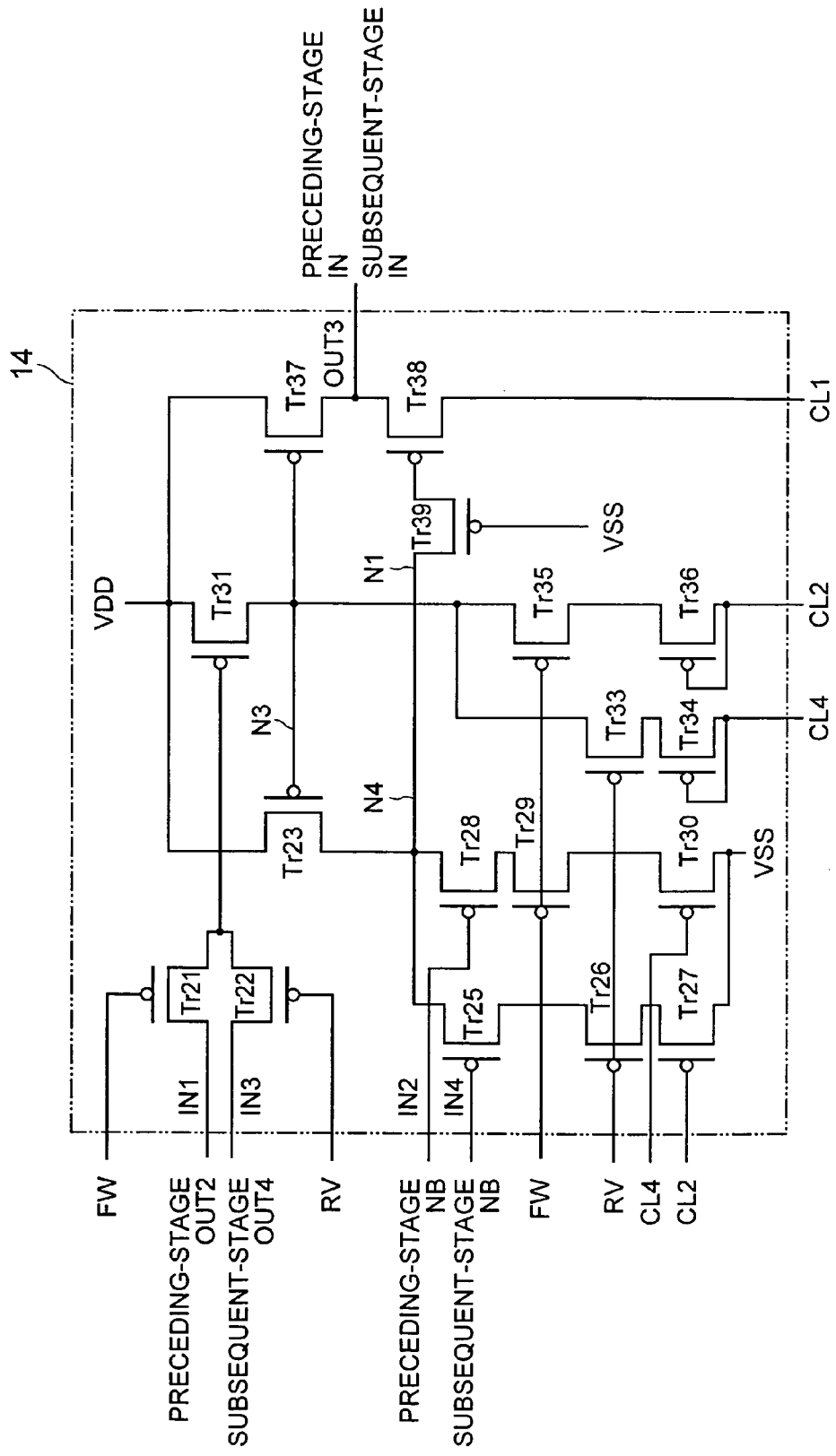
FIG. 24 is a circuit diagram for showing a shift register according to an eleventh embodiment of the present invention.

Next, an eleventh embodiment of the present invention will be described by referring to FIG. 24. The scanning circuit according to the eleventh embodiment of the present invention is built as the circuit structure shown in FIG. 21, which is formed to output the scanning output signals in both the forward and reverse directions as in the case of the tenth embodiment.

Among the shift registers 14 constituting the scanning circuit according to the eleventh embodiment of the present invention, the shift register SR3 (14) will be described by way of example by referring to FIG. 24. The shift register 14 of FIG. 24 according to the eleventh embodiment of the present invention is different from that of the tenth embodiment in respect that the transistor Tr24 of the tenth embodiment shown in FIG. 22 is eliminated and the transistor Tr39 is added, which is similar to the case where the sixth embodiment is modified to the ninth embodiment.

Therefore, the shift register 14 according to the eleventh embodiment of the present invention exhibits the effect described in the ninth embodiment, in addition to having the function of bidirectional scanning.

Figure 25:
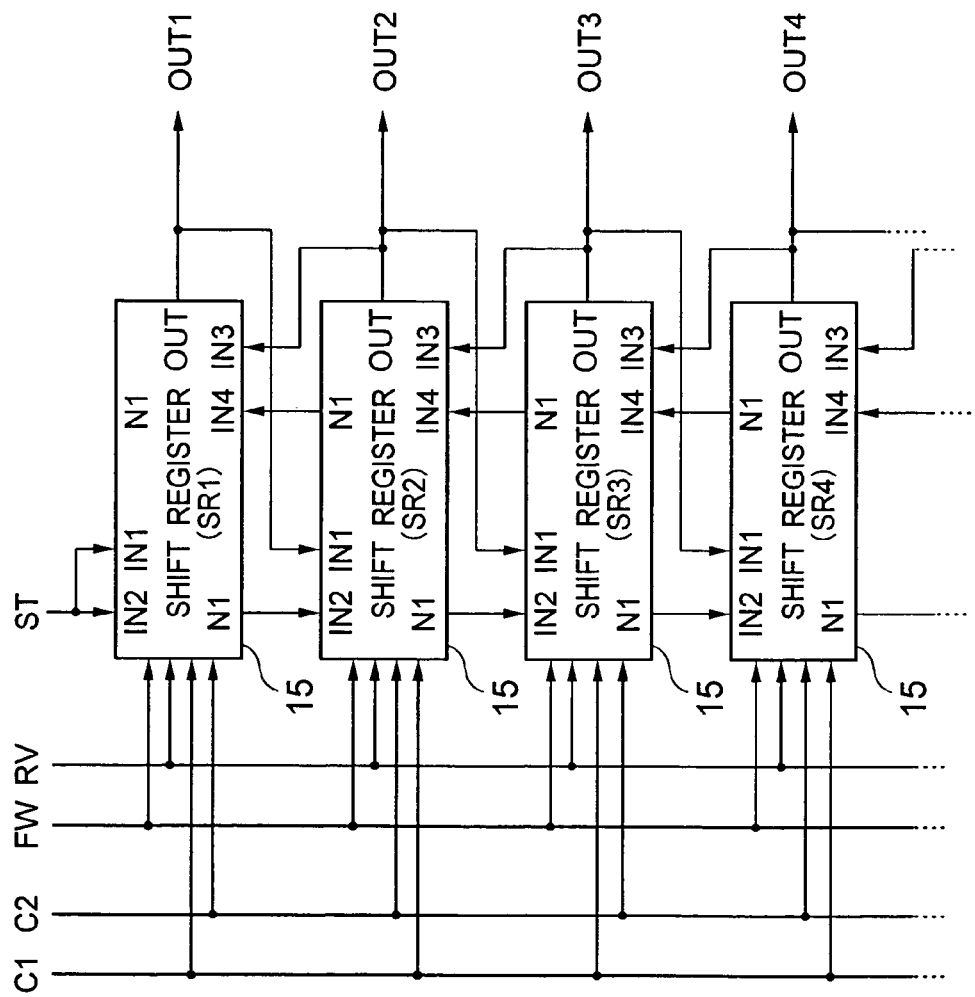
FIG. 25 is a block diagram for showing a scanning circuit according to a modification example of the eleventh embodiment of the present invention.
Figure 26:
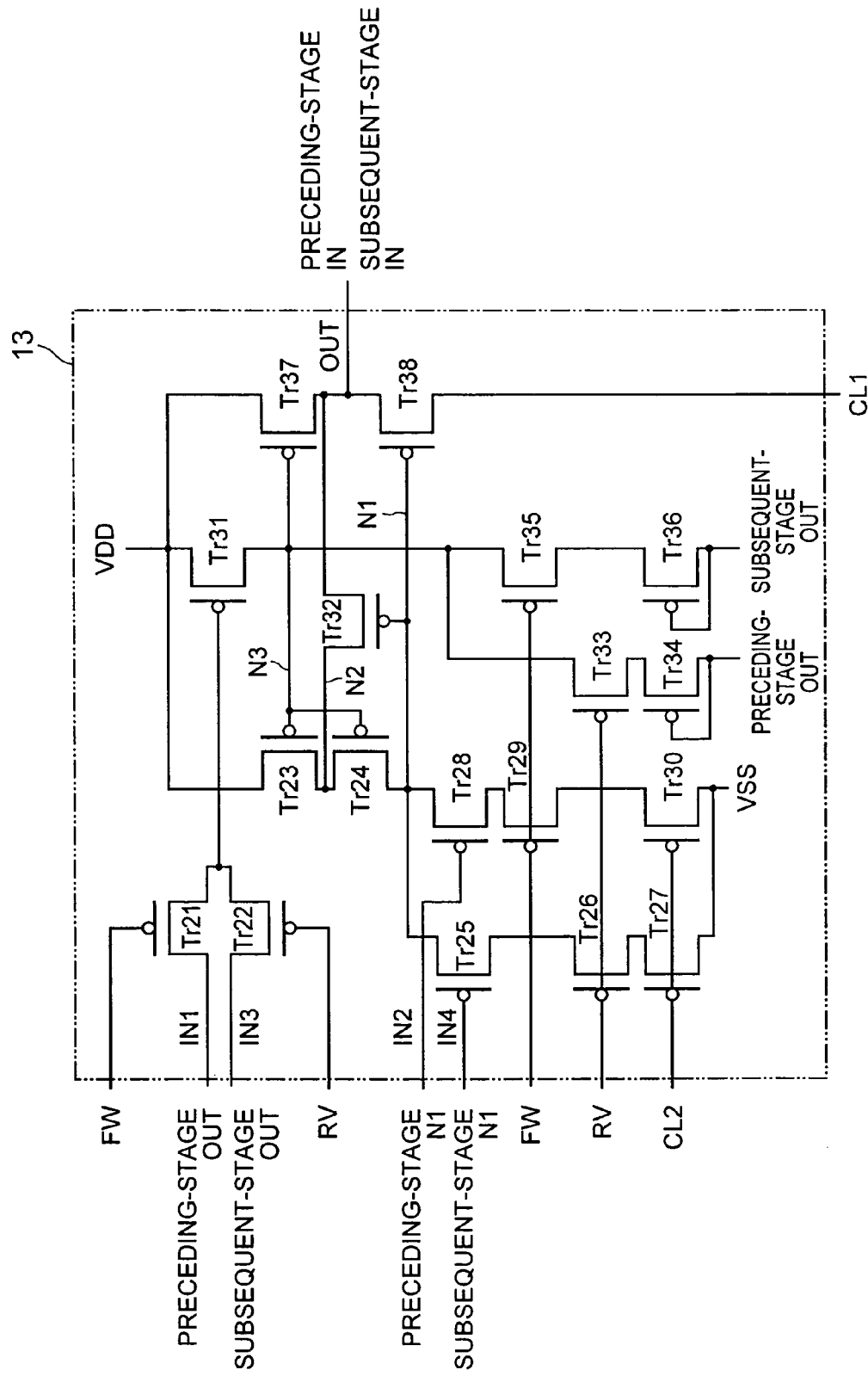
FIG. 26 is a circuit diagram for showing a shift register according to a modification example of the eleventh embodiment of the present invention.
Figure 27:
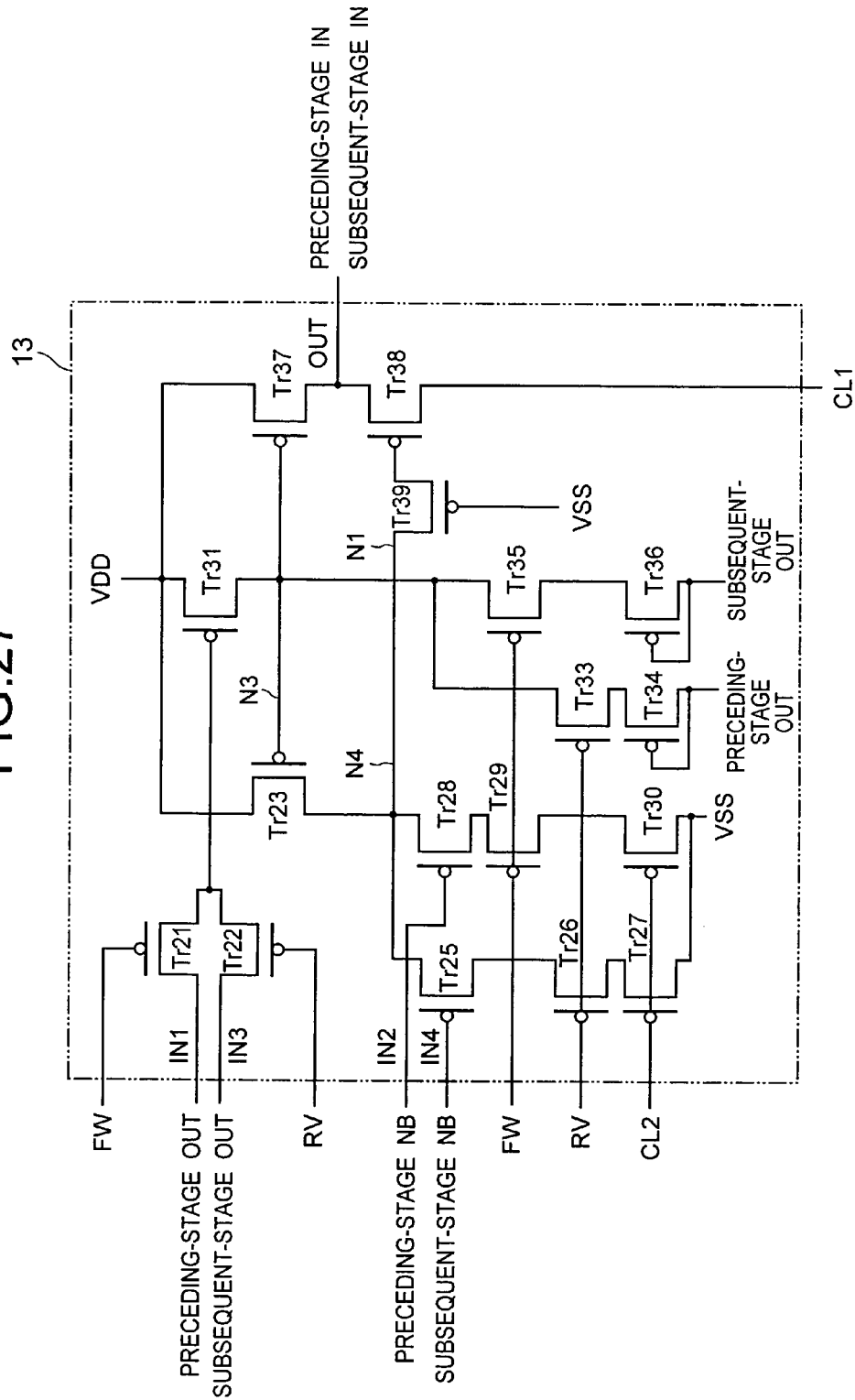
FIG. 27 is a circuit diagram for showing a shift register according to a modification example of the eleventh embodiment of the present invention.

It may be in a configuration in which the eleventh embodiment and the essential components of the second, fifth, seventh and eighth embodiments are combined. Further, the tenth and eleventh embodiments have been described by referring to the case where the four clock signals are used. However, five or more clock signals may be used or three clock signals may be used as well. Furthermore, it may be formed to use two clock signals. When using two clock signals in the shift register of the tenth embodiment, it may be formed as the circuit structure shown in FIG. 26. When using two clock signals in the shift register of the eleventh embodiment, it may be formed as the circuit structure shown in FIG. 27. The scanning circuits using the shift registers of FIG. 26 of FIG. 27 have the circuit structure of FIG. 25.

Each of the embodiments described above allows reduction of power consumption as an advantage, since there is no electric current flown from the positive power source (high level) side to the negative power source (low level) side through the transistors.

The preferred embodiments have been described above, however, the present invention is not intended to be limited to those and various modifications are possible within the broad scope of the present invention. For example, although all the shift registers in each embodiment are constituted with the P-channel type transistors, the same circuit can also be constituted with the N-channel type transistor. Furthermore, a transistor may be provided additionally for forming a structure which carries out the same operation.

With the present invention as described above, it is not necessary for the gate electrode of the output transistor to have the holding capacitor with a large capacity, and there is no electric current frown from the positive power source (high level) side to the negative power source (low level) side through the transistor. Therefore, the power consumption can be reduced. As a result, when applying the shift register of the present invention to a display device, power consumption of the device can be reduced.

What is claimed is:

1. A shift register, comprising:
   a bootstrap circuit that applies an ON-voltage that is out of a range from an upper limit to a lower limit of a supply voltage to a gate of an output transistor by utilizing capacitance between the gate and a drain of the output transistor, provided that a gate voltage at which a transistor becomes ON is the ON-voltage and a gate voltage at which the transistor becomes OFF is an OFF-voltage; and
   a first input transistor with a gate to which the ON-voltage out of the range from the upper limit to the lower limit of the supply voltage is applied;
   a second input transistor with a gate to which a clock signal is inputted; and
   a control device including first-third control transistors;
   wherein:
   the first input transistor and the second input transistor are connected in series, and
   the ON-voltage that is out of a range from an upper limit to a lower limit of a supply voltage is applied to the gate of the output transistor of own stage after both of the first and second input transistors became ON; and
   a data signal is inputted from a preceding-stage shift register and the data signal is outputted with a specific delay from the output transistor to a subsequent stage, the data signal is constituted with signals of first-level and second-level voltages, wherein the output transistor outputs the second-level voltage when the ON-voltage out of the range from the upper limit to the lower limit of the supply voltage is applied to the gate of the output transistor and wherein
   the second control transistor becomes ON when the data signal inputted to a gate of the second control transistor from the preceding-stage shift register is the second-level voltage and applies the OFF-voltage to a gate of the first control transistor, whereas the second control transistor becomes OFF when the data signal inputted to the gate of the second control transistor from the preceding-stage shift register is the first-level voltage and maintains the OFF-voltage or the ON-voltage applied to the gate of the first control transistor;
   the third control transistor becomes ON when a signal inputted to a gate of the third control transistor is the second-level voltage and applies the ON-voltage to the gate of the first control transistor, whereas the third control transistor becomes OFF when the signal inputted to the gate of the third control transistor is the first-level voltage and maintains the OFF-voltage or the ON-voltage applied to the gate of the first control transistor; and
   the first control transistor becomes ON when the ON-voltage is applied to the gate of the first control transistor and applies the OFF-voltage to the gate of the output transistor, whereas the first control transistor becomes OFF when the OFF-voltage is applied to the gate of the first control transistor and maintains the OFF-voltage or the ON-voltage that is out of a range from an upper limit to a lower limit of a supply voltage is applied to the gate of the output transistor,
   wherein the first input transistor, the second input transistor, the output transistor and the first-third control transistors are in a same stage of the shift register.

2. The shift register as claimed in claim 1, wherein:
   the first control transistor is constituted with a plurality of transistors whose sources and drains are connected in series; and
   the control device further comprises a fourth control transistor, wherein the fourth control transistor is set ON simultaneously with the output transistor for applying a voltage within the range from the upper limit to the lower limit of the supply voltage to a node of the plurality of the transistors.

3. The shift register as claimed in claim 1, wherein the output transistor is constituted with a plurality of transistors which output a signal of the second-level voltage when the ON-voltage out of the range of the supply voltage is applied.

4. The shift register as claimed in claim 1, wherein:
   the first control transistor is constituted with a plurality of transistors whose sources and drains are connected in series; and
   the node of the plurality of the transistors is connected to an output terminal of the output transistor from which the data signal is outputted.

5. The shift register as claimed in claim 1, further comprising, when the output transistor is a first output transistor, a second output transistor whose source and drain are connected in series to the first output transistor, wherein:
   the second control transistor becomes ON when the data signal inputted from the preceding-stage shift register is the second-level voltage and applies the OFF-voltage to the second output transistor, whereas the second control transistor becomes OFF when the data signal inputted from the preceding-stage shift register is the first-level voltage and maintains the OFF-voltage or the ON-voltage applied to the second output transistor;

the third control transistor becomes ON when the data signal inputted from the subsequent-stage shift register is the second-level voltage and applies the ON-voltage to the second output transistor, whereas the second control transistor becomes OFF when the data signal inputted from the subsequent-stage shift register is the first-level voltage and maintains the OFF-voltage or the ON-voltage applied to the second output transistor; and the second output transistor becomes ON when the ON-voltage is applied and applies the first-level voltage to an output terminal of the first output transistor from which the data signal is outputted, whereas the second output transistor becomes OFF when the OFF-voltage is applied and maintains the voltage of the data signal applied to the output terminal.

6. The shift register as claimed in claim 1, wherein the OFF-voltage is applied to the first control transistor when both of the first input transistor and second input transistor become ON, and the OFF-voltage or the ON-voltage applied to the first control transistor is maintained when at least either the first or second transistor becomes OFF.

7. The shift register as claimed in claim 1, further comprising a capacitor for suppressing fluctuation of the gate voltage of the output transistor.

8. The shift register as claimed in claim 1, wherein the transistor constituting a circuit is a thin film transistor.

9. A scanning circuit using the shift register that is claimed in claim 1.

10. The scanning circuit as claimed in claim 9, wherein scanning is carried out in both directions.

11. A display device using the scanning circuit claimed in claim 9.

12. A display device using the scanning circuit claimed in claim 10.

13. The shift register as claimed in claim 1, wherein the signal inputted to the gate of the third control transistor is a clock signal.

14. The shift register as claimed in claim 1, wherein the signal inputted to the gate of the third control transistor is a data signal from the subsequent stage shift register.

* * * * *